(12) United States Patent
Hanzawa et al.

(10) Patent No.: US 7,304,910 B1
(45) Date of Patent: Dec. 4, 2007

(54) SEMICONDUCTOR MEMORY DEVICE WITH SUB-AMPLIFIERS HAVING A VARIABLE CURRENT SOURCE

(75) Inventors: Satoru Hanzawa, Hachioji (JP); Tomonori Sekiguchi, Tama (JP); Riichiro Takemura, Tokyo (JP); Satoru Akiyama, Kawasaki (JP); Kazuhiko Kajigaya, Iruma (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/467,793

(22) Filed: Aug. 28, 2006

(30) Foreign Application Priority Data

Dec. 28, 2005 (JP) .............................. 2005-378490

(51) Int. Cl.
*G11C 8/18* (2006.01)
*G11C 5/14* (2006.01)

(52) U.S. Cl. ................. 365/233; 365/230.03; 365/190; 365/208; 365/207; 365/236; 365/196; 365/227

(58) Field of Classification Search ................ 365/190, 365/205, 208, 207, 233, 236, 196, 195, 191, 365/227, 230.03

See application file for complete search history.

(56) References Cited

U.S. PATENT DOCUMENTS

| | | | | |
|---|---|---|---|---|
| 4,999,519 A | * | 3/1991 | Kitsukawa et al. ......... | 326/110 |
| 5,825,709 A | * | 10/1998 | Kobayashi ............. | 365/230.03 |
| 6,512,719 B2 | | 1/2003 | Fujisawa et al. ............ | 365/233 |
| 6,690,232 B2 | * | 2/2004 | Ueno et al. .................... | 330/85 |
| 6,909,323 B2 | * | 6/2005 | Ueno et al. .................... | 330/86 |
| 6,909,653 B2 | * | 6/2005 | Shimadu et al. ............ | 365/203 |
| 7,184,323 B2 | * | 2/2007 | Fujisawa ................ | 365/189.05 |
| 2006/0034133 A1 | | 2/2006 | Sekiguchi et al. .......... | 365/190 |
| 2007/0147160 A1 | * | 6/2007 | Hanzawa et al. ....... | 365/230.03 |

FOREIGN PATENT DOCUMENTS

JP 2002-25265 1/2002
JP WO2004/042821 5/2004

* cited by examiner

*Primary Examiner*—Andrew Q. Tran
(74) *Attorney, Agent, or Firm*—Miles & Stockbridge P.C.

(57) ABSTRACT

A column circuit that amplifies signals read from a sense amplifier array SAA to local input/output lines LIO in sub-amplifiers SAMP to transfer the amplified signals to main input/output lines MIO is provided. A current control circuit IC that can set one of two kinds of currents according to read enable signals RD1, RD2 is provided in each sub-amplifier SAMP. The read enable signals RD1, RD2 are generated at timings corresponding to the number of cycles in burst read operation under control of the timing controller. Current in the current control circuit IC is set to be large by the RD1 in burst read operation cycle just after activation of a memory bank, while current in the current control circuit IC is set to be small by the RD2 in the next and subsequent burst read cycles. Accordingly, expansion of an operation margin or reduction of power consumption can be realized in a semiconductor device including a semiconductor memory such as a DRAM.

11 Claims, 33 Drawing Sheets

SEMICONDUCTOR MEMORY DEVICE WITH SUB-AMPLIFIERS HAVING A VARIABLE CURRENT SOURCE

CROSS-REFERENCE TO RELATED APPLICATION

The present application claims priority from Japanese Patent Application No. JP 2005-378490 filed on Dec. 28, 2005, the content of which is hereby incorporated by reference into this application.

TECHNICAL FIELD OF THE INVENTION

The present invention relates to a semiconductor device, and particularly to a technique effectively applied to a semiconductor device having a semiconductor memory with a large storage capacity, and required for high-speed read operation.

BACKGROUND OF THE INVENTION

According to speed-up of a CPU, a demand for improvement of an operation frequency of a semiconductor memory is increasing year after year. In a conventional synchronous dynamic random access memory (SDRAM), speed-up has been achieved by raising an integration degree based upon miniaturization. In a double data rate synchronous dynamic random access memory (DDR SDRAM) which is currently mainstream, a data transfer rate has been improved by utilizing a prefetch operation which previously reads a plurality of bits stored in a memory array and an interface system that outputs the plurality of data in a time-series manner in synchronism with both edges of a clock.

An amount of data read from a memory array at one time according to the prefetch operation of the DDR SDRAM relates to the data transfer rate, and it varies according to generation. For example, in a first generation (hereinafter, called "DDR") of the DDR SDRAM, a data transfer rate of 200 megabits to 400 megabits per second has been realized according to a two-bit prefetch operation reading stored data of two bits at one time. In a second generation (hereinafter, called "DDR-II"), realization of a data transfer rate of 400 megabits to 800 megabits per second is intended according to a four-bit prefetch operation reading stored data of four bits at one time. In a third generation (hereinafter, called "DDR-III"), the data transfer rate may reach 800 megabits to 1600 megabits per second according to an eight-bit prefetch operation reading stored data of eight bits at one time. From such differences in prefetch number among generations, the prefetch system in the DDR SDRAM is specifically called "2N bit prefetch system (N is an integer)".

When a DDR SDRAM with storage capacity of Gigabit class is realized according to advance of miniaturization in the future, since there is a possibility that a chip area exceeds 100 square millimeters and so, it becomes difficult to maintain operation rates of a memory array and an input/output bus (inside a chip) constant, which may result in increase in access time. For example, since device characteristic fluctuation of a MOS transistor constituting a memory cell transistor or a sense amplifier increases according to voltage lowering or miniaturization, an operation margin of a memory array may degrade. Since a memory array configuration using a multi-divided bit line and a multi-divided word line effective for expansion of an operation margin according to increase of a read signal amount directly provokes increase in the number of peripheral circuits such as a sense amplifier or a word driver. Therefore, since the number of divisions is limited, it is difficult to obtain a dramatic effect. In a path for transferring data read from the memory array to an output buffer, a wiring length of the path increases, which may result in lowering in internal operation rate of a chip due to increase of RC delay.

As to an operation rate of an input/output bus, an approach for reducing a time period required to transfer data read from the memory array to an input/output circuit is disclosed in Japanese Patent Laid-Open No. JP 2002-25265, for example. Specifically, focusing attention on a line from a main amplifier to an output buffer contained on the path, data to be first outputted from data of 2N bits prefetched is read using a high-speed main amplifier and a global input/output line (GIO) with low impedance. Subsequent data is read using an ordinary main amplifier. According to such a constitution and an operation, an access time is reduced while power consumption is being suppressed.

SUMMARY OF THE INVENTION

The inventors of the present invention examined an operation rate of a DDR SDRAM of a Gigabit class prior to filing the present application. Specifically, the inventors of the present invention have found the following two problems as a result of examination of an operation time inside a chip.

The first problem lies in that it is predicted that time required for reading stored data increases due to an RC delay (here, R represents wiring resistance and C represents load capacitance). FIG. 2 shows a diagram showing an example of an operation timing diagram in a read operation of a DDR SDRAM. Here, breakdown of an operation time inside a chip targeted in a case that a waiting time tRCD (active to read/write delay) from active command ACTV input to read RD or write command input is 8 cycles and a time CL (/CAS latency) required from a read command RD inputted to data output is 7 cycles is shown. In an operation of a row circuit, an example where a row select operation is completed within 7 cycles to enable a word line (WL) and stored data is read with a sense amplifier within 12 cycles is shown. In an operation of a column circuit, an example where a column select operation is performed according to a read command RD input in advance, stored data is transferred to a data pin (DQ) by enabling a column select signal (YS) just after completion of read operation with a sense amplifier, and stored data is read in synchronism with edges of clocks CLK and CLKB at the sixteenth cycle is shown. A YS enable timing margin shown in FIG. 2 is provided for avoiding error read.

However, in consideration of the RC delay according to chip area of a DDR SDRAM of Gigabit class, since a row select operation time increases as shown in FIG. 3, a word line enable timing may delay by a time TRD0. Regarding a read time from a memory cell to a sense amplifier, the number of divisions of a bit line is limited in view of chip area suppression, which may result in increase in RC product of the bit line. When stored data in memory cells is read to the bit line, a signal voltage of several hundreds mV must be generated in the bit line such that the sense amplifier operates correctly. However, considering characteristic fluctuation (for example, fluctuation of a threshold value) of a cell select transistor, the read time may further increase. Therefore, when the operation margin should be expanded, it is predicted that a read operation with the sense amplifier delays by TRD1 so that a row circuit operation time exceeds a target value.

These events also influence a column circuit operation. That is, since the YS enable timing delays by TD0(=TRD0+TRD1), a CAS latency CL does not satisfy targeted 7 cycles, and it may require 8 cycles, for example. Since the RC delay also increases in a path (so-called data path) from the memory array to the data pin due to increase of the chip area, the CAS latency CL may further exceed the target cycles. Therefore, it is desired to avoid degradation of chip performance by speedup of each circuit block. However, since the operation rate of the row circuit is regulated according to the number of logic stages for performing decoding of an address signal and displacement of a fail bit, a drive time of a memory array, and a read time of stored data based upon charge sharing, it is difficult to achieve speedup. Accordingly, it is desired to allow delay due to the row circuit operation and reduce the operation time in the column circuit.

The second problem lies in that, when the number of prefetch times increases in response to improvement in data transfer rate, power consumption in the column circuit operation increases. Since the current increase causes increase of burst read operating current IDD4R established in Standard Specification for DRAM, it is desired to suppress power consumption in the data path.

In view of these circumstances, therefore, an object of the present invention is to realize expansion of an operation margin, reduction of power consumption or the like in a semiconductor device. The above and other objects and novel characteristics of the present invention will be apparent from the description of this specification and the accompanying drawings.

The typical ones of the inventions disclosed in this application will be briefly described as follows.

A semiconductor device according to the present invention comprises a memory cell array represented by DRAM array, input/output lines having a hierarchical structure, a sub-amplifier, a main amplifier, and a timing controller. The sub-amplifier amplifies faint signals read to lower input/output lines via the sense amplifier in the memory array. The sub-amplifier comprises, for example, a plurality of current sources having different conductance to each other and the current sources are activated independently by a plurality of read enable signals. The main amplifier amplifies faint voltage signal read to the upper input/output line via the sub-amplifier. The timing controller detects the number of cycles of burst read operation and generates a column select signal and a plurality of read enable signals with a timing according to the number of cycles. In a cycle of burst read operation just after bank activation, the timing controller activates a column signal and a first read enable signal with a timing later than that of subsequent cycles. With the first read enable signal, a current source having large conductance is activated and driving ability of the sub-amplifier is set to be high, thereby shortening data transfer time of the input/output lines (high speed mode). Therefore, in the memory array, it is possible to expand a read operation margin to realize read operation with high speed and high reliability. Furthermore, in subsequent cycles, the timing controller activates a second read enable signal to activates a current source having small conductance and suppresses driving ability of the sub-amplifier, thereby making it possible to suppress current consumption in data transfer of the input/output lines. Therefore, low power read operation can be realized (low power mode).

Also, the semiconductor device according to the present invention comprises a main amplifier. The main amplifier, furthermore, comprises a first amplifier and a preamplifier. The timing controller, furthermore, detects the number of cycles of burst read operation and generates a preamplifier enable signal with a timing according to the number of cycles. In a cycle of read operation just after bank activation, the timing controller activates a preamplifier enable signal. By the preamplifier increasing a signal voltage to be inputted to the first amplifier, amplifying time of whole of the amplifier, i.e. data transfer time of the input/output lines can be shortened (high speed mode). Therefore, in the memory array, it is possible to further expand read operation margin. In the subsequent cycles, the timing controller deactivates the preamplifier enable signal and amplification is performed only by the first amplifier. Therefore, current consumed by preamplifier can be decreased (low power mode).

Still further, the semiconductor device according to the present invention generates read enable signals and preamplifier enable signals to each of the input/output lines selectively. Here, the timing controller receives multiple burst operation control signals and generates a plurality of read enable signals and preamplifier enable signals. In a cycle of burst read operation just after bank activation, in input/output lines which transfer a part of a plurality of burst read bits (for example, 4 bits of the first half in a 8-bit prefetch type), said plurality of the first read enable signals and preamplifier enable signals are activated and a data path is set to a circuit setting of high speed mode. On the other hand, in input/output lines which transfer the rest of the above-said plurality of bits (for example, 4 bits of the second half), said plurality of preamplifier enable signals are held to be deactivated state and said plurality of second read enable signals activate the data path to set it to a circuit setting of low power mode. Therefore, in the memory array, it is possible to expand a read operation margin and also realize high speed and high reliability read operation suppressing current consumption in data transfer of input/output lines.

According to advantages obtained by the representative ones of the inventions disclosed in the present application, it is made possible to realize expansion of an operation margin or reduction of power consumption in a semiconductor memory.

BRIEF DESCRIPTIONS OF THE DRAWINGS

DESCRIPTIONS OF THE PREFERRED EMBODIMENTS

Figure 1:
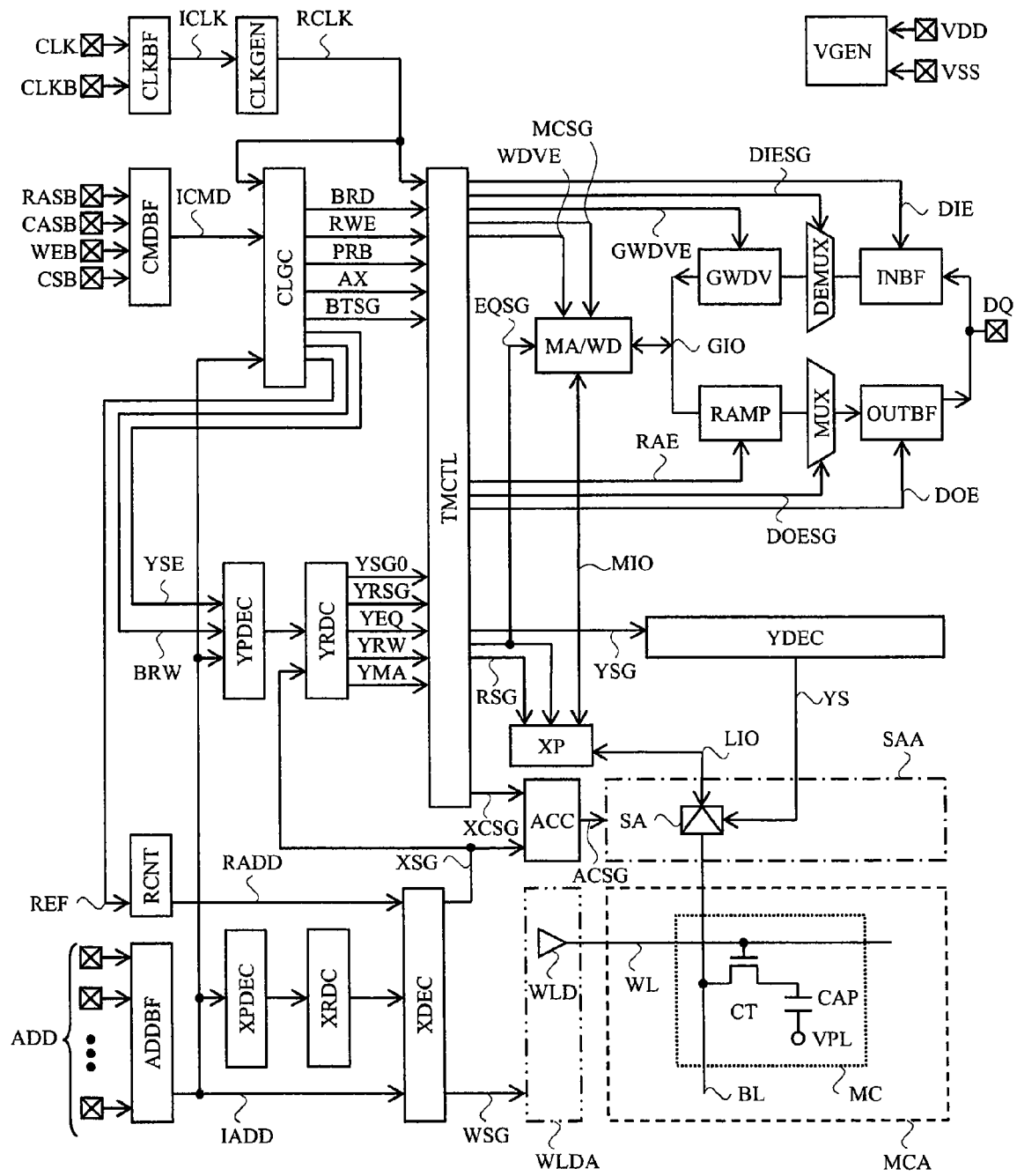
FIG. 1 is a circuit block diagram showing a main section configuration example of a DDR SDRAM in a semiconductor device of a first embodiment according to the present invention.
Figure 2:
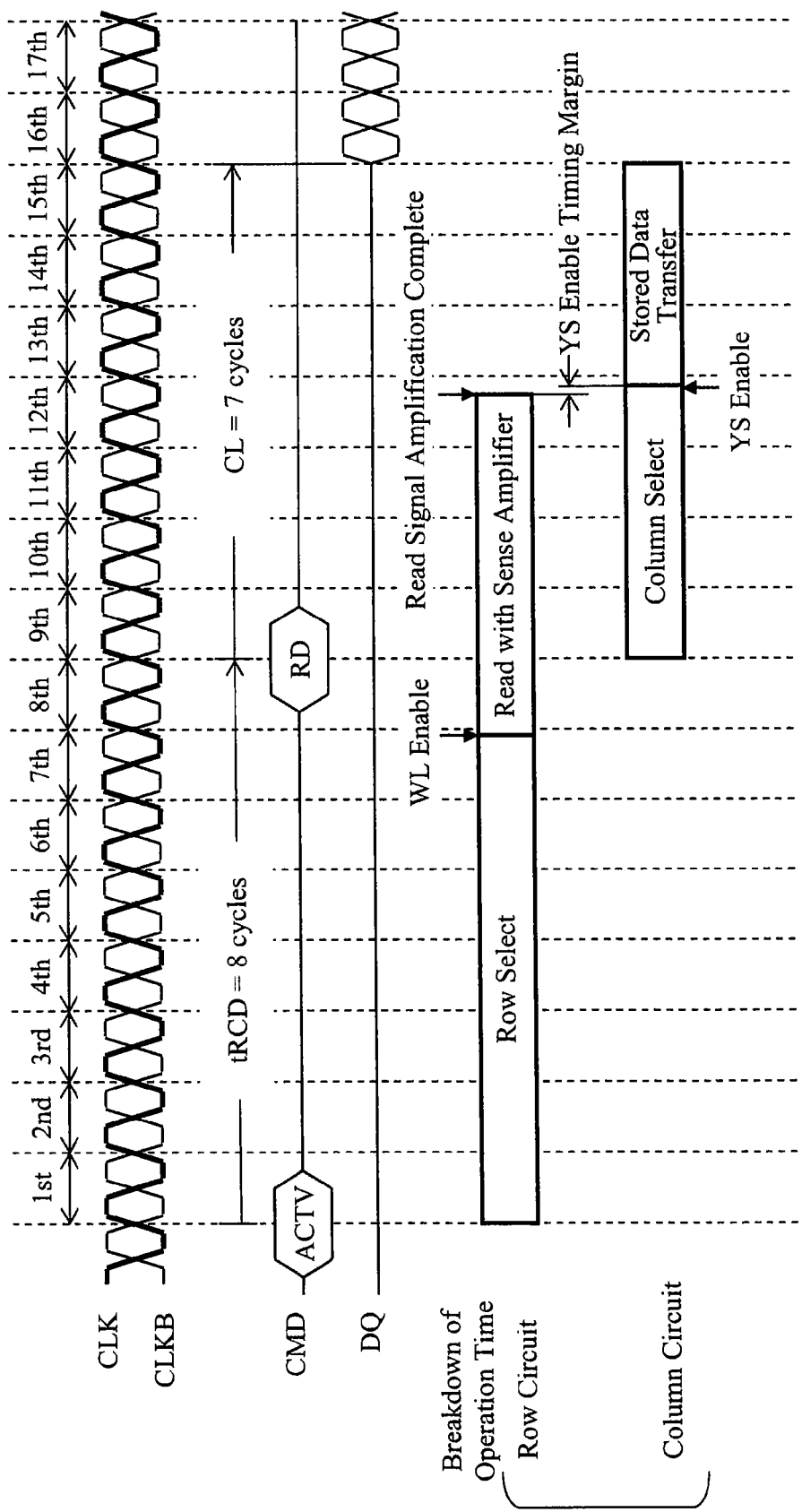
FIG. 2 is a diagram showing an example of a timing diagram in a read operation of an ideal DDR SDRAM.

Hereinafter, embodiments of the present invention will be described in detail with reference to the accompanying drawings. Note that components having the same function are denoted by the same reference symbols throughout the drawings for describing the embodiments, and the repetitive description thereof will be omitted. A circuit element constituting each functional block in embodiments is not limited to a specific one, and it is formed on a semiconductor substrate such as single crystal silicon according to integrated circuit technology such as known CMOS (complementary MOS transistor).

Note that, in the embodiments, MOS (metal oxide semiconductor) transistor is used as one example of MISFET (metal insulator semiconductor field effect transistor). In the drawings, a P-channel type MOS transistor (PMOS transistor) is distinguished from an N-channel type MOS transistor (NMOS transistor) by attaching an arrow symbol on a gate of the former. Though connection of a substrate potential of a MOS transistor is not specified in the drawings, a connecting method is not limited as long as the MOS transistor is normally operable.

First Embodiment

Figure 3:
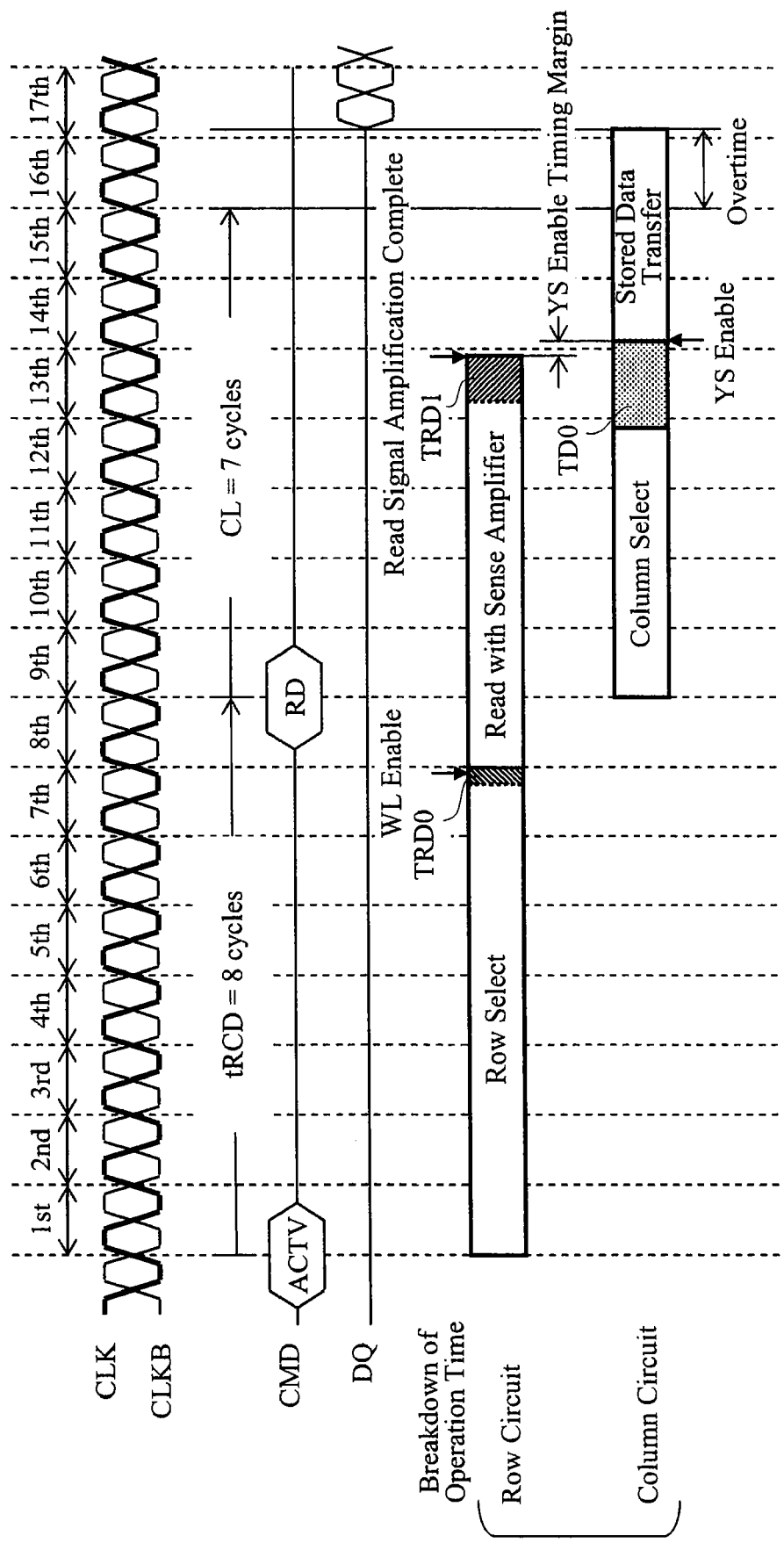
FIG. 3 is a diagram showing an example of a read operation timing diagram in a DDR SDRAM examined prior to the present invention.
Figure 4:
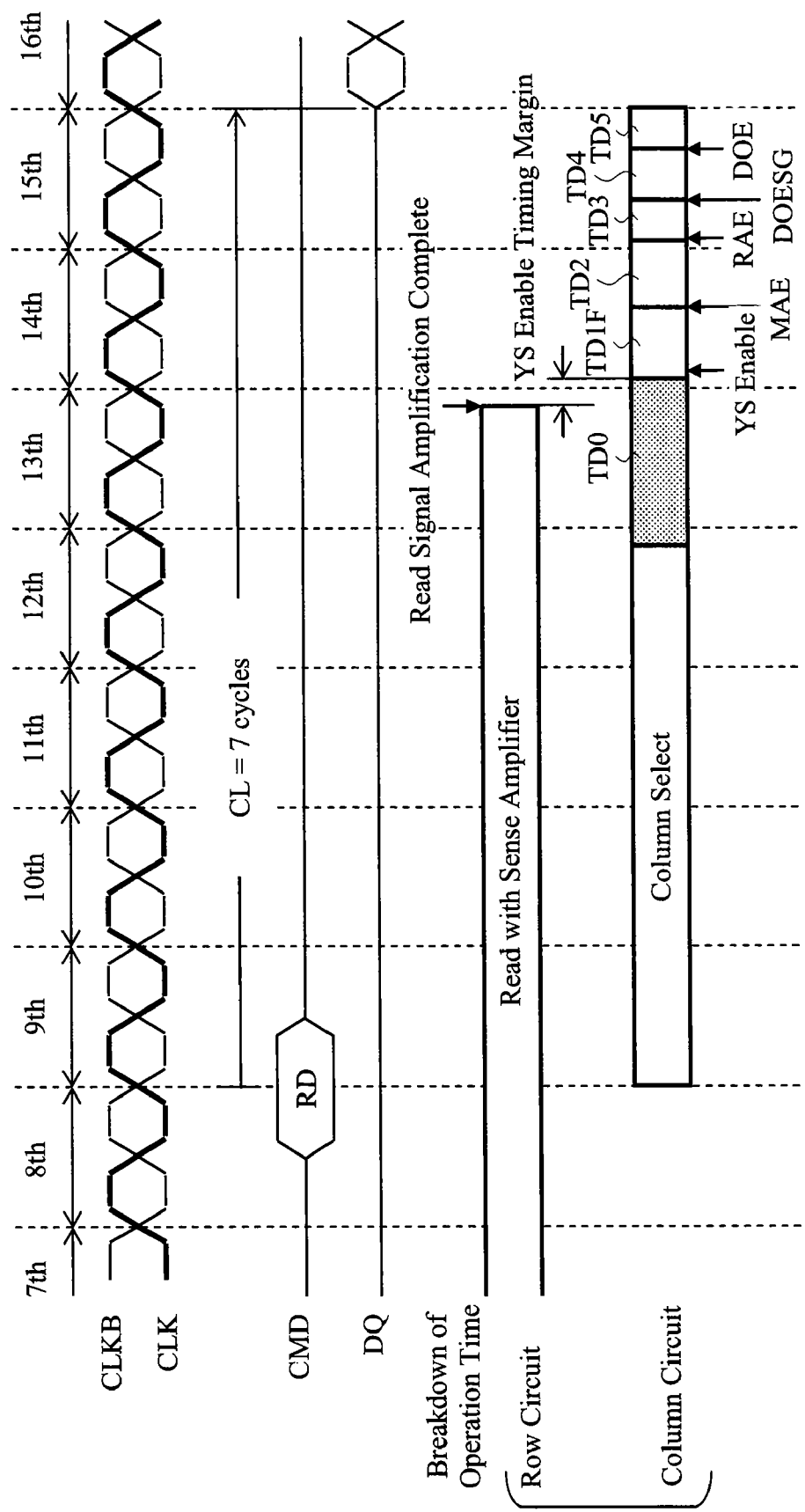
FIG. 4 is a diagram showing an example of detailed breakdown of an optimal read operation time at a page open time of a column circuit examined based upon FIG. 3.
Figure 5:
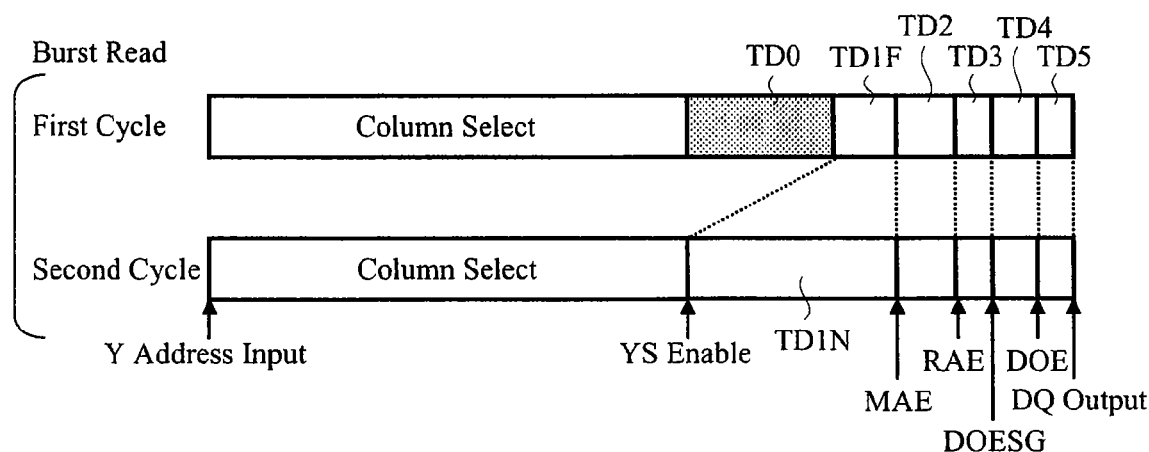
FIG. 5 is a diagram showing an example of detailed breakdown of an operation time of an optimal burst read for the column circuit in the DDR SDRAM shown in FIG. 1.

Features of the embodiment obtained from operation timing diagrams will be first described with reference to FIGS. 4 and 5. This embodiment has two major features. The first feature lies in that read circuit operation from a memory array to a main amplifier in a column circuit is speeded up. That is, circuit operation in the portion is shortened by overtime TD0 in a row circuit operation. FIG. 4 shows detailed breakdown of an optimal read operation time in the column circuit operation just after row circuit operation (so-called "page open"), in comparison with FIG. 3. TD1F represents a time required from enabling of a column select signal YS to activation of a main amplifier enable signal MAE, and the overtime TD0 is absorbed by shortening the time especially.

TD2 represents a time required from the activation of the main amplifier enable signal MAE to activation of a receiver amplifier enable signal RAE, TD3 represents a time required from the activation of a receiver amplifier enable signal RAE to input of read data into a multiplexer MUX, TD4 represents a time required from activation of data output enable signals DOESG to activation of a data output enable signal DOE, and TD5 represents a time required from activating the data output enable signal DOE to output of data to a data pin DQ. Meanings of these signals will be described together with description about an entire configuration of a DDR SDRAM described later.

The second feature lies in that switching of control and an operation time of said read operation from the memory array to the main amplifier in accordance with cycles of burst read is performed. FIG. 5 shows detailed breakdown of read operation time in the column circuit operation, in comparison with FIG. 4. Here, the first cycle of burst read operation represents burst read just after page open. Therefore, in order to waiting for completion of the row circuit operation, activation of a column select signal YS is delayed from completion of a column select operation by the delay time TD0 of the row circuit operation. On the other hand, the second cycle (and cycles subsequent thereto) of the burst read operation represents read from a state that stored data has been already read with the sense amplifier which does not involve a row circuit operation. Accordingly, the second cycle and the cycles subsequent thereto of the burst read operation are not influenced by the delay TD0 in the row circuit operation. Here, a circuit operation where an enable timing of the column select signal YS is hastened so that read operation time TD1N from the main array to the main amplifier is expanded is performed. A circuit configuration for realizing these features will be described below in detail.

"Whole configuration of DDR SDRAM"

FIG. 1 is a circuit block diagram showing a main section configuration example of a DDR SDRAM in a semiconductor device of the first embodiment according to the present invention. In FIG. 1, main section circuit block regarding read operation and write operation is shown focusing on a memory cell MC of one bit to be selected for simplification. A memory cell array MCA has a structure where known memory cells including a cell select transistor CT and a capacitor CAP are arranged in matrix configuration. The DDR SDRAM shown in FIG. 1 has the following two features. The first feature lies in that an input/output line through which stored data is transferred between a memory array and an input/output circuit has a so-called hierarchical structure. In FIG. 1, a structure including three hierarchies of a local input/output line LIO, a main input/output line MIO, and a global input/output line GIO is shown as one example. The second feature lies in that an activation timing of a command signal (read enable signals RSG or equalize enable signals EQSG in FIG. 1) of a sub-amplifier arranged at a so-called cross-point area circuit XP between the local input/output line LIO and the main input/output line MIO or a column select signal YS for controlling connection between the sense amplifier and the local input/output line designated by a column address varies according to a burst read cycle.

An internal voltage generator VGEN generates various internal voltages such as a plate electrode voltage VPL applied to a capacitor CAP inside a memory cell, a precharge voltage VDL/2(=VDLR, reference voltage), an internal boosted voltage VPP, a peripheral circuit voltage VCL, an internal step-down voltage VDL, and back-bias voltage VBB. Complement clocks CLK, CLKB are inputted via a clock buffer CLKBF so that an internal clock ICLK is supplied to a chip. The internal clock ICLK is further inputted into a clock generator CLKGEN so that a clock with any pulse width and timing is supplied to each circuit block. In FIG. 1, an example where a reference clock RCLK is inputted into a control logic circuit CLGC and a timing controller TMCTL is shown. The pulse width or the timing of the internal clock can be adjusted appropriately in each circuit block.

A row address strobe signal RASB, a column address strobe signal CASB, a write enable signal WEB, and a chip select signal CSB are command signals, respectively. The above-described command signals are inputted in synchronism with the complement clocks CLK, CLKB. Multiple internal command signals ICMD inputted via the command buffer CMDBF are inputted into a control logic circuit CLGC together with the reference clock RCLK and a row address signal or a column address signal, so that a plurality of command signals are produced. An example of signals regarding a read operation to a memory array inside any memory bank in a DDR SDRAM configured of a plurality of memory banks is shown in FIG. 1 for simplification.

A read signal BRD is a signal put in an activated state during reading of stored data from one of a plurality of memory banks obtained by dividing a memory array. A read and write enable signal RWE is a signal produced upon reception of input of a read command or a write command. A precharge enable signal PRB is a signal for precharging a bit line inside a memory array at a standby time to VDL/2. An array activate signal AX is a signal for generating array command signals ACSG described later upon reception of input of an active command. A burst operation command signals BTSG are a plurality of command signals corresponding to a value of burst sequence initialized at a chip enabling time. In the timing controller TMCTL, for example, the command signals are used for generating multiple signals DOESG (multiple data output enabling signals) for controlling the order of stored data when the stored data read by a multiplexer MUX described later are outputted in a time-series manner.

A refresh signal REF is a command signal generated upon receipt of input of a refresh command. The refresh signal REF is inputted into a refresh counter RCNT so that a refresh address RADD is produced to be inputted into a row decoder XDEC described later. A read and write signal BRW is a signal put in an activated state while stored data is read from or write in one of a plurality of banks obtained by dividing a memory array. A column select enable signal YSE is a signal for determining a timing for performing transmission/reception of data between a sense amplifier designated by a column address and a local input/output line LIO on receipt of input of a read command and a write command.

A row address signal and a column address signal are inputted from a common address pin ADD in a time-series manner in synchronism with complement clocks CLK, CLKB. Some of row address signals of internal address signals IADD inputted via an address buffer ADDBF is supplied to a row decoder XDEC via a row predecoder XPDEC and a row repair circuit XRDC, while the remaining row address signals are directly supplied to the row decoder XDEC. The row decoder XDEC activates one of the multiple word signals WSG that corresponds to the row address signal to select a plurality of word drivers WLD inside a word driver array WLDA. As a result, a desired word line WL is activated so that a faint read signal is generated on a bit line BL in the memory array and it is amplified by the sense amplifier SA. In refresh operation, the row decoder XDEC receives refresh addresses RADD to sequentially activate the multiple word signals WSG one by one. The row decoder XDEC outputs not only the multiple word signals WSG but also multiple row signals XSG to a column repair circuit YRDC and an array controller ACC to activate only a column decoder YDEC described later or a circuit block belonging to a desired sub-array of a local input/output line LIO.

Some of the column address signals are supplied to a column decoder YDEC via a column predecoder YPDEC and a column repair circuit YRDC. Multiple column signals YSG0, a column read enable signal YRSG regarding a read operation, a column equalize enable signal YEQ, a column read and write enable signal YRW, and a column main amplifier enable signal YMA are shown as examples of output signals of the column repair circuit YRDC for simplification in FIG. 1. The multiple column repair circuit output signals together with the above-described multiple output signals from the control logic circuit CLGC are inputted into the timing controller TMCTL to be subjected to logic operation and they are further subjected to adjustment of pulse width and output timing, so that they are used for driving the column circuit for transmitting stored data read with the sense amplifier as described above to the output circuit at an appropriate timing.

The faint read signal generated on the bit line BL in the memory array is amplified by the sense amplifier SA according to activation of multiple array command signals ACSG obtained from the row circuit command signals XCSG via the array controller ACC. Thereafter, a column select signal YS is activated in a timing controller TMCTL described later according to decoding of the multiple column signals YSG generated from the multiple column signals YSG0 in the column decoder YDEC. As a result, stored data is outputted from the sense amplifier SA to the local input/output line LIO, and it is further transferred to a main amplifier/write driver MA/WD via the cross-point area circuit XP and the main input/output line MIO.

In the read operation, the main amplifier MA is activated by multiple main amplifier command signals MCSG to amplify a faint signal generated on the main input/output line MIO and output read stored data to the global input/output line GIO. The read signal is further transferred to the data pin DQ via a receiver amplifier RAMP, a multiplexer MUX, and an output buffer OUTBF. The receiver amplifier RAMP is actuated by the receiver amplifier enable signal RAE to amplify a faint signal generated in the global input/output line GIO and output the same to the multiplexer MUX. The multiplexer MUX is a so-called parallel-serial converting circuit that transfers a plurality of stored data items simultaneously read from the memory array to the output buffer OUTBF in the order of time-series. The order of the output is controlled by the above-described multiple data input/output enable signals DOESG. In FIG. 1, only a column circuit block and an input/output line corresponding to one bit are shown for simplification. However, actual input/output line, amplifier and driver each constitute a bus structure in order to realize 2N prefetch operation.

The output buffer OUTBF outputs the stored data read in synchronism with the data output enable signal DOE to the data pin DQ. Circuits for controlling connection between the local input/output line LIO and the main input/output line MIO or precharging are provided on the cross-point area circuit XP and the main amplifier MA, and they are controlled according to multiple read enable signals RSG and multiple equalize enable signals EQSG, detailed configurations and operations thereof being described later.

In write operation, stored data inputted from the data pin DQ is fetched into an input buffer INBF in synchronism with a data input enable signal DIE to be transmitted to a write driver WD via a demultiplexer DEMUX, a global write driver GWDV, and the global input/output line GIO. The demultiplexer DEMUX is a circuit for performing serial-parallel conversion of stored data items continuously inputted in a time-series manner. Correspondence between inputted stored data items and input/output lines is controlled by multiple data input enable signals DIESG so as to coincide with the order of outputs in the above-described read operation. The global write driver GWDV transmits inputted stored data from the global input/output line GIO to the write driver WD in synchronism with a global write driver enable signal GWDVE. The stored data is further outputted to the main input/output line MIO in synchronism with a write driver enable signal WDVE to be transferred to the memory array.

Figure 6:
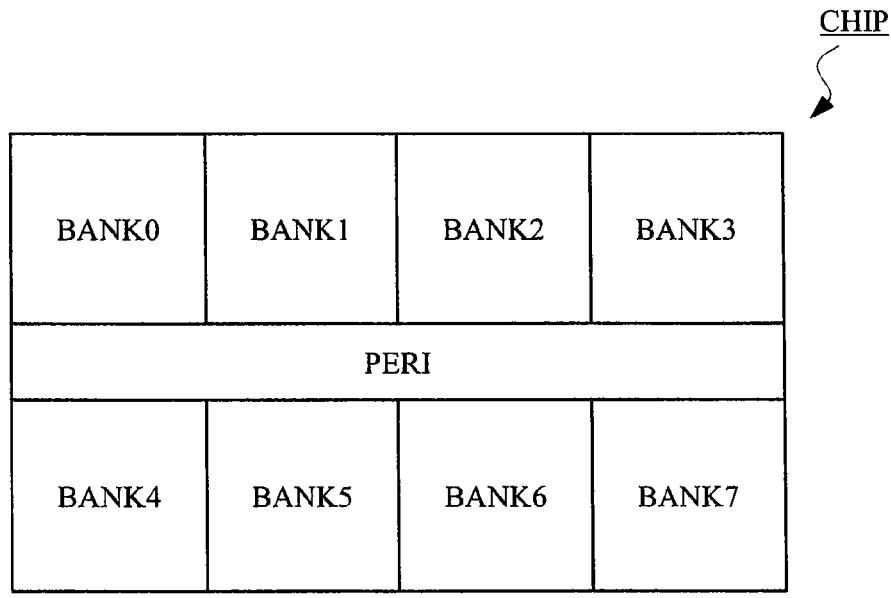
FIG. 6 is a plan view showing a layout configuration example of a whole chip in the DDR SDRAM shown in FIG. 1.

FIG. 6 is a plan view showing a layout configuration example of a whole chip in the DDR SDRAM shown in FIG. 1. In the DDR SDRAM chip CHIP shown in FIG. 6, for example, a memory cell array is divided into 8 memory banks BANK0 to BANK7. Each of the memory banks includes the row decoder XDEC, the column decoder YDEC, the main amplifier/write driver MA/WD, the memory cell array MCA, the word driver array WLDA, the sense amplifier array SAA, the array controller ACC, the cross-point area circuit XP which are shown in FIG. 1. The other circuits shown in FIG. 1 such as the address buffer ADDBF, the internal voltage generator VGEN, and the various pins are appropriately arranged on a peripheral circuit area PERI shown in FIG. 6.

"Configuration of memory bank"

Figure 7:
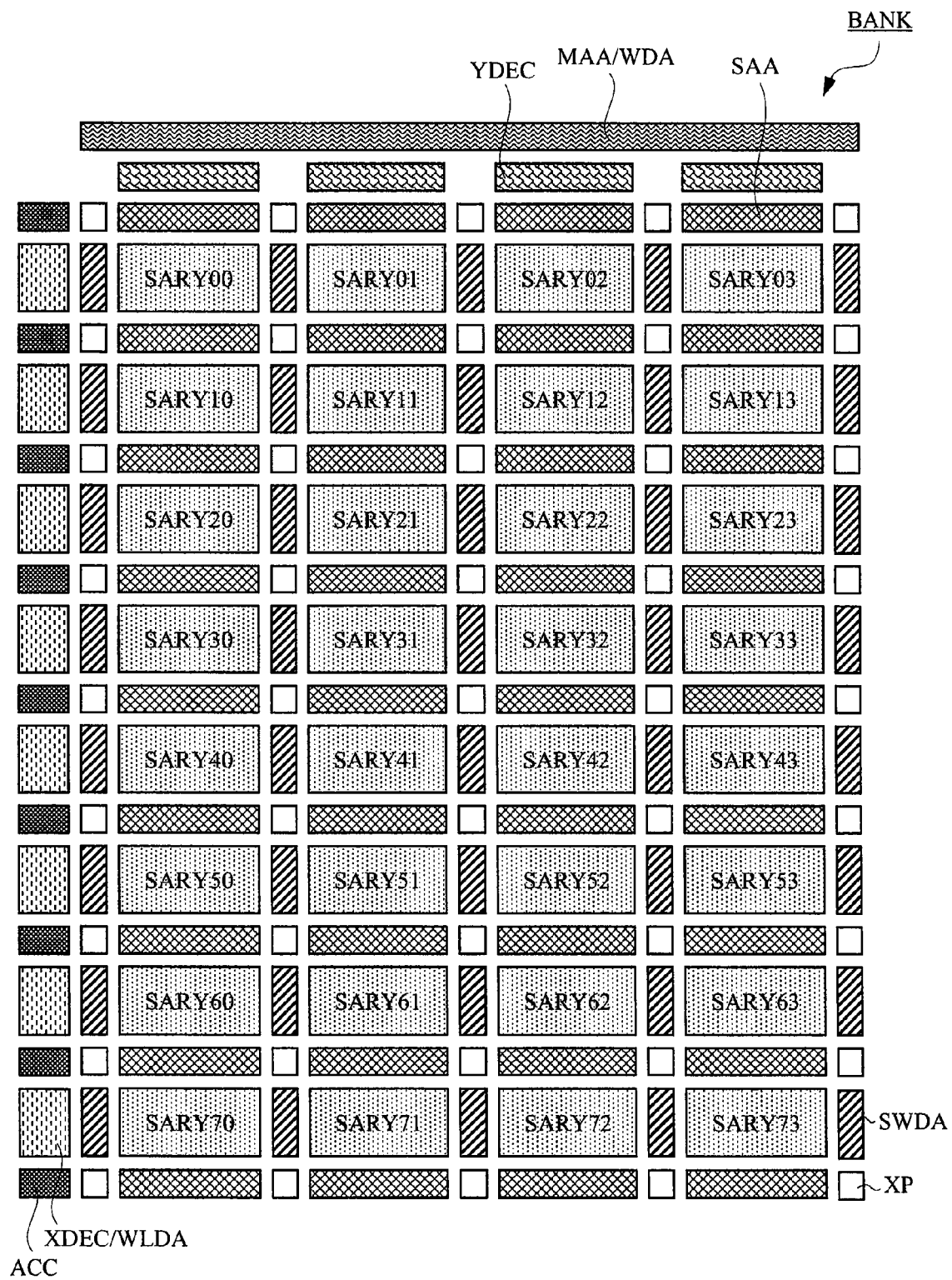
FIG. 7 is a plan view showing a layout configuration example of a main section in a memory bank shown in FIG. 6.

FIG. 7 is a plan view showing a layout configuration example of the memory bank shown in FIG. 6. The memory cell array MCA shown in FIG. 1 is further divided into smaller-sized sub-arrays SARY00 to SARY73. A sense amplifier array SAA, a sub-word driver array SWDA, and a cross-point area circuit XP are arranged around each sub-array. Column decoders YDEC and the main amplifier/write driver array MAA/WDA are arranged in parallel with the sense amplifier array SAA, and the row decoders XDEC, the word driver array WLDA, and the array controller ACC are arranged in parallel with the sub-word driver array SWDA arranged on an outer periphery of the memory bank BANK. Thus, such a hierarchical structure is well known as to divide a word line into multiple lines to arrange sub-word drivers to respective multi-divided lines and to drive an upper word line common to multi-divided sub-word lines using a word driver according to the configuration of the memory array.

Figure 8:
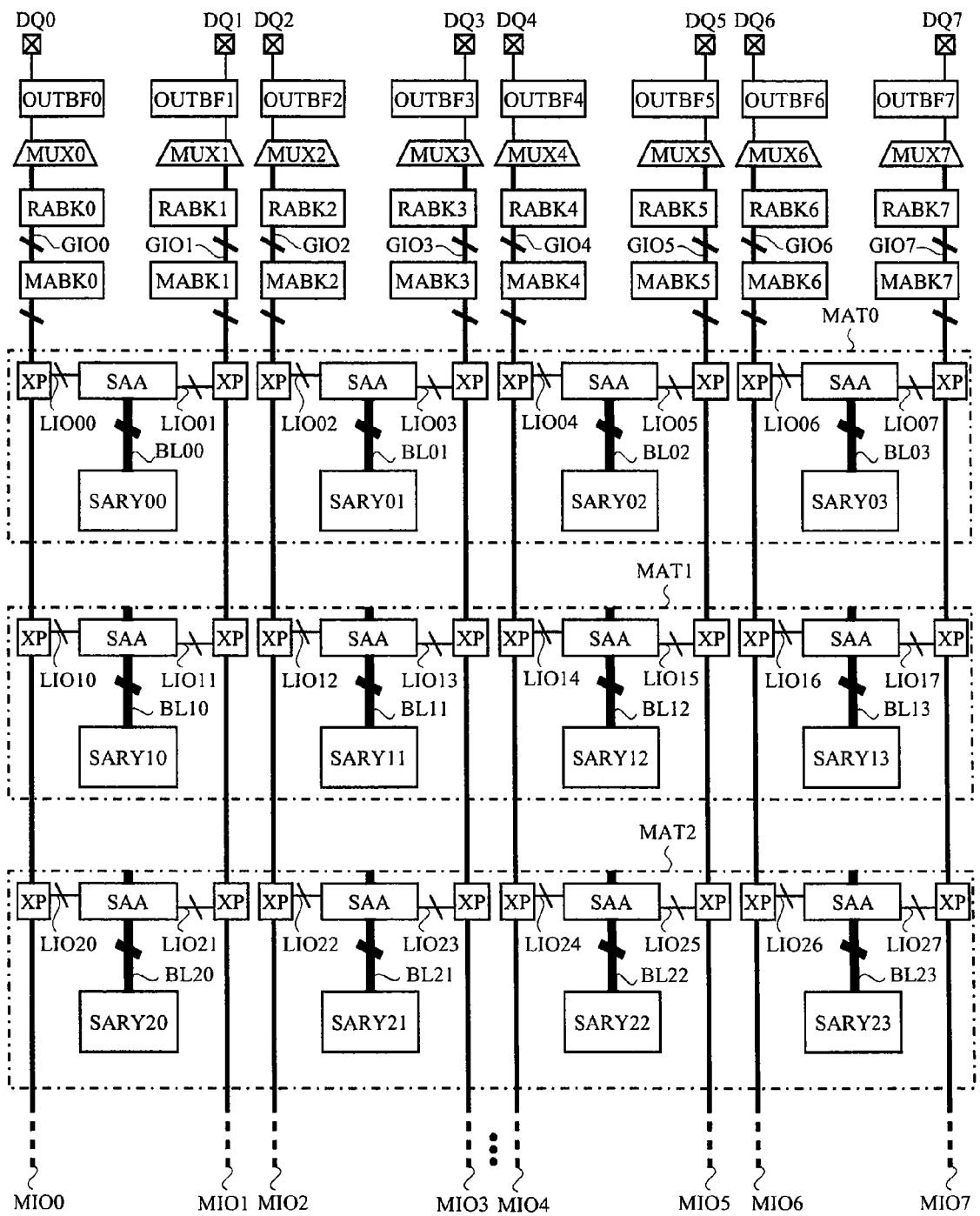
FIG. 8 is a main section block diagram showing a circuit configuration example of the memory bank shown in FIG. 7.

FIG. 8 is a main section block diagram showing a circuit configuration example of the memory bank shown in FIG. 7. Several tens of (eight in FIG. 7) memory mats are generally included in a memory bank, but three memory mats MAT0 to MAT2 are shown in FIG. 8 for simplification. A configuration where sense amplifier arrays are not alternately arranged to memory cell arrays is shown. The sub-arrays SARY00 to SARY03 belong to the memory mat MAT0, the sub-arrays SARY10 to SARY13 belong to the memory mat MAT1, and the sub-arrays SARY20 to SARY23 belong to the memory mat MAT2. As one example, in burst read operation, the memory bank has a configuration obtained by assuming DDR SDRAM of an eight-bit prefetch system which can continuously output stored data items of 8 bits from respective eight data pins DQ0 to DQ7.

For example, focusing on the memory mat MAT0, local input/output lines LIO00 and LIO01 are disposed from the sense amplifier array SAA toward left and right cross-point area circuits XP. The multiple local input/output lines LIO00 and LIO01 each have 8 pairs of complement local input/output lines, as described later. Multiple main amplifiers MABK0 to MABK7 are respectively connected to a plurality of cross-point area circuits XP arranged on the same row among different mats via multiple main input/output lines MIO0 to MIO7. Here, the multiple main input/output lines MIO0 to MIO7 each have 8 pairs of complement main input/output lines corresponding to the multiple local input/output lines. The multiple main amplifiers MABK0 to MABK7 are connected to multiple receiver amplifiers RABK0 to RABK7 via multiple global input/output lines GIO0 to GIO7, respectively. Multiplexers MUX0 to MUX7 and output buffers OUTBF0 to OUTBF7 are respectively disposed between the multiple receiver amplifiers RABK0 to RABK7 and the data pins DQ0 to DQ7.

"Configuration of data path"

Figure 9:
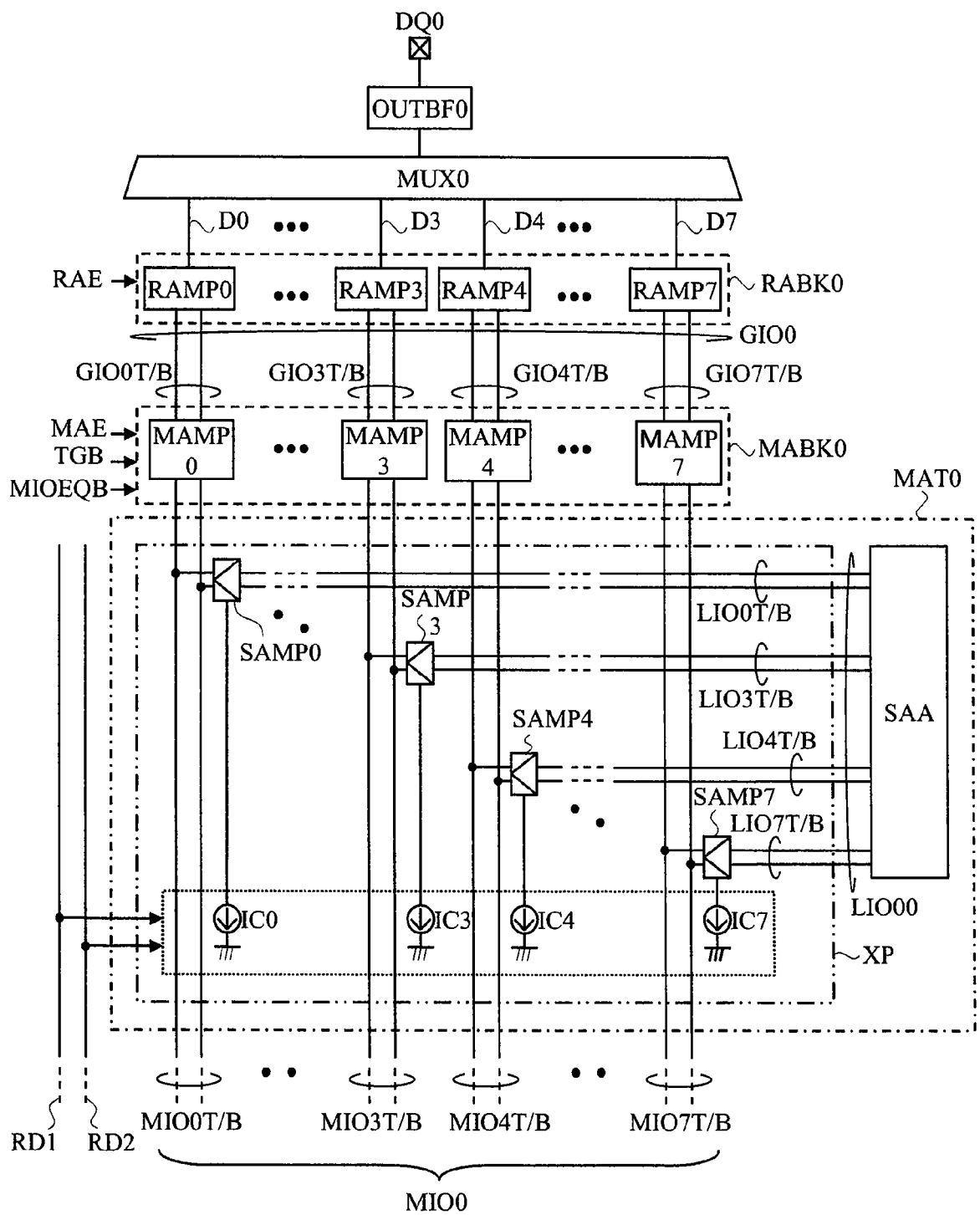
FIG. 9 is a main section block diagram showing a configuration example of a column circuit in the memory bank configuration shown in FIG. 8.

FIG. 9 is a main section block diagram showing a configuration example of a column circuit regarding the data pin DQ0, namely, a data path, in the memory bank configuration shown in FIG. 8. In FIG. 9, only memory mat MAT0 is shown for simplification. As described above, the multiple local input/output lines LIO00 are composed of 8 pairs of local input/output lines LIO0T/B to LIO7T/B. The multiple main input/output lines MIO0 are composed of 8 pairs of main input/output lines MIO0T/B to MIO7T/B. Further, the multiple global input/output lines GIO0 are composed of 8 pairs of global input/output lines GIO0T/B to GIO7T/B. Eight sub-amplifiers SAMP0 to SAMP7 used for read operation are arranged in the cross-point area circuit XP.

Further, current control circuits (variable current sources) IC0 to IC7 are provided corresponding to the sub-amplifiers SAMP0 to SAMP7. Here, the current control circuits IC0 to IC7 are enable circuits for corresponding sub-amplifiers SAMP0 to SAMP7, and they are also circuits for adjusting driving abilities of the sub-amplifiers SAMP0 to SAMP7 using common read enable signals RD1, RD2. A write switch used for write operation is generally disposed in the cross-point area circuit XP, but it is omitted for simplification in FIG. 9. Though omitted in FIG. 9, the read enable signals RD1, RD2 are constituent elements of the multiple read enable signals RSG shown in FIG. 1, and they are shared by memory mats adjacent above and below.

The multiple main amplifiers MABK0 have 8 main amplifiers MAMP0 to MAMP7 corresponding to the number of the main input/output lines, and they are controlled by a main amplifier enable signal MAE, a transmission gate enable signal TGB, and a main input/output line equalize signal MIOEQB. Similarly, the multiple receiver amplifiers RABK0 have 8 receiver amplifiers RAMP0 to RAMP7, and they are controlled by a receiver amplifier enable signal RAE. Output pins of the receiver amplifiers RAMP0 to RAMP7 and input pins of the multiplexer MUX0 are connected by data lines D0 to D7, respectively.

Figure 10:
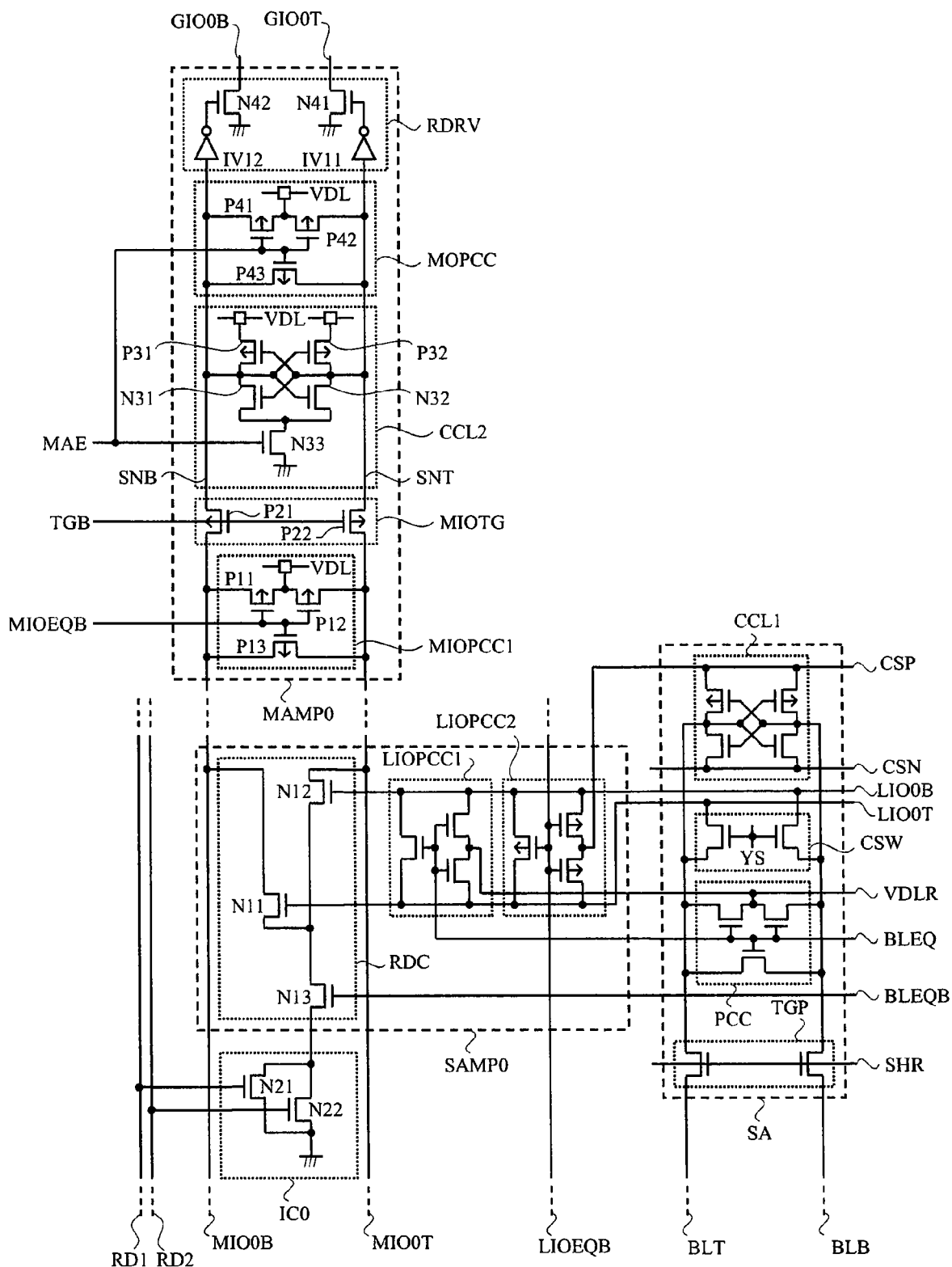
FIG. 10 is a circuit diagram showing a detailed configuration example of the column circuit shown in FIG. 9.

FIG. 10 shows a detailed circuit configuration example of a data path including the local input/output lines LIO0T, LIO0B, the main input/output lines MIO0T, MIO0B, and the global input/output lines GIO0T, GIO0B shown in FIG. 9. The sense amplifier SA which is a constituent element of the sense amplifier array SAA has a known circuit configuration composed of a precharge circuit PCC, a cross-couple-type latch amplifier CCL1, a transmission gate pair TGP, and a column switch CSW.

The precharge circuit PCC is composed of three NMOS transistors, and it is activated according to driving of the bit line equalize signal BLEQ to a boosted DC voltage VPP in a standby state to drive the bit line pair BLT, BLB to a reference voltage VDLR (here, VDL/2, for example). Here, assuming that the memory cell array has a folded bit line structure, it is defined that the select memory cell is connected to the bit line BLT.

The cross-couple-type latch amplifier CCL1 is composed of two PMOS transistors and two NMOS transistors. Common source lines CSP, CSN are driven to the same precharge voltage (here, VDL/2, for example) as that of the bit line pair BLT, BLB at a standby time. On the other hand, when a signal corresponding to data stored in a selected memory cell is generated in the bit line BLT in read operation, the cross-couple-type latch amplifier CCL1 is activated according to driving of the common source line CSP to the internal step-down voltage VDL and driving of the common source line CSN to the ground potential VSS to amplify a faint signal generated in the bit line pair BLT, BLB.

The column switch CSW is composed of two NMOS transistors inserted between the bit line pair BLT, BLB and the local input/output lines LIO0T, LIO0B. The column select signal YS connected to the gate electrode is controlled by the column decoder. The column switch CSW is activated according to driving of the column select signal YS to the internal boosted DC voltage VPP to transfer read signal amplified by the cross-couple-type latch amplifier CCL1 to the local input/output lines LIO0T, LIO0B.

The transmission gate pair TGP is composed of two NMOS transistors inserted between the cross-couple-type sense latch and the memory cell array. In read operation, the transmission gate pair TGP is activated according to driving of the shared signal SHR to the boosted DC voltage VPP to connect the bit line pair BLT, BLB and the cross-couple-type latch amplifier and transfer a signal read from a select memory cell to the cross-couple-type sense latch. Note that, in a case where sense amplifiers are alternately arranged on both sides of a memory cell array, it is known that a cross-couple-type sense latch is shared by adjacent memory mats. In such a configuration, two transmission gate pairs are arranged so as to connect a bit line pair included in one activated memory mat to the cross-couple-type sense latch and cut off a bit line pair included in the other non-selected memory mat. The bit line equalize signal BLEQ, the voltages of the common source lines CSP, CSN, and the shared signal SHR are generated in the array controller ACC shown in FIG. 7.

The sub-amplifier SAMP0 is composed of a first local input/output line precharge circuit LIOPCC1, a second local input/output line precharge circuit LIOPCC2, and a read circuit RDC. The first local input/output line precharge circuit LIOPCC1 is a circuit for driving non-selected local input/output lines LIO0T, LIO0B to a reference voltage VDLR (here, VDL/2, for example). The configuration of the first local input/output line precharge circuit LIOPCC1 is composed of three NMOS transistors, where the bit line equalize signal BLEQ is connected to gate electrodes of the respective transistors. The local input/output line precharge circuit LIOPCC1 is activated according to driving of the bit line equalize signal BLEQ to the boosted voltage VPP in a standby state to drive the local input/output lines LIO0T, LIO0B to the reference voltage VDLR. In read operation, the bit line equalize signal BLEQ in a non-selected memory mat is maintained at the boosted voltage VPP. Since the above-described column select signal YS is shared by a plurality of memory mats, a column switch CSW included in a non-selected memory mat is also made conductive. However, since the local input/output line is held at the same reference voltage VDLR as that of the bit line pair, wasteful power consumption can be suppressed.

The second local input/output line precharge circuit LIOPCC2 is a circuit for driving the local input/output lines LIO0T, LIO0B included in a selected memory mat to the internal step-down voltage VDL. A configuration of the local input/output line precharge circuit LIOPCC2 is composed of three PMOS transistors, where the local input/output line equalize signal LIOEQB is connected to gate electrodes of the respective transistors. Though omitted in FIG. 10, the local input/output line equalize signal LIOEQ is a constituent element of the multiple equalize enable signals EQSG shown in FIG. 1, and it is shared by memory mats adjacent above and below. In read operation, the local input/output line precharge circuit LIOPCC2 is activated according to temporary driving of the local input/output line equalize signal LIOEQB to the ground potential VSS. In a selected memory mat, the internal step-down voltage VDL is supplied to the local input/output lines LIO0T, LIO0B from the common source line CSP. In a non-selected memory mat, since the common source line CSP is maintained at the reference voltage VDLR, the local input/output lines LIO0T, LIO0B are also maintained at the reference voltage VDLR.

The read circuit RDC is a circuit for receiving read signals generated in the local input/output lines LIO0T, LIO0B to drive the main input/output line MIO0T, MIO0B to voltages corresponding to the signals. The circuit configuration is composed of three NMOS transistors N11, N12, N13, and it functions as a differential input amplifier based upon the transistors N11 and N12. The local input/output line LIO0T and the main input/output line MIO0B are connected to a gate electrode of the first transistor N11 and a drain electrode thereof, respectively. The local input/output line LIO0B and the main input/output line MIO0T are connected to a gate electrode of the second transistor N12 and a drain electrode thereof, respectively. The bit line equalize signal BLEQB and source electrodes of the two transistors N11, N12 are connected to a gate electrode of the third transistor N13 and a drain electrode thereof, respectively. Here, the bit line equalize signal BLEQB is a reverse signal of the above-described bit line equalize signal BLEQ. Accordingly, the read circuit RDC is activated in the selected memory mat according to driving of the bit line equalize signal BLEQB to the internal step-down voltage VDL.

The current control circuit IC0 is composed of, for example, two NMOS transistors N21, N22. A read enable signal RD1 and a read enable signal RD2 are connected to a gate electrode of the transistor N21 and a gate electrode of the transistor N22, respectively. Source electrodes of both of the transistors are grounded and drain electrodes thereof are connected to a source electrode of the transistor N13 in the read circuit, respectively. For example, a driving ability of a sub-amplifier can be adjusted appropriately by forming a gate width of the transistor N21 to be wider than that of the transistor N22 to selectively activate the read enable signals RD1, RD2.

The main amplifier MAMP0 is composed of a main input/output line precharge circuit MIOPCC1, a main input/output line transmission gate MIOTG, a cross-couple-type latch amplifier CCL2, a sense node precharge circuit MOPCC, and a read driving circuit RDRV. The main input/output line precharge circuit MIOPCC1 is a circuit for driving the main input/output lines MIO0T, MIO0B to the internal step-down voltage VDL. A circuit configuration of the main input/output line precharge circuit MIOPCC1 is composed of three PMOS transistors P11, P12, P13. The main input/output line equalize signal MIOEQB is connected to gate electrodes of the respective transistors. Though not shown in FIG. 10, the main input/output line equalize signal MIOEQB is a constituent element of the multiple equalize enable signals EQSG shown in FIG. 1. The respective transistors are activated according to driving of the main input/output line equalize signal MIOEQB to the ground potential VSS in a standby state so that respective transistor are activated and the main input/output lines MIO0T, MIO0B are driven to the internal step-down voltage VDL.

The main input/output line transmission gate MIOTG is a circuit for controlling connections between the main input/output lines MIO0T, MIO0B and sense nodes SNT, SNB in the main amplifier MAMP0. A circuit configuration of the main input/output line transmission gate MIOTG is composed of PMOS transistors P21, P22. The transmission gate enable signal TGB is connected to gate electrodes of the respective transistors. The main input/output lines MIO0T, MIO0B and the sense nodes SNT, SNB in the main amplifier MAMP0 are held at the same voltage (here, the internal step-down voltage VDL) according to driving of the transmission gate enable signal TGB to the ground potential VSS in a standby state.

In read operation, when a signal corresponding to stored data read from the above-described sub-amplifier SAMP0 is generated at the sense nodes SNT, SNB, respective transistors are cut off according to driving the transmission gate enable signal TGB put in the ground potential VSS to the internal step-down voltage VDL. According to such configuration and operation, the main input/output lines MIO0T, MIO0B having a long wiring length can be disconnected from the sense nodes SNT, SNB inside the main amplifier MAMP0 in read operation, so that a load capacity to be driven by the cross-couple-type latch amplifier CCL2 described later can be reduced. That is, required time for amplify operation of the cross-couple-type latch amplifier CCL2 can be reduced.

The cross-couple-type latch amplifier CCL2 is composed of two PMOS transistors P31, P32, and three NMOS transistors N31, N32, N33. The transistors P31, P32, N31, N32 form a positive feedback loop. A gate electrode of the transistor N33 and a drain electrode thereof are connected to the main amplifier enable signal MAE and source electrodes of the transistors N31, N32, respectively, and a source electrode of the transistor N33 is grounded. In read operation, the cross-couple-type latch amplifier CCL2 is enabled to amplify faint signals generated at the sense nodes SNT, SNB according to driving of the main amplifier enable signal MAE to the internal step-down voltage VDL.

The sense node precharge circuit MOPCC is composed of three PMOS transistors P41, P42, P43. The main amplifier enable signal MAE is connected to gate electrodes of the respective transistors. The sense nodes SNT, SNB inside the main amplifier MAMP0 are driven to the internal step-down voltage VDL according to driving the main amplifier enable signal MAE to the ground potential VSS in a standby state.

The read driving circuit RDRV is composed of two inverter circuits IV11, IV12, and two NMOS transistors N41, N42. The sense nodes SNT, SNB are connected to input pins of the inverter circuits IV11, IV12, respectively, and output pins thereof are connected to gate electrodes of the transistors N41, N42, respectively. Drain electrodes of the transistors N41, N42 are connected to the global input/output lines GIO0T, GIO0B, respectively, and source electrodes are grounded, respectively. With such a configuration, for example, one of the global input/output lines GIO0T, GIO0B precharged to the peripheral circuit voltage VCL is discharged in response to a signal amplified in the above-described cross-couple-type latch amplifier CCL2. Since an enable signal is not required for the circuit operation, it is unnecessary to provide a timing margin when the global input/output line is driven. Accordingly, the circuit configuration is useful for speedup of a data path.

"Circuit operation of data path"

Figure 11:
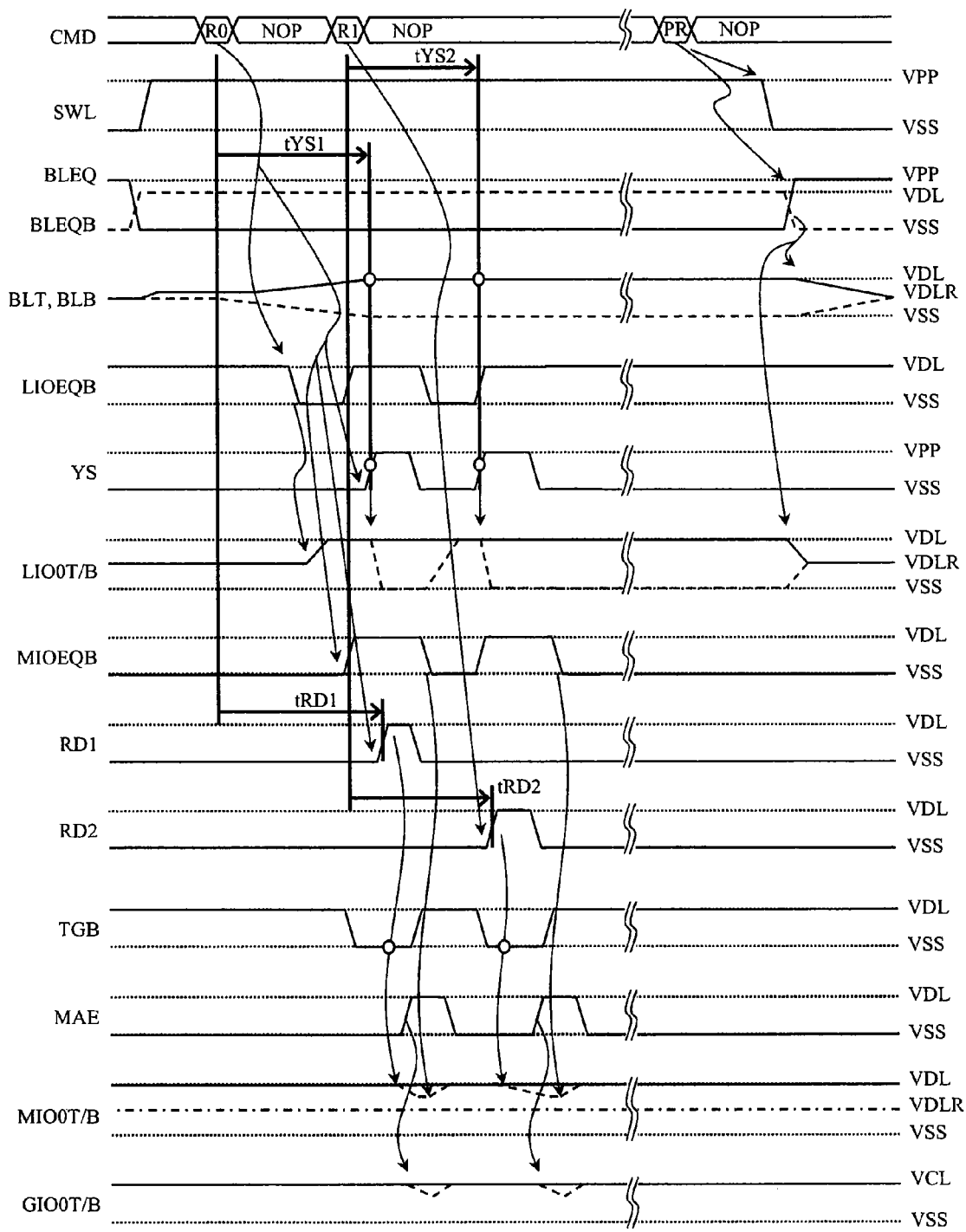
FIG. 11 is a diagram showing an example of a timing diagram in a read operation in the column circuit shown in FIG. 10.

FIG. 11 shows an example of a timing diagram in read operation of the data path shown in FIG. 10. The timing diagram shown in FIG. 11 is based upon assumption that burst read operation is continuously performed at least two times (2 cycles) just after the memory bank has been activated. It is also assumed for facilitating description and understanding that reading is continuously performed from the sense amplifier selected by the same column address. As described below, there are two features in the read operation shown in FIG. 11

The first feature lies in that a time tYS1 from reception of a read command R0 to activation of a column select signal YS at the first cycle of burst read, namely, just after page open is designed to be longer than a time tYS2 at the second cycle of the burst read or cycles subsequent thereto. The second feature lies in that a driving ability of a sub-amplifier is adjusted by activating a read enable signal RD1 for the first cycle of the burst read and activating a read enable signal RD2 for the second cycle of the burst read and the cycles subsequent thereto. According to the first feature, designing is performed such that the time tRD1 from reception of a read command R0 to activation of a read enable signal RD1 is longer than the time tRD2 from reception of a read command R1 to activation of a read enable signal RD2.

Burst read operation of the first cycle will be first described. Though omitted for simplification in FIG. 11, when the DDR SDRAM receives an activate command, a bit line equalize signal BLEQ is made non-active in a sense amplifier array SAA of a memory mat (for example, MAT0) to which a selected memory cell belongs, so that precharge operation of the bit line precharge circuit (PCC in FIG. 10) is stopped. Precharge operation of the local input/output line precharge circuit LIOPCC1 in a sub-amplifier in an activated memory mat is also stopped. Subsequently, main word lines in the memory mat and sub-word lines SWL corresponding to the main word lines are activated, so that stored data is read with the sense amplifiers in all the sub-arrays within the mat.

Next, when the DDR SDRAM receives a read command R0, the local input/output line precharge circuit LIOPCC2 is temporarily activated according to activation of the local input/output line equalize signal LIOEQB so that the local input/output lines LIO0T to LIO7T and LIO0B to LIO7B put in the reference voltage VDLR are driven to the internal step-down voltage VDL. Thereafter, stored data read with the sense amplifier is selected by a column select signal YS outputted from the column decoder YDEC to be read to the local input/output lines LIO0T to LIO7T and LIO0B to LIO7B.

The main input/output line equalize signal MIOEQB is put in an inactive state and precharge operation of the main input/output line precharge circuit MIOPCC1 is stopped. In this state, the read enable signal RD1 is activated and the transistors N21 in the current control circuits IC0 to IC7 are made conductive, so that signals generated in the local input/output lines LIO0T to LIO7T and LIO0B to LIO7B are respectively amplified at high speed and stored data is read to the main input/output line MIO0T to MIO7T and MIO0B to MIO7B. At this time, since the transmission gate enable signal TGB is put in an activated state, the stored data read to the main input/output line MIO0T to MIO7T and MIO0B to MIO7B is transmitted to the main amplifiers MAMP0 to MAMP7. Finally, the cross-couple-type latch amplifier CCL2 is enabled according to activation of the main amplifier enable signal MAE, so that amplify operation for faint signals generated in the main input/output lines MIO0T to MIO7T and MIO0B to MIO7B and read operation to the global input/output lines GIO0T to GIO7T and GIO0B to GIO7B are performed.

Then, when the DDR SDRAM receives a read command R1, burst read operation for the second cycle is performed. In the read operation, data on the local input/output line is amplified with low power consumption according to activation of the read enable signal RD2 unlike the first cycle and stored data is read to the main input/output line. Operation similar to the above is preformed in the third cycle and cycles subsequent thereto of the burst read.

When the DDR SDRAM receives a precharge command PR, the main word line and the sub-word line are driven to the ground potential VSS and the bit line equalize signal BLEQ is driven to the boosted DC voltage VPP. According to the operation, all bit line precharge circuits PCC and local input/output line precharge circuits LIOPCC1 within the sense amplifier array SAA are activated and all bit lines and local input/output lines within the selected memory mat are driven to the reference voltage VDLR, so that the DDR SDRAM returns back to standby state.

"Timing controller"

Figure 12:
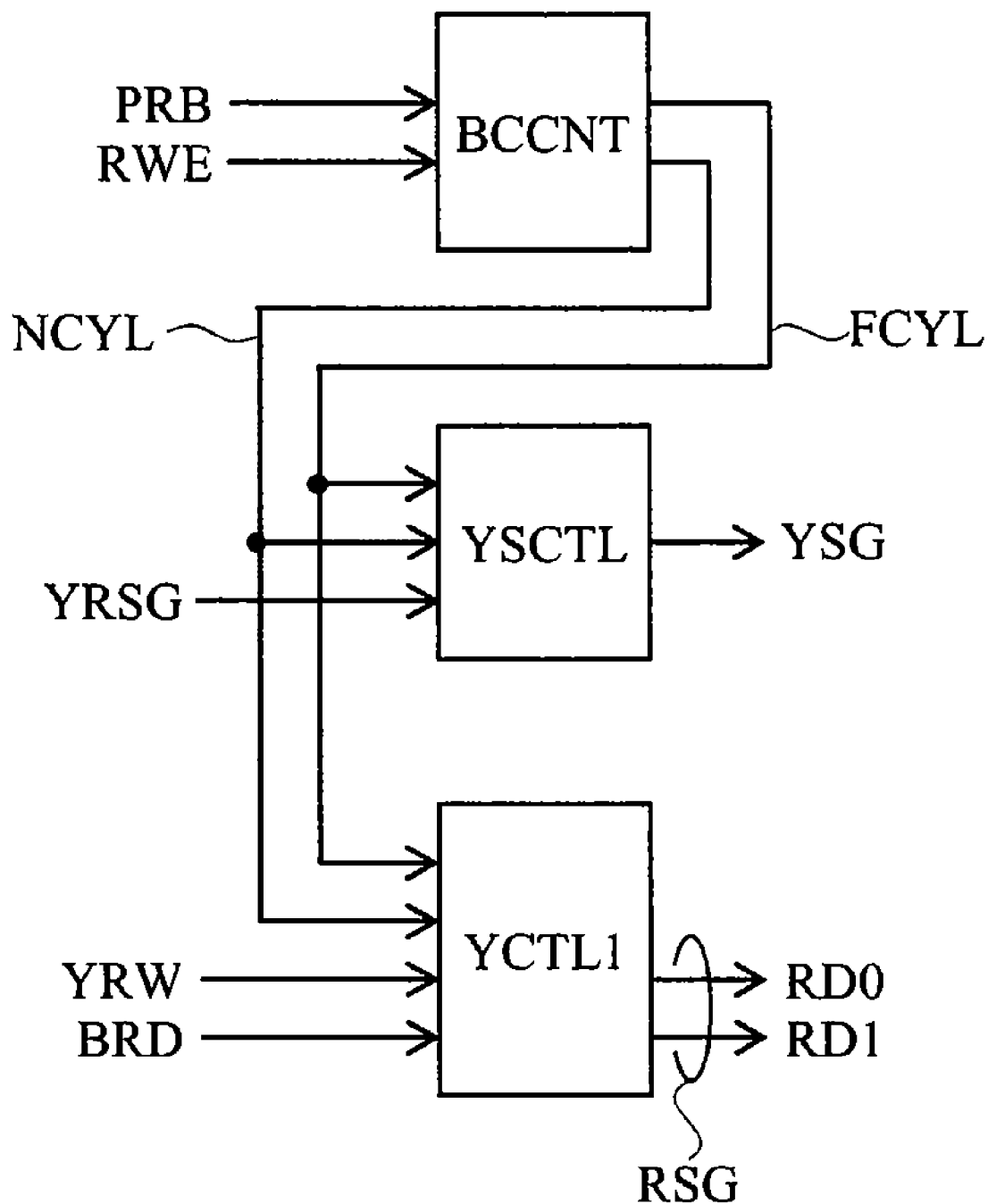
FIG. 12 is a diagram showing an example of a main section block configuration of a timing controller shown in FIG. 1.

FIG. 12 shows an example of a main section block diagram of the timing controller TMCTL shown in FIG. 1. A feature of the circuit lies in that output timings and pulse width of multiple column signals YSG or read enable signals RD1 and RD2 are adjusted according to a cycle of burst read operation. Three circuit blocks of a burst cycle counter BCCNT, a column select controller YSCTL and a column read signal controller YCTL1 regarding this point are shown in FIG. 12 for simplification. The burst cycle counter BCCNT receives a precharge enable signal PRB and a read write enable signal RWE, and it outputs burst cycle flag signals FCYL, NCYL. The column select controller YSCTL receives column read enable signal YRSG and the burst cycle flag signals FCYL, NCYL, it outputs multiple column signals YSG. The column read signal controller YCTL1 receives a column read write enable signal YRW, a read signal BRD, and the burst cycle flag signals FCYL, NCYL, it outputs read enable signals RD1, RD2 included in multiple read enable signals RSG.

Figure 13:
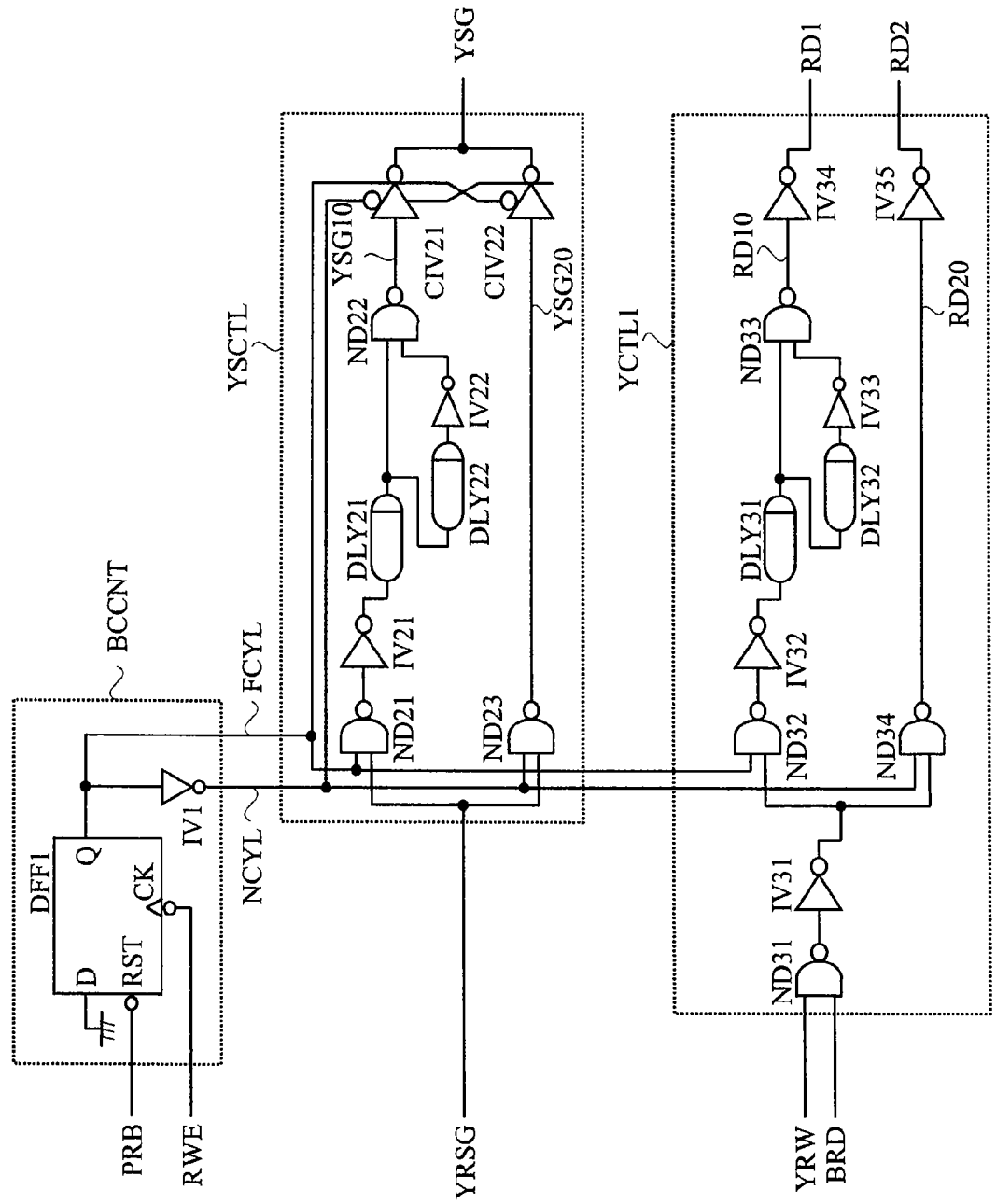
FIG. 13 is a diagram showing an example of a detailed configuration of a main section block shown in FIG. 12.

FIG. 13 shows an example of a detailed circuit configuration of the timing controller TMCTL shown in FIG. 12. The burst cycle counter BCCNT is composed of a D flip-flop DFF1 and an inverter circuit IV1. An input pin D of the D flip-flop DFF1 is grounded and the burst cycle flag signal FCYL is outputted from an output pin Q of the D flip-flop DFF1. The burst cycle flag signal FCYL is inverted in the inverter circuit IV1 to generate the burst cycle flag signal NCYL. The precharge enable signal PRB is connected to a reset pin RST of the D flip-flop and the read write enable signal RWE is connected to an inverted clock pin CKB, respectively. The burst cycle flag signal NCYL may be outputted from an output pin having a polarity different from that of the output pin Q provided in an ordinary D flip-flop.

The column select controller YSCTL is composed of two inverter circuits IV21, IV22, two clocked inverter circuits CIV21, CIV22, three NAND circuits ND21, ND22, ND23, and two delay circuits DLY21, DLY22. The burst cycle flag signal FCYL is connected to one input pin of the NAND circuit ND21, and a column read enable signal YRSG is connected to the other input pin thereof, respectively, where an output signal of the NAND circuit ND21 is inverted in the inverter circuit IV21 to be inputted into the delay circuit DLY21. An output signal of the delay circuit ND21 is inputted into two input pin of the NAND circuit ND22 directly and from the delay circuit DLY22 via the inverter circuit IV22. An output pin node of the NAND circuit ND22 is defined as a column signal YSG10. The burst cycle flag signal NCYL is connected to one input pin of the NAND circuit ND23, and the column read enable signal YRSG is connected to the other input pin thereof. An output pin node of the NAND circuit ND23 is defined as column signal YSG20. The column signals YSG10, YSG20 are connected to input pins of the clocked inverter circuits CIV21, CIV22, respectively, and output pins thereof are connected to one of the multiple column signals YSG. The burst cycle flag signal FCYL is connected to a non-inverted clock pin of the clocked inverter circuit CIV21 and an inverted clock pin of the clocked inverter circuit CIV22, respectively. The burst cycle flag signal NCYL is connected to an inverted clock pin of the clocked inverter circuit CIV21 and a non-inverted clock pin of the clocked inverter circuit CIV22, respectively.

The column read signal controller YCTL1 is composed of five inverter circuits IV31, IV32, IV33, IV34, IV35, four NAND circuits ND31, ND32, ND33, ND34, and two delay circuits DLY31, DLY32. A column read write enable signal YRW is connected to one input pin of the NAND circuit ND31, and a read signal BRD is connected to another input pin thereof, respectively. An output signal of the NAND circuit ND31 is inverted in the inverter circuit IV31 to be inputted in one input pins of the NAND circuits ND32, ND34, respectively. The burst cycle flag signal FCYL is connected to another input pin of the NAND circuit ND32, and an output signal of the NAND circuit ND32 is inverted in the inverter circuit IV32 to be inputted to the delay circuit DLY31. An output signal of the delay circuit DLY 31 is connected to input pins of the NAND circuit ND33 directly and from the delay circuit DLY32 via the inverter circuit IV33. An output pin node of the NAND circuit ND33 is defined as a read enable signal RD10, and a signal obtained by inverting the read enable signal RD10 in the inverter circuit IV34 is defined as read enable signal RD1. The burst cycle flag signal NCYL is connected to another input pin of the NAND circuit ND34, and an output pin node of the NAND circuit ND34 is defined as a read enable signal RD20. A signal obtained by inverting the read enable signal RD20 in the inverter circuit IV35 is defined as a read enable signal RD2.

Figure 14:
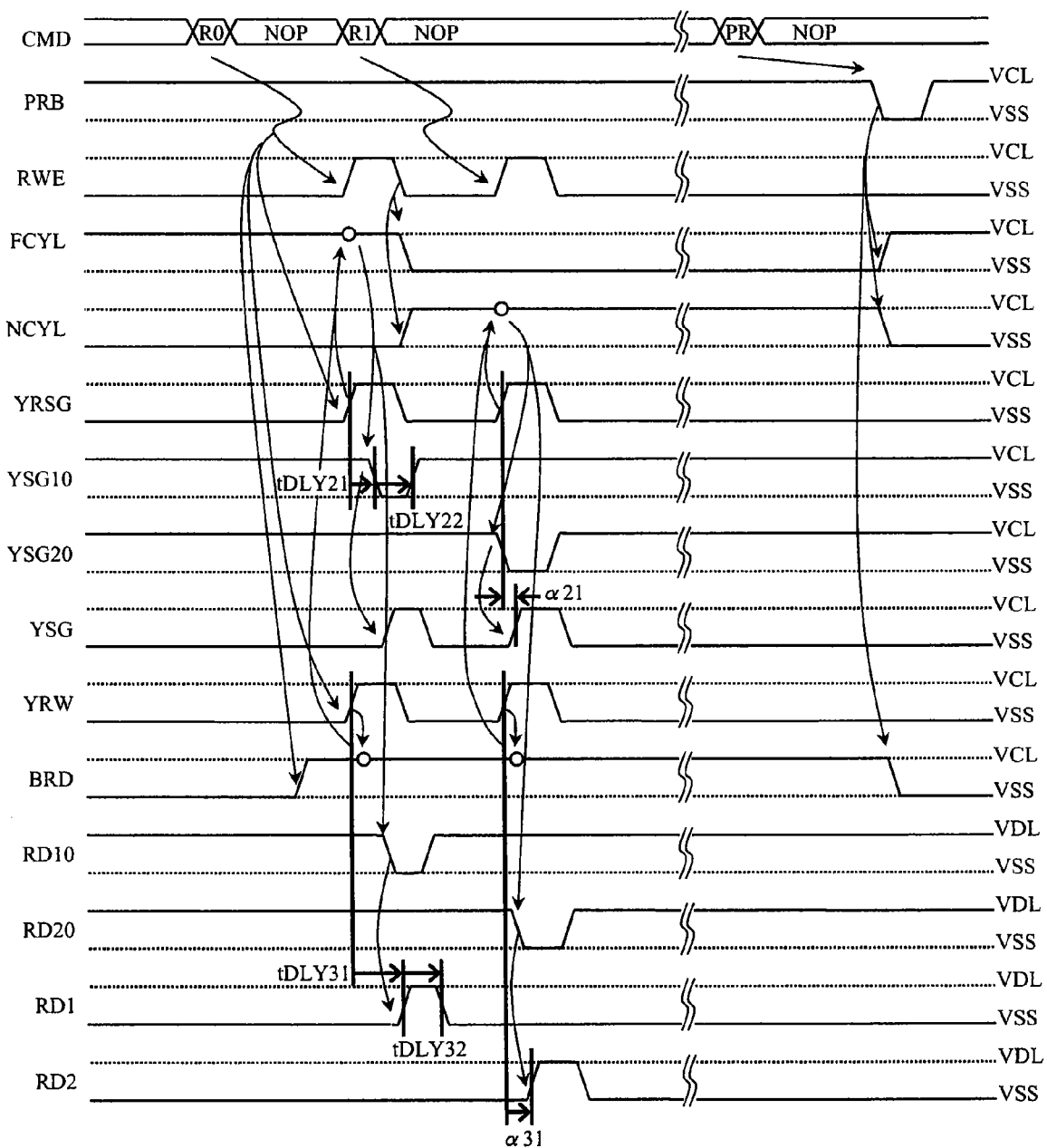
FIG. 14 is a diagram showing an example of a timing diagram of a timing controller shown in FIG. 13.

FIG. 14 shows an example of a timing chart of the timing controller TMCTL shown in FIG. 13. In FIG. 14, operations performed after the DDR SDRAM receives a read command are shown corresponding to the read operation timing diagram of the column circuit shown in FIG. 11 for simplification. The burst cycle flag signals FCYL, NCLY are held at the peripheral circuit voltage VCL and the ground potential VSS during standby. When the DDR SDRAM receives a read command R0, the read signal BRD is activated. Next, when a pulse signal is produced in the column read enable signal YRSG, a pulse signal is produced in at least one of the multiple column signals YSG having a pulse width of about tDLY22 after about time tDLY21. When a column read column enable signal YRW is produced, the read enable signal RD1 having a pulse width of tDLY32 is produced after about time tDLY31.

Here, symbols tDLY21, tDLY22, tDLY31, tDLY32 denote delay times of the delay circuits DLY21, DLY22, DLY31, DLY32, respectively. The delay times tDLY22, tDLY32 are designed to be shorter than activation times of the input signals YRSG, YRW. Thereafter, a read write enable signal RWE is produced so that the burst cycle flag signal FCYL put in the peripheral circuit voltage VCL is driven to the ground potential VSS and the burst cycle flag signal NCYL put in the ground potential VSS is driven to the peripheral circuit voltage VCL in synchronism with a falling edge of the read write enable signal RWE, respectively.

Subsequently, when the DDR SDRAM receives a read command R1, a column read enable signal YRSG is produced again, so that a pulse signal is generated in one of the multiple column signals YSG after about a time a21. When a column read column enable signal YRW is produced again, a pulse signal is produced in the read enable signal RD2 after a time a31. Thereafter, upon each reception of a read command, operation similar to the operation for the read command R1 is performed. Here, the time a21 is approximately equal to the sum of the delay times in the NAND circuit ND23 and the clocked inverter circuit CIV22 but is shorter than the above-described delay time tDLY21. The time a31 is approximately equal to the sum of the delay times in the NAND circuit ND34 and the inverter circuit IV35 but is shorter than the above-described delay time tDLY31.

When the DDR SDRAM receives a precharge command PR, a precharge enable signal PRB is produced so that the burst cycle flag signal FCYL put in the ground potential VSS and the burst cycle flag signal NCYL put in the peripheral circuit voltage VCL are driven to the peripheral circuit voltage VCL and the ground potential VSS, respectively. The read signal BRD put in the peripheral circuit voltage VCL is driven to the ground potential VSS, so that the DDR SDRAM returns back to standby state.

According to the configuration and operation described above, the following three advantages can be obtained. The first advantage lies in that a signal having a timing and a pulse width corresponding to the number of burst cycles can be generated in the multiple column signals YSG, the read enable signals RD1 and RD2 by detecting the number of burst cycles using a burst cycle counter BCCNT. That is, since an internal operation can be modified without adding a new signal pin, a DDR SDRAM according to a novel architecture where compatibility with a conventional memory is maintained while chip cost is being suppressed can be realized.

The second advantage lies in that a generation timing of multiple column signals YSG in read operation just after page open can be delayed using the delay circuit DLY21. Pulse widths of the multiple column signals YSG can be shortened using the delay circuit DLY22. As a result, generation of a column select signal YS, namely, a connection timing between the sense amplifier and the local input/output line, is delayed, as shown in FIG. 11, and a pulse width of the column select signal YS is shortened according to delay of row circuit operation at a time of the page open so that a precharge operation time subsequent thereto can be expanded.

The third advantage lies in that a generation timing of a read enable signal RD1 in read operation just after page open can be delayed using the delay circuit DLY31. A pulse width of the read enable signal RD1 can be shortened using the delay circuit DLY32. As a result, an activation timing of, the read enable signal RD1, namely, the sub-amplifier, is delayed as shown in FIG. 11, and a pulse width of the read enable signal RD1 is shortened according to delays of row circuit operation at a time of page open and of an enable timing of the column select signal YS, so that a precharge operation time subsequent thereto can be expanded.

"Advantage of DDR SDRAM"

The following two advantages can be mainly obtained using the semiconductor device of the first embodiment described above. The first advantage lies in that the column circuit operation can be made fast in a burst read operation just after page open by raising driving ability of the sub-amplifier using the timing controller TMCTL and the current control circuit. That is, RC delay due to increase of a chip area is made allowable and a fast Gigabit class DDR SDRAM can be realized.

The second advantage lies in that delay of row circuit operation can be allowed in burst read operation just after page open by delaying activation timings of a column select signal and the sub-amplifier using the timing controller TMCTL. That is, considering RC delay of row circuit operation or characteristic fluctuation of a memory cell select transistor due to increase of a chip area, delay of a row circuit operation time can be allowed so that a Gigabit class DDR SDRAM with large operation margin can be realized. On the other hand, current consumption can be suppressed in the second burst cycle and cycles subsequent thereto by suppressing a driving ability of the sub-amplifier using the timing controller TMCTL and the current control circuit. Therefore, a DDR SDRAM with high performance that satisfies speedup and low power consumption simultaneously can be realized.

Note that, the configuration and operation have been described in the above focusing on the column circuit in the read operation. However, it will be easily understood that exact write operation can be similarly realized also in burst write operation just after page open by delaying an activation timing of a column select signal so as to correspond to delay of the row circuit operation. An adjusting method for adjusting a driving ability of the sub-amplifier can be modified variously. For example, description has been made in the timing diagram in FIG. 11 assuming that the gate widths of the two transistors N21, N22 in the current control circuit IC0 shown in FIG. 10 are different from each other. However, it is possible to design both of the transistors such that their gate widths are equal to each other.

In this case, in the column read signal control circuit YCTL1 shown in FIG. 13, replacing the burst cycle flag signal NCYL connected to one of the input pins of the NAND circuit ND34 by the peripheral circuit voltage VCL to activate the read enable signal RD2 in the first cycle of burst operation just after page open and make both of the transistors N21 and N22 conductive. Only one transistor N22 is made conductive from the second cycle burst read operation. With such configuration and operation, an area of the current control circuit IC0 can be reduced so that an area of the cross-point area circuit XP can be suppressed.

Second Embodiment

In a second embodiment, other configuration example and operation example of the current control circuit described in the first embodiment will be described.

Figure 15:
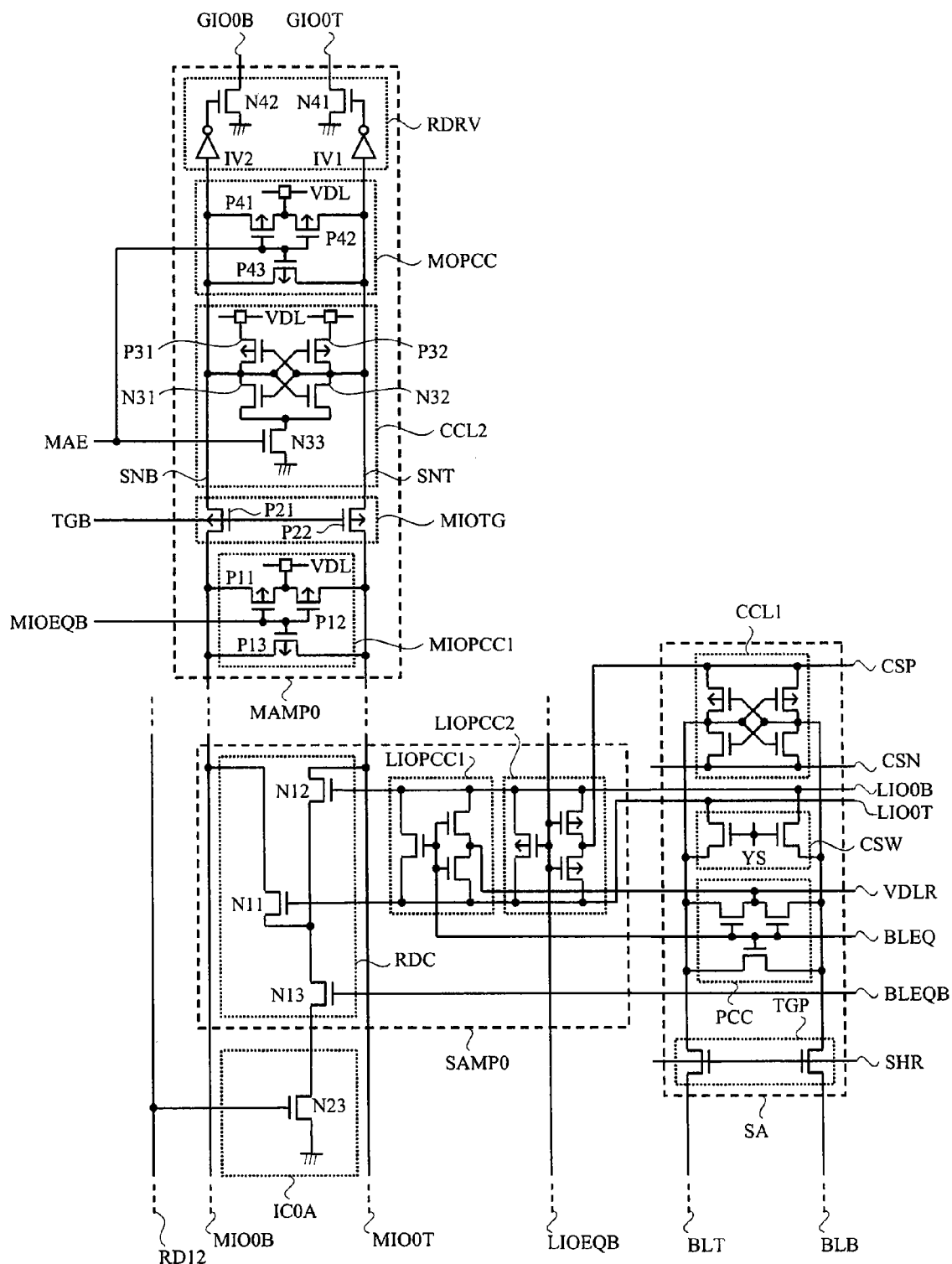
FIG. 15 is a circuit diagram showing a configuration example of a column circuit different from that shown in FIG. 10 in a semiconductor device of a second embodiment according to the present invention.

FIG. 15 is a circuit diagram showing a configuration example of a column circuit different from that shown in FIG. 10 in a semiconductor device of the second embodiment according to the present invention. A feature of the configuration shown in FIG. 15 lies in that a current control circuit IC0A shown in FIG. 15 is composed of one NMOS transistor, which is different from the configuration shown in FIG. 10. The configuration shown in FIG. 15 is different from the configuration shown in FIG. 10 in the read enable signal is only RD12, it is connected to a gate electrode of the transistor N23, and voltage of the activated read enable signal RD12 varies according to respective burst read cycles.

Figure 16:
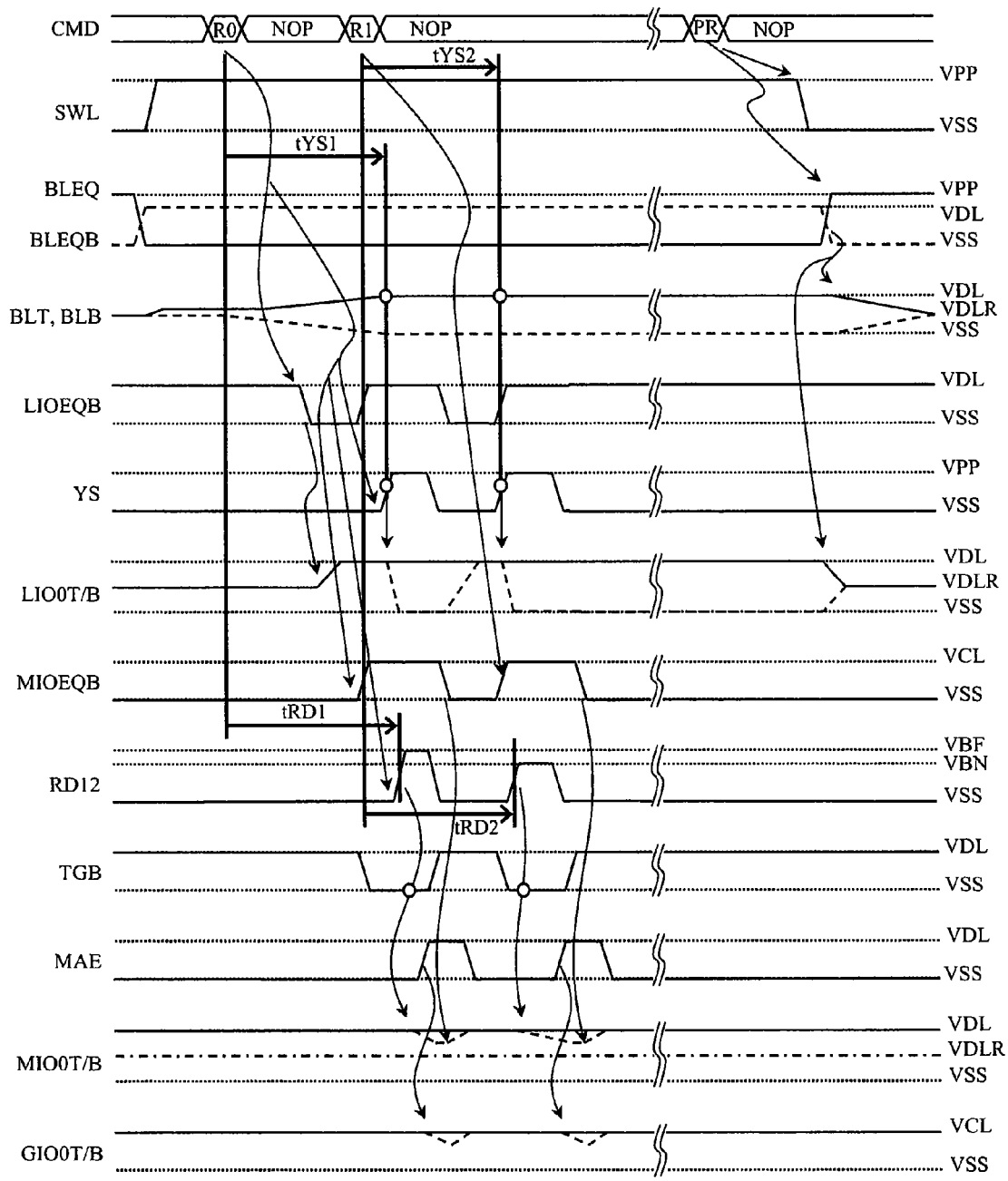
FIG. 16 is a diagram showing an example of a timing diagram of read operation in the column circuit shown in FIG. 15.

FIG. 16 shows an operation timing diagram in read operation of the column circuit shown in FIG. 15. In the diagram, a read enable signal RD12 is driven to a first bias voltage VBF in the first cycle of burst read operation just after page open, at a timing later than that of subsequent cycles of read operation as the read enable signal RD1 described in FIG. 11 in the first embodiment. Correspondingly, the read enable signal RD12 is driven to a second bias voltage VBN lower than the first bias voltage VBF in the second cycle and cycles subsequent thereto. Here, the first bias voltage VBF and the second bias voltage VBN are set to, for example, the boosted DC voltage VPP or the peripheral circuit voltage VCL, and the internal step-down voltage VDL, respectively.

Figure 17:
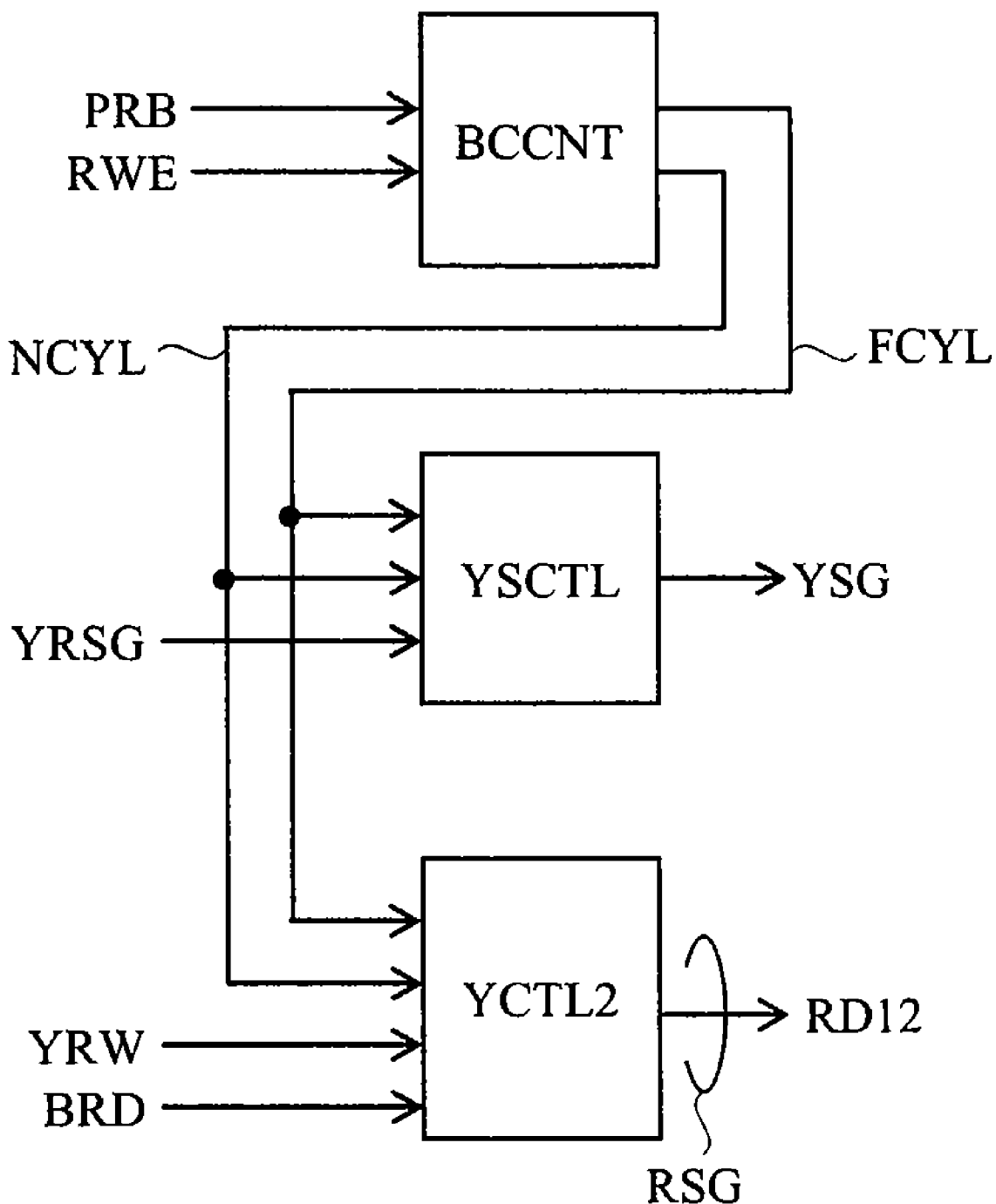
FIG. 17 is a diagram showing another example of a main section block configuration of the timing controller shown in FIG. 1.

FIG. 17 shows another example of a main section block configuration of the timing controller TMCTL shown in FIG. 1. A feature of the circuit configuration lies in that the column read signal controller YCTL1 in the configuration shown in FIG. 12 is replaced with a column read signal controller YCTL2, and the column read signal controller YCTL2 receives a column read write enable signal YRW, a read signal BRD, a burst cycle flag signals FCYL, NCYL to output a read enable signal RD12 included in the multiple read enable signals RSG.

Figure 18:
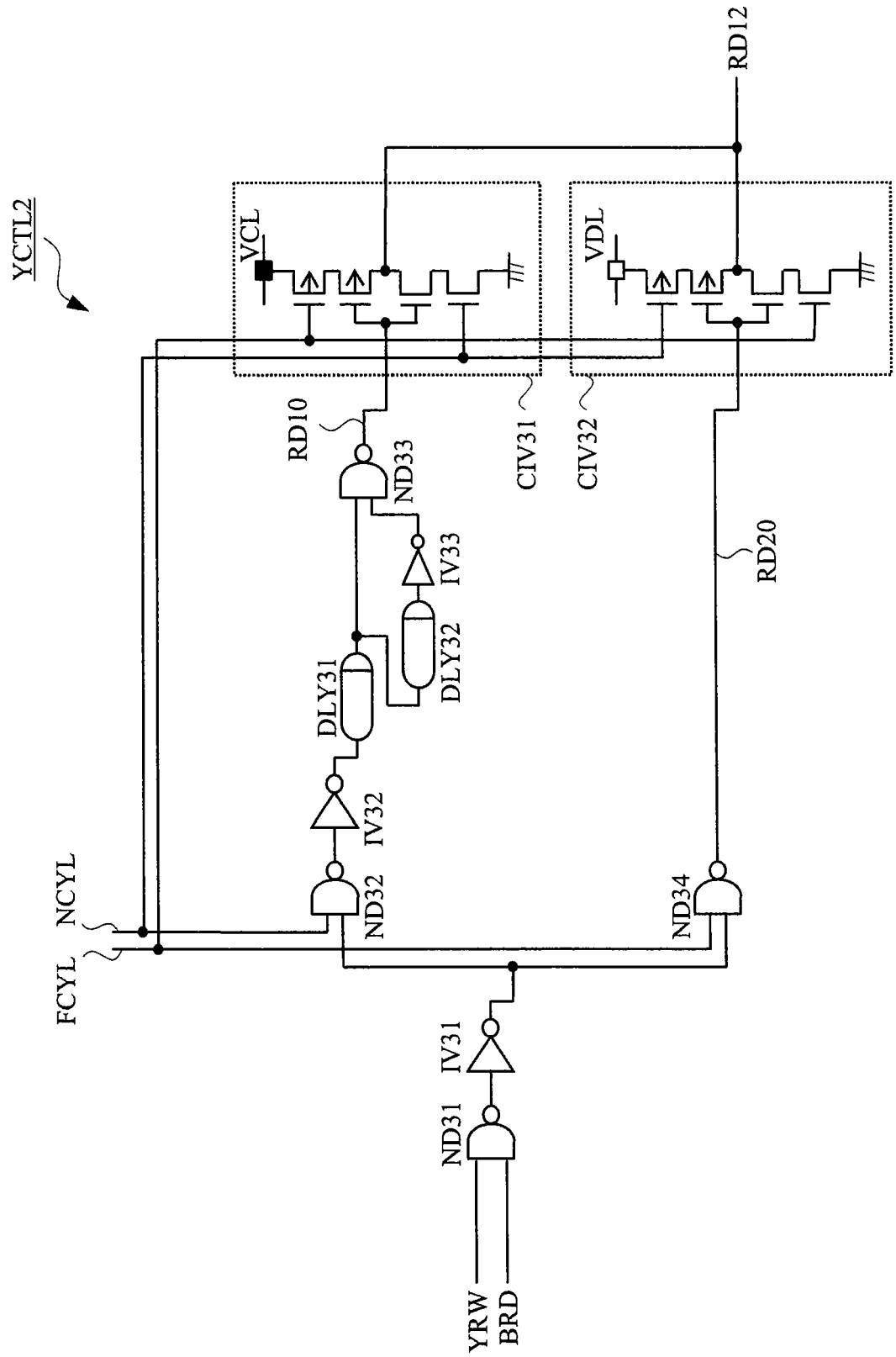
FIG. 18 is a diagram showing an example of a detailed configuration of the main section block shown in FIG. 17.

FIG. 18 shows an example of a detailed circuit configuration of the column read signal controller YCTL2 in the timing control circuit shown in FIG. 17. A feature of the circuit configuration lies in that the inverter circuits IV34, IV35 are replaced with clocked inverter circuits CIV31, CIV32, respectively and a node where output pins of the clocked inverter circuits CIV31, CIV32 is set to a read enable signal RD12, which are different from the column read signal controller YCTL1 in the configuration shown in FIG. 13. The circuit configuration shown in FIG. 18 is different from that shown in FIG. 13 in that a bias voltage VBF (for example, the peripheral circuit voltage VCL) and a bias voltage VBN (for example, the internal step-down voltage VDL) are inputted into the clocked inverter circuit CIV31 and the clocked inverter circuit CIV32, respectively.

With such a circuit configuration, it is possible to adjust voltage amplitude of the read enable signal RD12 according to the burst cycle. That is, conductance of the transistor N23 at the first cycle of the current control circuit IC0A shown in FIG. 15 is increased in burst read operation just after page open by enlarging the voltage amplitude of the read enable signal RD12, so that the driving ability of the sub-amplifier can be improved. On the other hand, the conductance of the transistor N23 is decreased in the cycles subsequent to the first cycle by reducing the voltage amplitude of the read enable signal RD12, so that the driving ability of the sub-amplifier can be suppressed. Thus, since the driving ability of the sub-amplifier can be adjusted using one transistor N23, the embodiment is suitable for area suppression of the cross-point area circuit XP.

Third Embodiment

Figure 19:
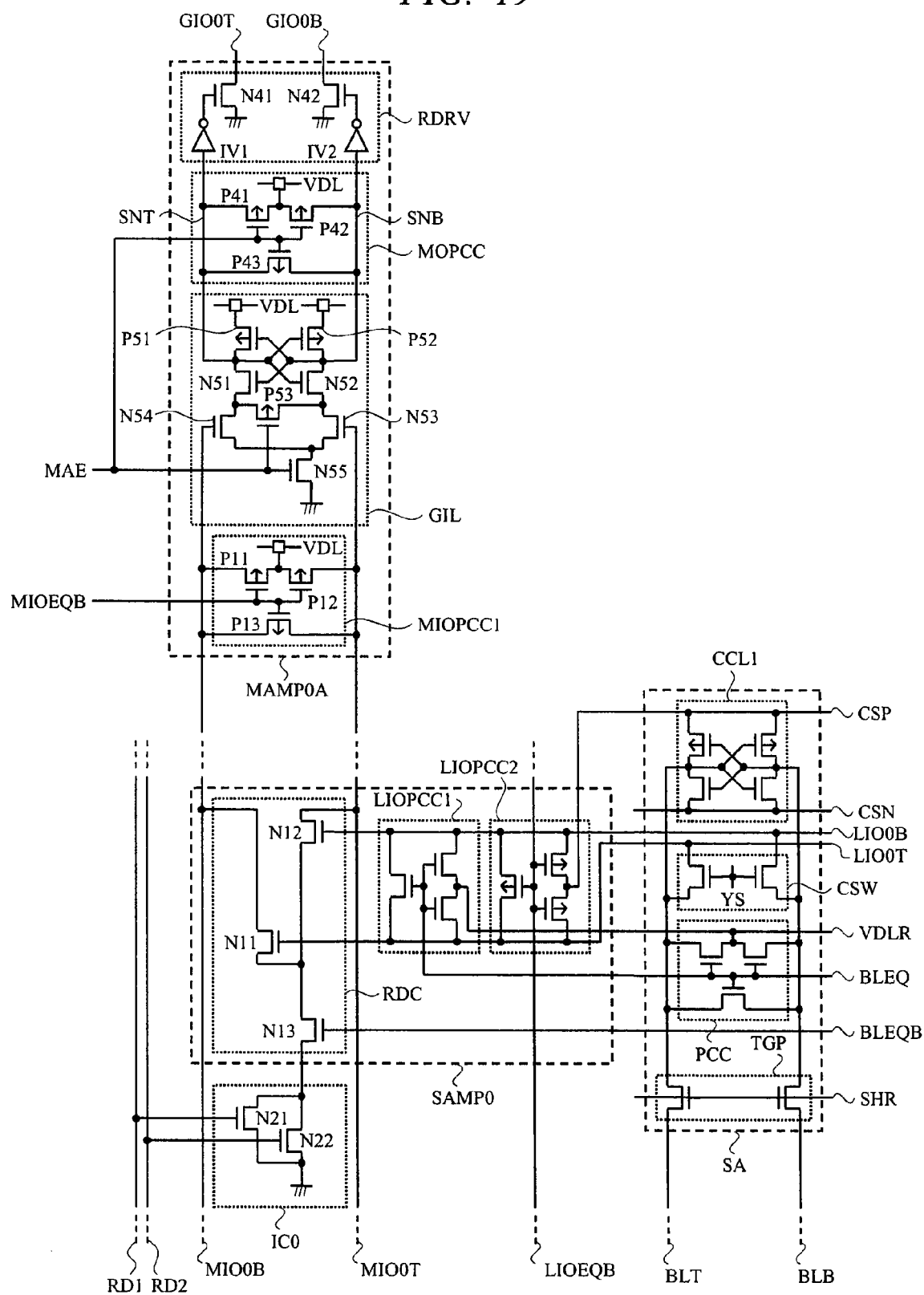
FIG. 19 is a circuit diagram showing a configuration example of a column circuit different from that shown in FIG. 10 and others in a semiconductor device of a third embodiment according to the present invention.

In a third embodiment, another example of configuration and operation of the main amplifier used in the DDR SDRAM described in the first and second embodiment will be described. FIG. 19 is a circuit diagram showing a configuration example of a column circuit different from the column circuit shown in FIG. 10 and the like in a semiconductor device of the third embodiment according to the present invention. A feature of a main amplifier MAMP0A shown in FIG. 19 lies in that the main input/output line transmission gate MIOTG is removed from the circuit configuration shown in FIG. 10 and the cross-couple-type latch amplifier CCL2 is replaced with a gate input-type sense latch GIL.

The gate input-type sense latch GIL is composed of three PMOS transistors P51, P52, P53 and five NMOS transistors N51, N52, N53, N54, N55. The transistors P51, P52, N51, N52 form a positive feedback loop to amplify and hold current signals inputted from sources of the transistors N51, N52. Drains of the transistors N54, N53 are connected to the sources of the transistors N51, N52, respectively. The transistors N53, N54 constitute a differential input pair, and gate electrodes thereof are connected to the main input/output lines MIO0T, MIO0B, respectively. The transistor P53 is inserted between source electrodes of the transistors N51, N52, and the transistor N55 is inserted between the source electrodes of the transistors N53, N54 and the ground electrode. Further, a main amplifier enable signal MAE is connected to gate electrodes of the transistors P53, N55.

With such a circuit configuration, the gate input-type sense latch GIL is activated in read operation according to driving of the main amplifier enable signal MAE to the internal step-down voltage VDL to make the transistor N55 conduct. That is, amplification of a read signal is performed in the positive feedback loop section when read signals generated in the main input/output lines MIO0T, MIO0B are received by the transistors N53, N54. The transistor P53 is made conductive in its standby state with the main amplifier enable signal MAE is held at the ground potential VSS, so that drain electrodes of the transistors N53, N54 are short-circuited. Accordingly, since the drain electrodes of the transistors N53, N54 become the same voltage, offset voltage which is one of factors of error read operation, can be suppressed.

Figure 20:
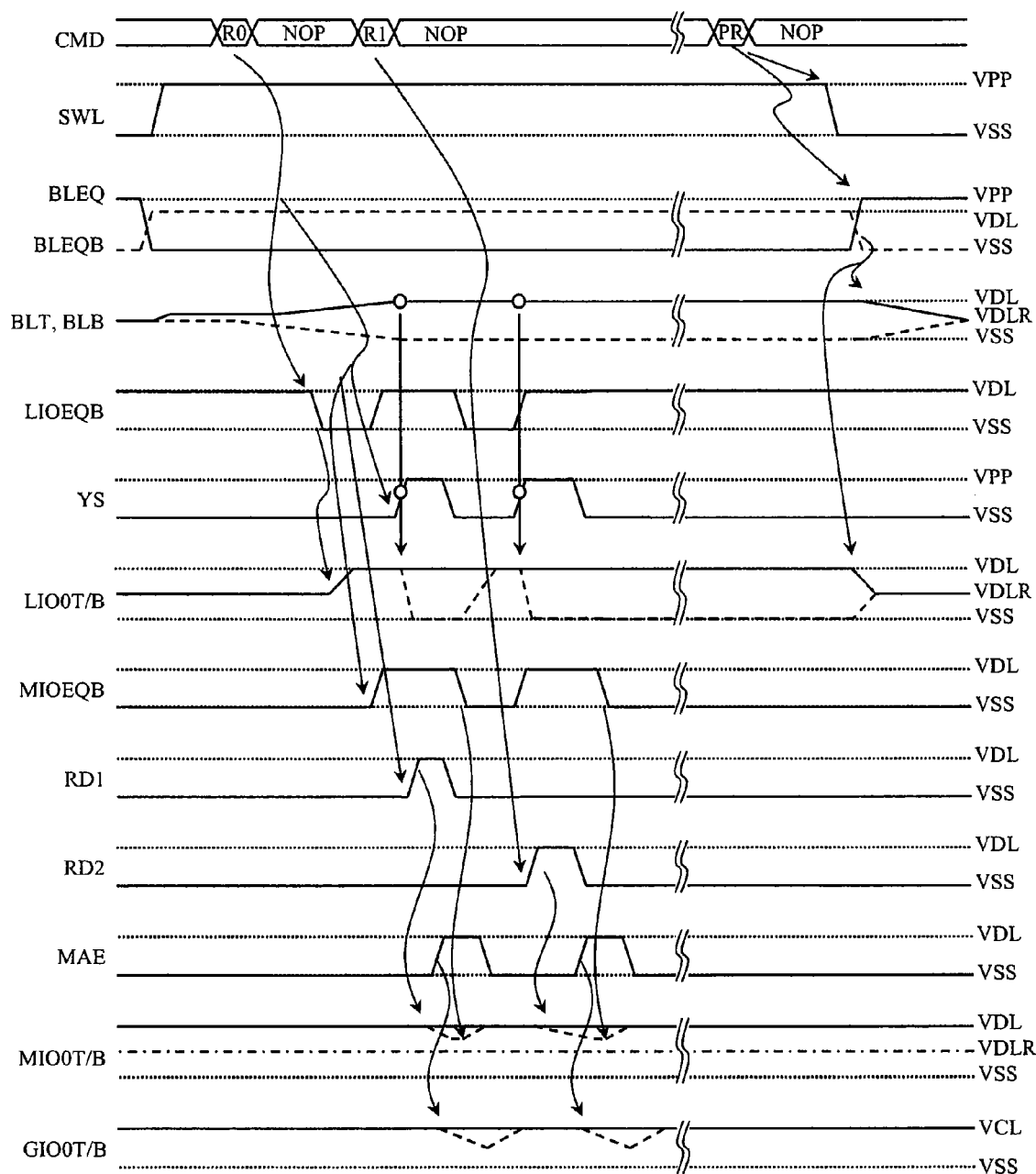
FIG. 20 is a diagram showing an example of a timing diagram in read operation of the column circuit shown in FIG. 19.

FIG. 20 shows a timing diagram of read operation in a column circuit using the gate input-type sense latch circuit GIL shown in FIG. 19. As understood from FIG. 20, since a timing margin for driving the transmission gate enable signal TGB is made unnecessary according to removal of the main input/output line transmission gate MIOTG from the main amplifier, a time for activating the main amplifier enable signal MAE can be set ahead. That is, since an operation time of the column circuit can be shortened by using the main amplifier MAMP0A according to the third embodiment, a DDR SDRAM with high speed and lower power consumption where an operation margin of the row circuit is expanded can be realized according to combination with the driving ability variable-type sub-amplifier shown in the first and second embodiments.

Fourth Embodiment

Figure 21:
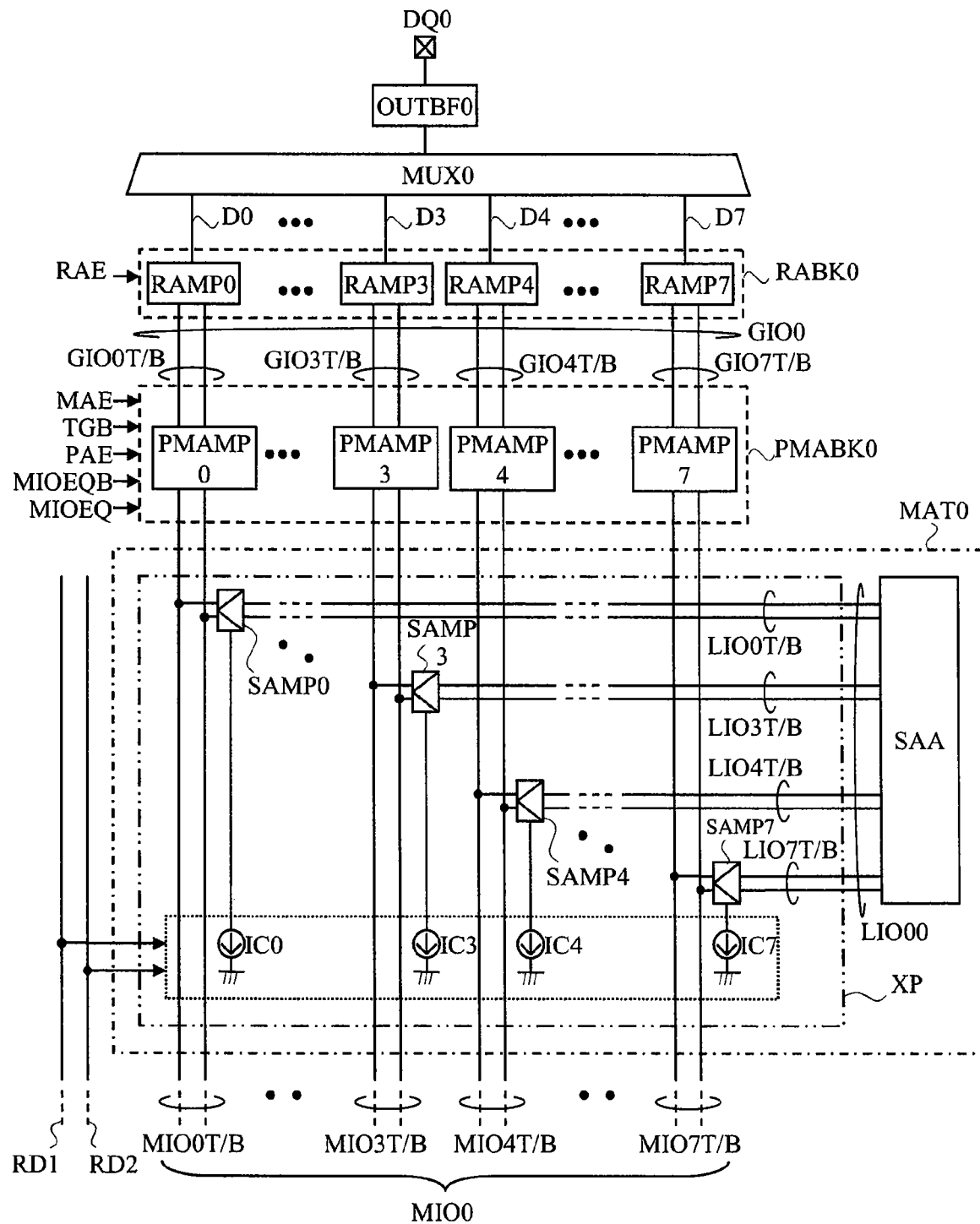
FIG. 21 is a main section block diagram showing a configuration example of a column circuit different from that shown in FIG. 9 in a semiconductor device of a fourth embodiment according to the present invention.

In a fourth embodiment, an example of still another configuration and operation of a main amplifier used in a DDR SDRAM will be described. FIG. 21 is a main section block diagram showing a configuration example of a column circuit different from that shown in FIG. 9 in a semiconductor device of the fourth embodiment of the present invention. In FIG. 21, only MAT0 is shown as the memory mat like the case shown in FIG. 9 for simplification. A feature of the circuit block configuration lies in that the multiple main amplifiers MABK0 are replaced with multiple main amplifiers PMABK0 composed of eight new amplifiers PMAMP0 to PMAMP7, which is different from the configuration shown in FIG. 9. Another feature of the circuit block configuration in this embodiment lies in that a preamplifier enable signal PAE and a main input/output line equalize signal MIOEQ are newly added as the command signals for the multiple main amplifiers PMABK0 in addition to the main amplifier enable signal MAE, the transmission gate enable signal TGB, and the main input/output line equalize signal MIOEQB. The configuration described in the first and second embodiments can be applied to the detailed circuit configuration of the cross-point area circuit XP, but the configuration shown in the first embodiment is assumed in the following description.

Figure 22:
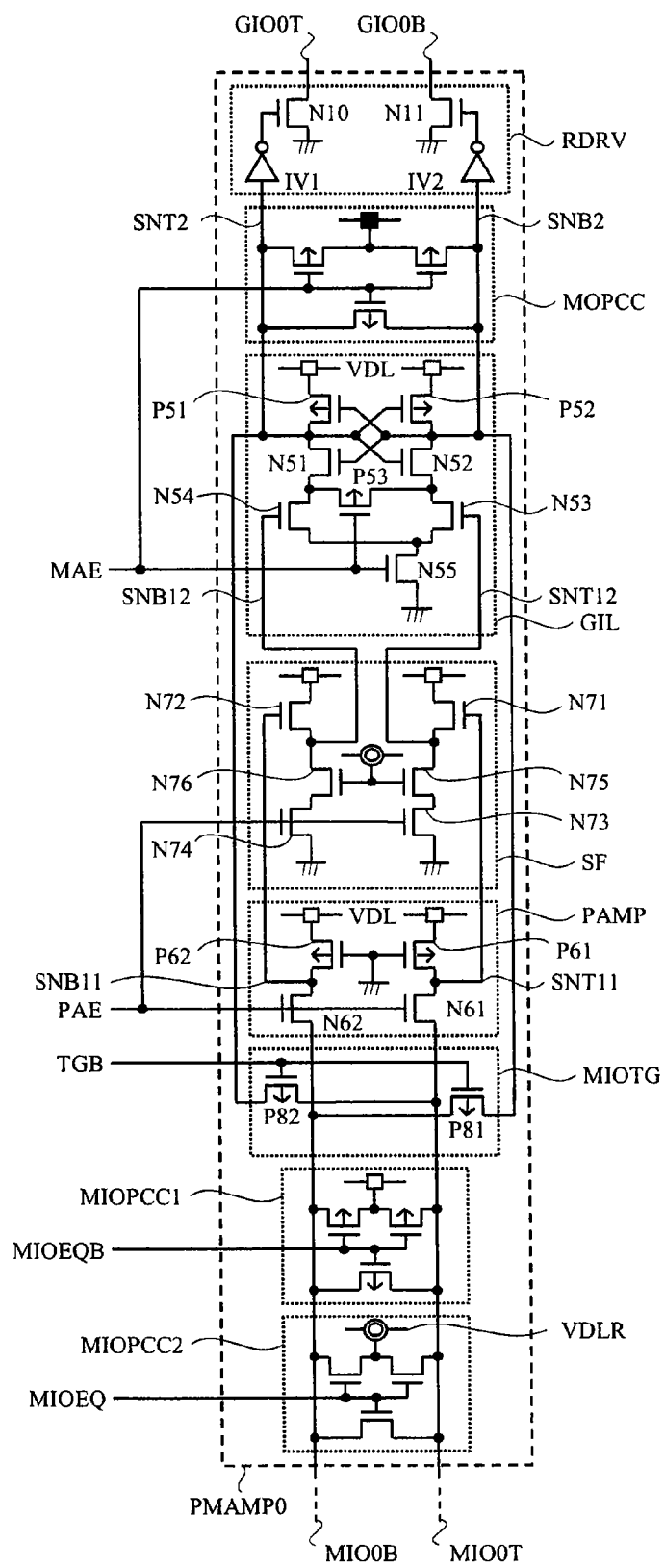
FIG. 22 is a circuit diagram showing an example of a detailed configuration of the column circuit shown in FIG. 21.

FIG. 22 shows a detailed circuit configuration as one example of the main amplifier PMAMP0 shown in FIG. 21. Configuration features of the main amplifier include the following four points. The first feature lies in that a gate ground-type preamplifier PAMP is inserted between the main input/output line MIO0T, MIO0B and the gate input-type sense latch GIL. The second feature lines in that a source follower circuit SF is further inserted between the gate input-type sense latch GIL (a first amplifier) and the gate ground-type preamplifier PAMP. The third feature lies in that a main input/output line transmission gate MIOTG is inserted between the main input/output lines MIO0T, MIO0B and the latch circuit portion in the gate input-type sense latch GIL. The fourth feature lies in that a new main input/output line precharge circuit MIOPCC2 is disposed in parallel to the main input/output line precharge circuit MIOPCC1.

The gate ground-type preamplifier PAMP is formed of two PMOS transistors P61, P62 and two NMOS transistors N61, N62. The transistors P61, P62 constitute a load circuit where source electrodes of the transistors P61, P62 are inputted with the internal step-down voltage VDL, respectively, and gate electrodes thereof are grounded. The transistors N61, N62 constitute a transmission gate where they are inserted between the load circuit configured of the transistors P61, P62 and the main input/output lines MIO0T, MIO0B, respectively, and gate electrodes thereof are connected with the preamplifier enable signal PAE. The load circuit and the main input/output line MIO0T, MIO0B are connected when the preamplifier enable signal PAE is driven to the internal step-down voltage VDL to make the transistors N61, N62 conductive so that a potential difference between drain electrodes of the transistors P61, P62 (first sense nodes denoted as SNT11, SNB11 in FIG. 22) occurs. The potential difference is larger than a potential difference occurring between the main input/output lines MIO0T, MIO0B. Since an input capacity is reduced, a voltage signal inputted to the gate input-type sense latch GIL increases. Accordingly, improvement of the operation margin and reduction of the time required for amplification operation of the gate input-type sense latch GIL can be achieved.

The source follower circuit SF is formed of six NMOS transistors N71 to N76. The internal step-down voltage VDL is inputted to drain electrodes of the transistors N71, N72, respectively, and gate electrodes thereof are connected to the first sense nodes SNT11, SNB11 in the above-described gate ground-type preamplifier PAMP and source electrodes (second sense nodes denoted as SNT12, SNB12 in FIG. 22) thereof are connected to the transistors N53, N54 constituting a differential pair in the gate input-type sense latch GIL. Also, gate electrodes of the transistors N73, N74 are connected with the preamplifier enable signal PAE, and source electrodes thereof are grounded, respectively. Further, the reference voltage VDLR is inputted to gate electrodes of the transistors N75, N76, and the transistors N75, N76 are inserted between the transistors N71, N72 and N73, N74.

With such a configuration, it is made possible to suppress coupling noises generated at the input pins (here, the first sense nodes SNT11, SNB11) from the transistors N53, N54 constituting the differential pair at an activation time of the gate input-type sense latch circuit GIL. By designing a gate size of the transistor in the source follower circuit SF such that the gain of the gate input-type sense latch circuit GIL becomes large, the amplification operation time of the gate input-type sense latch circuit GIL can be shortened.

The main input/output line transmission gate MIOTG is formed of two PMOS transistors P81, P82 connected between the main input/output lines MIO0T, MIO0B and the output pins (the third sense nodes denoted as SNB2, SNT2 in FIG. 22) of the latch circuit section of the gate input-type sense latch circuit GIL, respectively. Gate electrodes of both of the transistors are connected with the transmission gate enable signal TGB, respectively.

The main input/output line precharge circuit MIOPCC2 is formed of three NMOS transistors. The main input/output lines MIO0T, MIO0B are driven to the reference voltage VDLR according to activation of the main input/output line equalize signal MIOEQ connected to gate electrodes of the transistors.

Figure 23:
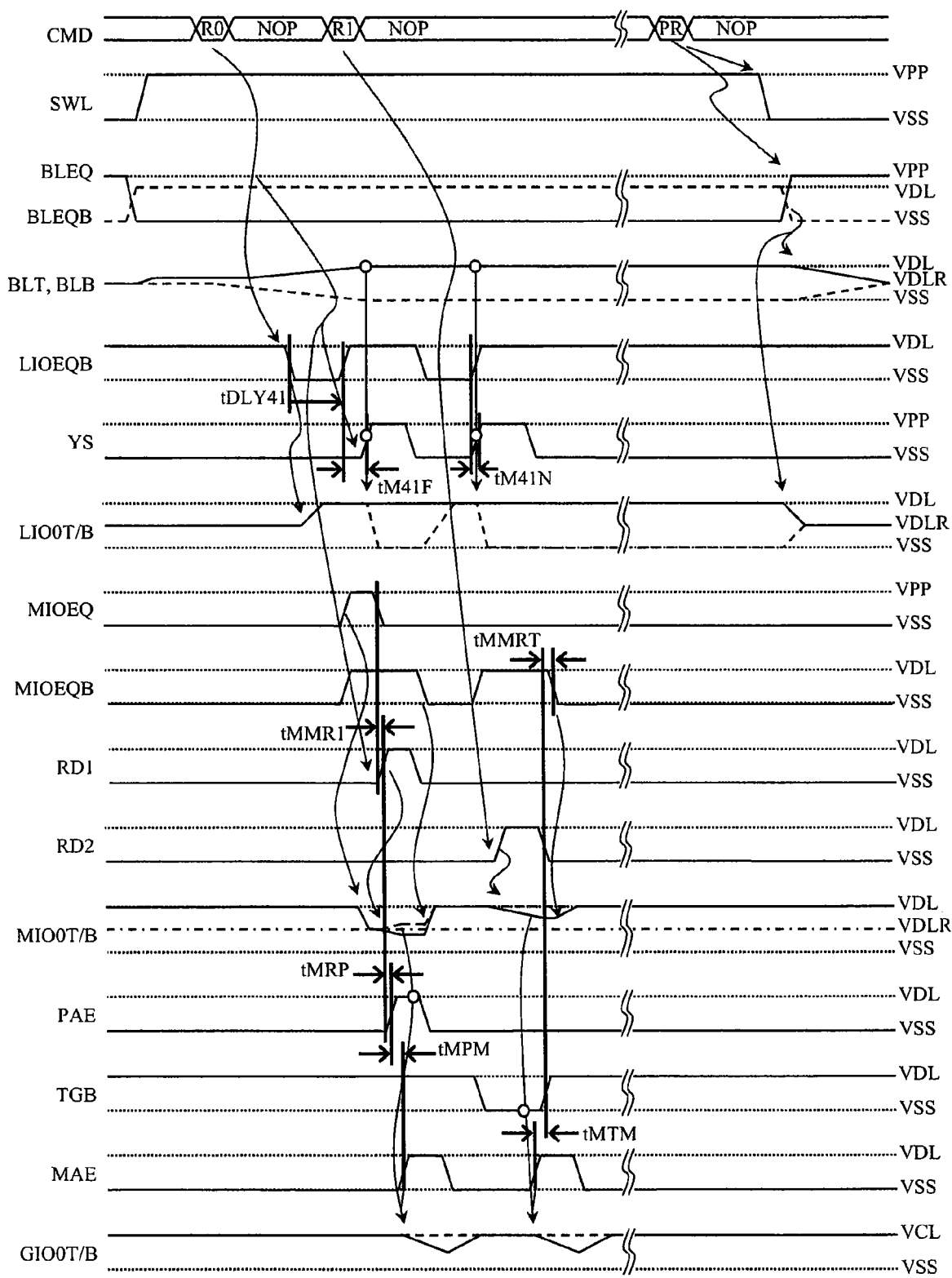
FIG. 23 is a diagram showing an example of a timing diagram in read operation of the column circuit shown in FIG. 22.

FIG. 23 shows an example of a timing diagram in read operation of the data path shown in FIG. 22. There are the following three features in read operation of the data path in comparison with the timing diagram shown in FIG. 11. The first feature lies in that the main input/output lines MIO0T, MIO0B are precharged to the reference voltage VDLR to activate the read enable signal RD1 and read stored data from the local input/output lines LIO0T, LIO0B to the main input/output lines MIO0T, MIO0B in the first cycle of burst read operation just after page open by driving the main input/output line equalize signal MIOEQ to the boosted DC voltage VPP to activate the main input/output line precharge circuit MIOPCC2. Here, the precharge operation is performed in a short time from non-activation state of the main input/output line equalize signal MIOEQB to activation of the read enable signal RD1 by a timing controller described later.

The second feature lies in that, as the first feature, in the first cycle of burst read operation just after page open, signals generated in the main input/output lines MIO0T, MIO0B are inputted into the gate input-type sense latch circuit GIL via the gate ground-type preamplifier PAMP and the source follower circuit SF for amplification by activating the preamplifier enable signal PAE. The third feature lies in that signals generated in the main input/output lines MIO0T, MIO0B in a state that the gate ground-type preamplifier PAMP is stopped and in a state that precharge to the internal step-down voltage VDL has been performed by the main input/output line precharge circuit MIOPCC1 are inputted to a latch circuit portion in the gate input-type sense latch circuit GIL via the main input/output line transmission gate MIOTG and amplified in the second cycle of burst read operation and operations subsequent thereto.

Figure 24:
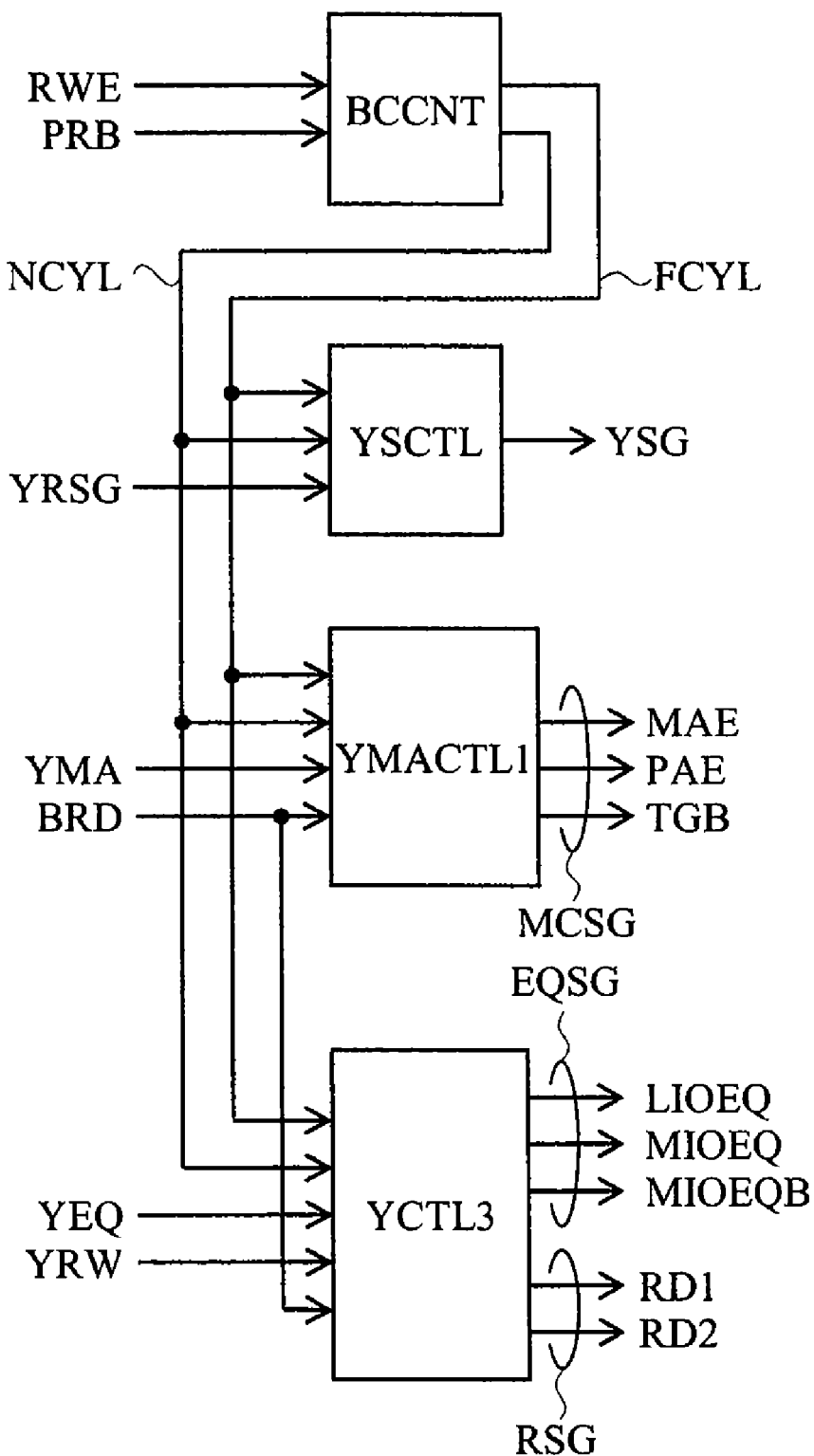
FIG. 24 is a diagram showing another example of the main section block configuration of the timing controller shown in FIG. 1.

Next, a timing controller for realizing the circuit configurations and operations described above will be described. FIG. 24 shows still another example of the main section block configuration of the timing controller shown in FIG. 1. A feature of the circuit configuration lies in that the column read signal controller YCTL1 in the configuration shown in FIG. 12 is replaced with a column read signal controller YCTL3, and the column read signal controller YCTL3 newly receives a column equalize enable signal YEQ to output the read enable signals RD1, RD2 included in the multiple read enable signals RSG, and a local input/output line equalize signal LIOEQ, main input/output line equalize signals MIOEQ, MIOEQB included in the multiple equalize signals EQSG, respectively. FIG. 24 also shows the main amplifier controller YMACTL1 omitted in FIG. 12. A feature of the main amplifier controller YMACTL1 lies in that it receives the burst cycle flag signals FCYL, NCYL, the column main amplifier enable signal YMA, and the read signal BRD to output the main amplifier enable signal MAE included in the multiple main amplifier command signals MCSG, the preamplifier enable signal PAE, and the transmission gate enable signal TGB, respectively.

Figure 25:
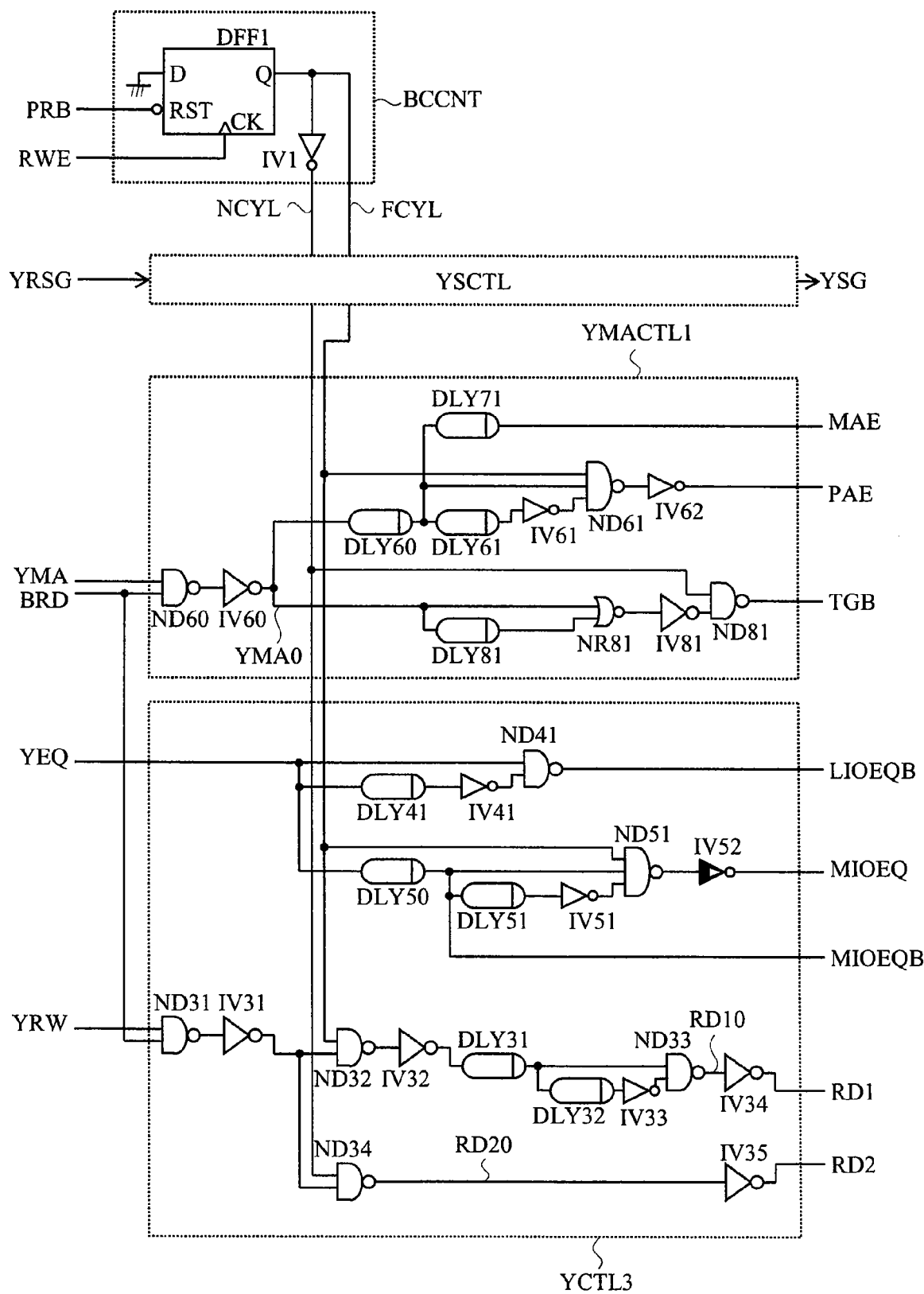
FIG. 25 is a diagram showing an example of a detailed configuration of the main section block shown in FIG. 24.
Figure 26:
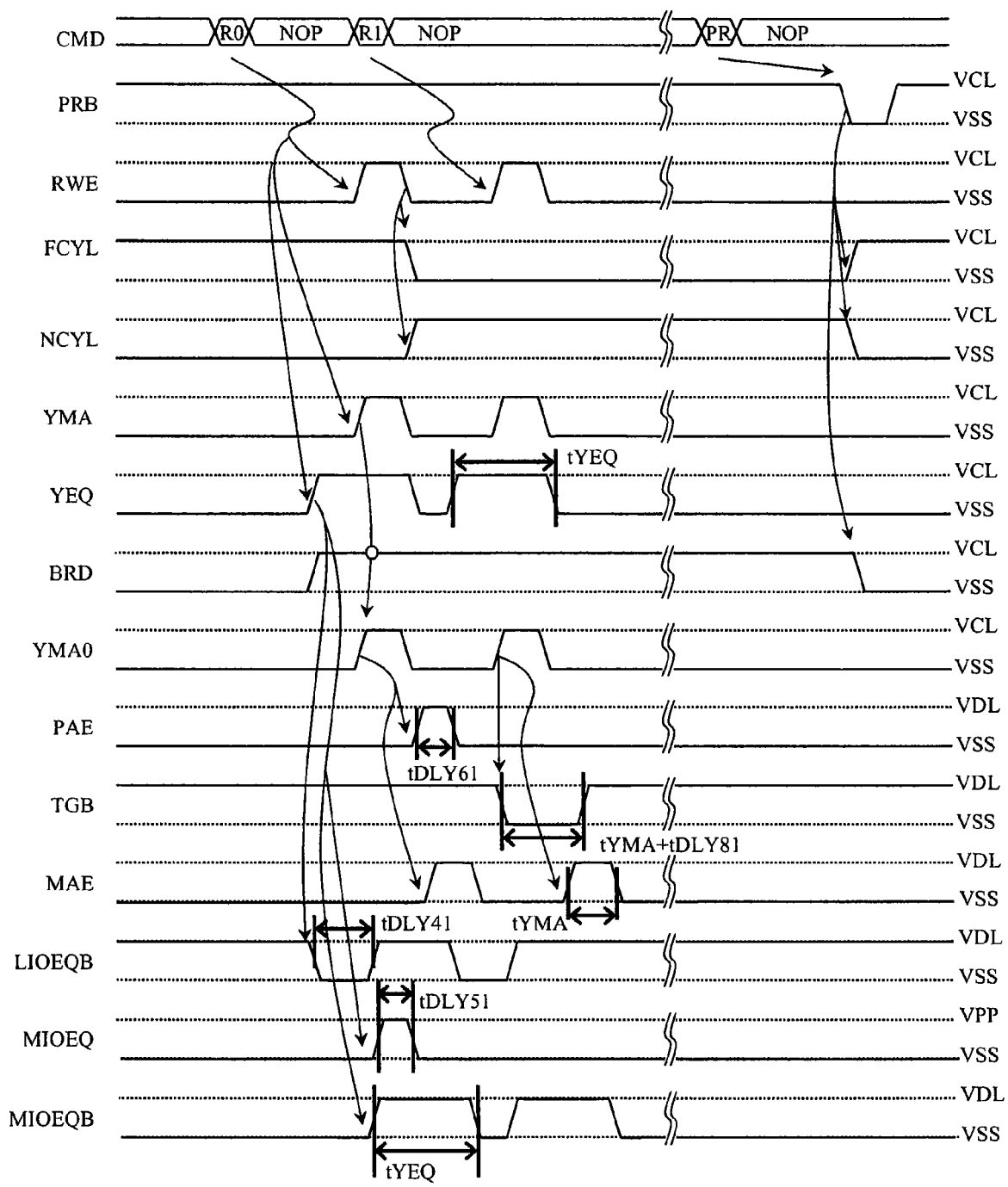
FIG. 26 is a diagram showing an example of a timing chart of a timing controller shown in FIG. 25.

FIG. 25 shows an example of a detailed circuit configuration of the timing controller TMCTL shown in FIG. 24. FIG. 26 shows an example of a timing chart of the timing controller TMCTL shown in FIG. 25. The column read signal controller YCTL3 is composed of three inverter circuits IV41, IV51, IV52, two NAND circuits ND41, ND51, and three delay circuits DLY41, DLY50, DLY51 in addition to the circuit configuration of the column read signal controller YCTL1 shown in FIG. 13. The local input/output line equalize signal LIOEQB is a signal produced by shortening the pulse width tYEQ of the column equalize signal YEQ to a value approximately equal to the delay time tDLY41 of the delay circuit DLY41 using the NAND circuit ND41, the inverter circuit IV41, and the delay circuit DLY41. The main input/output line equalize signal MIOEQB is a signal produced by delaying the column equalize signal YEQ in the delay circuit DLY50. The main input/output line equalize signal MIOEQ is a signal produced by delaying the column equalize signal YEQ in the delay circuit DLY50 and subsequently shortening the pulse width of the delayed column equalize signal YEQ to a pulse width approximately equal to the delay time tDLY51 of the delay circuit DLY51 using the NAND circuit ND51, the inverter circuits IV51, IV52, and the delay circuit DLY51. Here, the NAND circuit ND51 has three input pins, and one of the input pins is connected with the burst cycle flag signal FCYL. The inverter circuit IV52 has a level shifting function for raising a voltage level of an output signal to the internal boosted DC voltage VPP. With such a configuration, a pulse signal is produced in the main input/output line equalize signal MIOEQ only in the first cycle of burst read operation just after page open.

In the above-described configuration, stable circuit operation where a timing margin has been expanded can be realized by designing delay times of the delay circuits DLY41, DLY50, DLY51 appropriately. That is, as shown in FIG. 23, the local input/output line equalize signal LIOEQB can have expanded timing margins tM41F, tM41N between the same and the column select signal YS by the delay circuit DLY41. The main input/output line equalize signal MIOEQ can have expanded timing margin tMMR1 between the same and the read enable signal RD1 by the delay circuits DLY50, DLY51. It is assumed that the pulse width tYEQ of the column equalize signal YEQ is designed such that a timing margin tMMRT of the main input/output line equalize signal MIOEQB can be expanded between the same and the read enable signal RD2 and the transmission gate enable signal TGB.

The main amplifier controller YMACTL1 is composed of four inverter circuits IV60, IV61, IV62, IV81, three NAND circuits ND60, ND61, ND81, one NOR circuit NR81, and four delay circuits DLY60, DLY61, DLY71, DLY81. A result obtained by performing AND operation of the column main amplifier enable signal YMA and the read signal BRD using the NAND circuit ND60 and the inverter circuit IV60 is first set as an internal column main amplifier enable signal YMA0. The main amplifier enable signal MAE is a signal generated by delaying the internal column main amplifier enable signal YMA0 in the delay circuits DLY60, DLY71. The preamplifier enable signal PAE is a signal generated by delaying the internal column main amplifier enable signal YMA0 in the delay circuit DLY60 and then shorten the pulse width tYMA of the column main amplifier enable signal YMA to a pulse width approximately equal to the delay time tDLY61 of the delay circuit DLY61 using the delay circuit DLY61, the inverter circuit IV61, and the NAND circuit ND61 and further inverting the internal column main amplifier enable signal YMA0 with the shortened pulse width in the inverter circuit IV62. Here, the NAND circuit ND61 has three input pins, and one of the pins is connected with the burst cycle flag signal FCYL. Accordingly, a pulse signal is generated as the preamplifier enable signal PAE only in a burst read cycle just after page open.

The transmission gate enable signal TGB is a signal obtained by connecting the internal column main amplifier enable signal YMA0 to the NOR circuit NR81 directly or via the delay circuit DLY81 to expand the pulse width tYMA of the column main amplifier enable signal YMA by about delay time tDLY81 of the delay circuit DLY81. By inputting a signal obtained by inverting the output signal of the NOR circuit NR81 in the inverter circuit IV81 and the burst cycle flag signal NCYL into the NAND circuit ND81, a pulse signal is produced in the second cycle of burst read operation and cycles subsequent thereto.

In the above-described configuration, stable circuit operation where a timing margin has been expanded can be realized by designing delay times of the delay circuits DLY60, DLY61, DLY71, DLY81 appropriately. That is, in the first cycle of burst read operation just after page open, as shown in FIG. 23, it is made possible to expand the enable timing margin tMRP between the read enable signal RD1 and the preamplifier by the delay circuit DLY60 to activate the preamplifier after reading of stored data to the main input/output line MIO0T/B. In addition, it is made possible to expand the enable timing margin tMPM between the preamplifier enable signal PAE and the main amplifier MAE by the delay circuit DLY71 to activate the gate input-type sense latch circuit GIL after amplification operation of the amplifier. In the second cycle of burst read operation and cycles subsequent thereto, it is made possible to expand an activation time of the transmission gate enable signal TGB required for generating a signal voltage of several hundreds mV or more in the main input/output line MIO0T/B in the delay circuit DLY81 to activate the main amplifier enable signal MAE after signal voltage of several hundreds mV or more is generated in the third sense nodes SNT2, SNB2 and also expand the enable timing margins tMMRT and tMTM between the transmission gate enable signal TGB and the main input/output line equalize signal MIOEQB and the main amplifier enable signal MAE.

According to the configuration and operation of the data path described above, an operation time at the first cycle just after page open can be further shortened. That is, since the operation time of the column circuit can be shortened by using the main amplifier PMAMP according to the fourth embodiment, the operation margin of the row circuit can be expanded by combining the main amplifier PMAMP with the driving ability variable-type sub-amplifier shown in the first and second embodiments. In addition, in the second cycle of the burst read operation and cycles subsequent thereto, since DC current flowing from the preamplifier via the sub-amplifier between the internal step-down voltage VDL and the ground electrode can be blocked by stopping the preamplifier, the current consumption can be suppressed. As a result, a DDR SDRAM with high speed and low power consumption whose operation margin has been further expanded can be realized.

Fifth Embodiment

Figure 27:
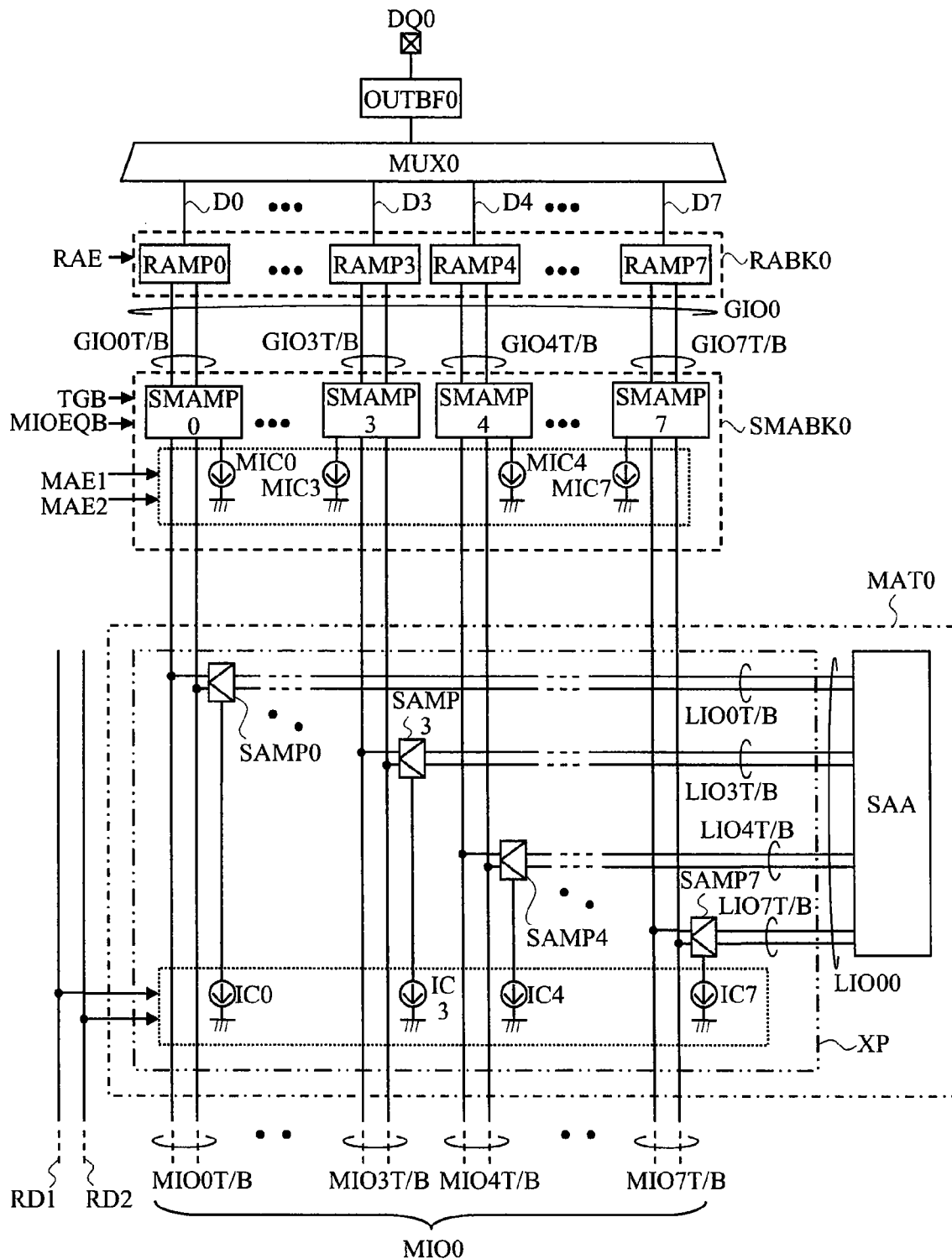
FIG. 27 is a main section block diagram showing a configuration example of a column circuit different from that shown in FIG. 9 and others in a semiconductor device of a fifth embodiment of the present invention.

In a fifth embodiment, still another example of the configuration and operation of the main amplifier used in the DDR SDRAM will be described. FIG. 27 is a main section block diagram showing a configuration example of a column circuit different from those shown in FIG. 9 and others in a semiconductor device of the fifth embodiment according to the present invention. In FIG. 27, only MAT0 is shown as the memory mat like the cases shown in FIG. 9 and others for simplification. The circuit block configuration has three features in comparison with the configuration shown in FIG. 9. The first feature lies in that the multiple main amplifiers MABK0 shown in FIG. 9 are replaced with multiple main amplifiers SMABK0 composed of eight new main amplifiers SMAMP0 to SMAMP7. The second feature lies in that the main amplifiers SMAMP0 to SMAMP7 are connected with current control circuits MIC0 to MIC7, respectively. The third feature lies in that main amplifier signals MAE1, MAE2 are connected as common command signals to the current control circuits MIC0 to MIC7.

Figure 28:
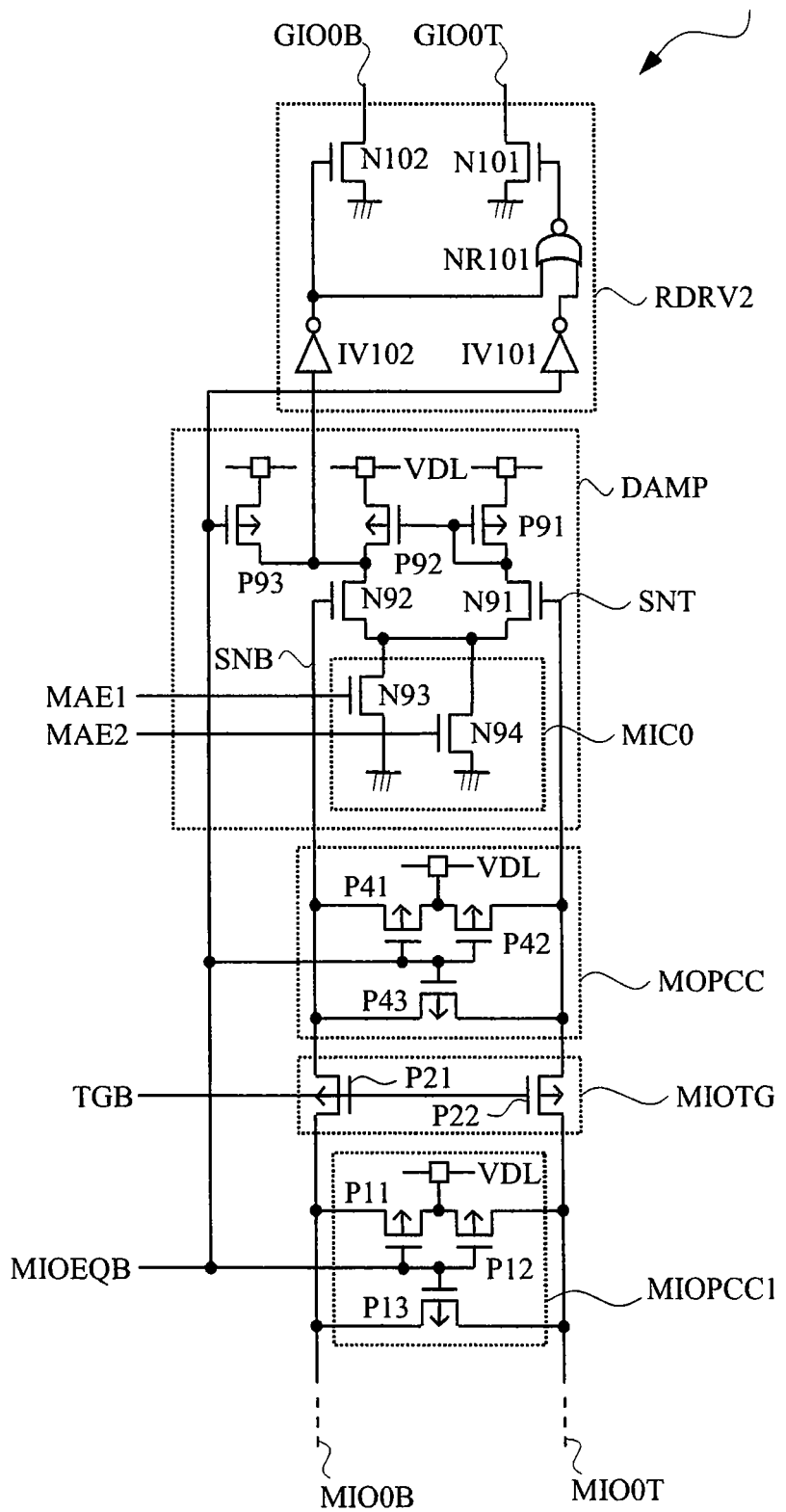
FIG. 28 is a circuit diagram showing a detailed configuration example of the column circuit shown in FIG. 27.

FIG. 28 shows a detailed circuit configuration example of the main amplifier SMAMP0 shown in FIG. 27 as one example. Here, the current control circuit MIC0 is also shown together with the main amplifier SMAMP0 to simplify description. The main amplifier has the following two configuration features. The first feature lies in that the static-type differential amplification circuit DAMP is connected to the sense nodes SNT, SNB. The second feature lies in that the current control circuit MIC0 is connected to the static-type differential amplification circuit DAMP.

The static-type differential amplification circuit DAMP is composed of two PMOS transistors P91, P92 and two NMOS transistors N91, N92 constituting the differential amplification circuit and a PMOS transistor P93 that precharges an output node of the differential amplification circuit to the internal step-down voltage VDL in a standby time. Source electrodes of the NMOS transistors N91, N92 of these transistors are connected to the current control circuit MIC0.

The current control circuit MIC0 is composed of two NMOS transistors N93, N94. A gate electrode of the transistor N93 and a gate electrode of the transistor N94 are connected with the main amplifier enable signal MAE1 and the main amplifier enable signal MAE2, respectively. As described about the current control circuit IC0 shown in FIG. 10, for example, a gate width of the transistor N93 is designed to be wider than that of the transistor N94, so that driving ability of the static-type differential amplification circuit DAMP is controlled by selectively activating the two transistors. That is, when the transistor N93 is activated, large current is applied to the differential amplification circuit, so that the operation time of the differential amplification circuit DAMP can be shortened.

A read driving circuit RDRV2 is a circuit that receives an output of the differential amplification circuit DAMP to drive the global input/output lines GIO0T, GIO0B. The read driving circuit RDRV2 is composed of two NMOS transistors N101, N102, two inverter circuits IV101, IV102, and one NOR circuit NR101. One input pin of the NOR circuit NR101 is connected with a signal obtained by inverting the main input/output line equalize signal MIOEQB in the inverter circuit IV101, and, at a standby time, the NOR circuit NR101 holds the transistor N101 in high impedance state by changing the output signal of the NOR circuit NR101 to high level.

Figure 29:
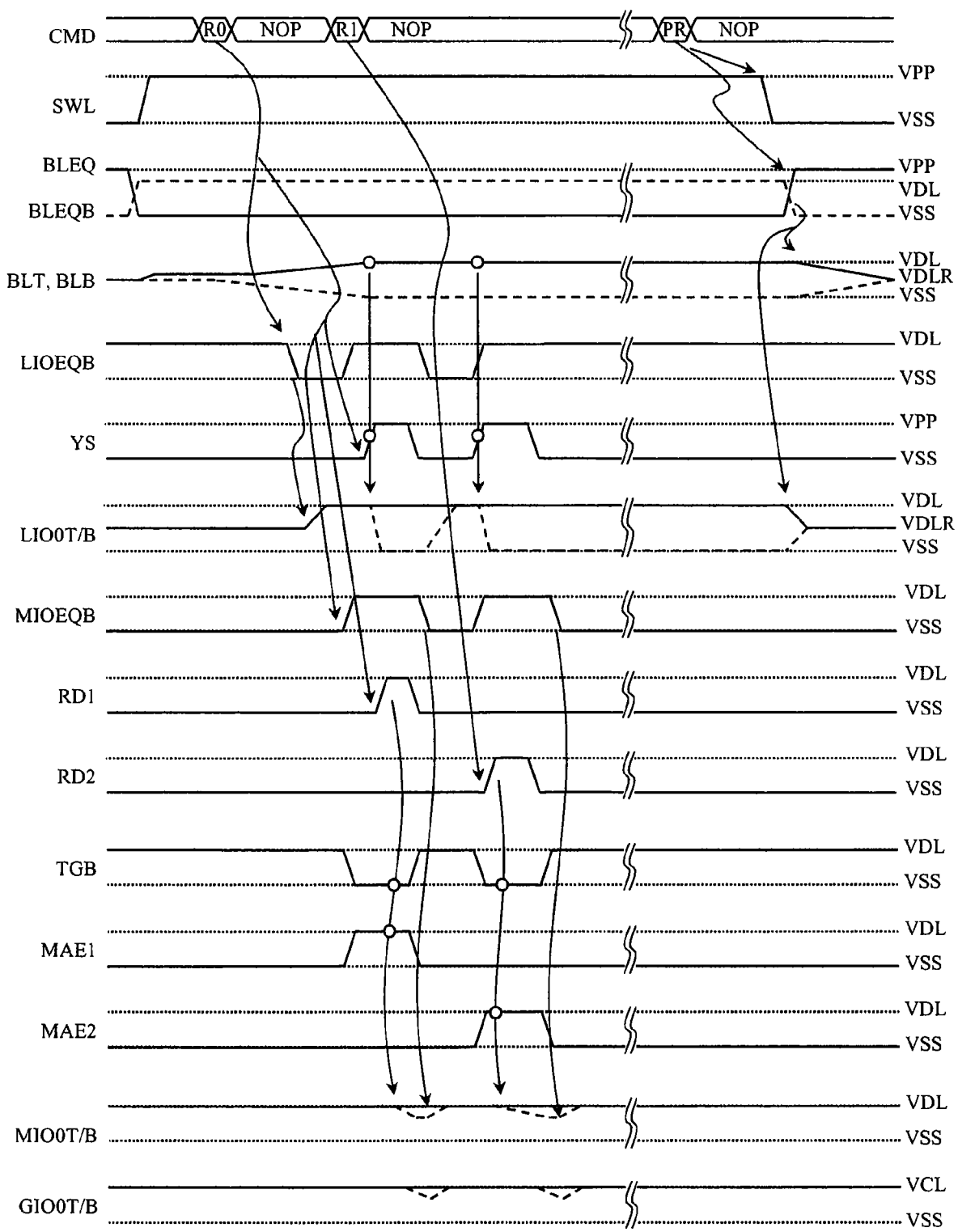
FIG. 29 is a diagram showing an example of a timing diagram in read operation of the column circuit shown in FIG. 28.

FIG. 29 shows an example of a timing diagram in read operation of the data path shown in FIG. 28. Here, a configuration of the cross-point area circuit XP can be applied with the configuration described in the first and second embodiments, but in the following description it is assumed that the configuration in the first embodiment is used. A feature of the read operation lies in that the main amplifier enable signal MAE1 is activated in the first cycle of burst read operation just after page open. Another feature of the read operation lies in that the main amplifier enable signal MAE2 is activated in the second cycle of burst read operation and cycles subsequent thereto. Here, it is assumed that pulse signals of the main amplifier enable signals MAE1, MAE2 are the same as a pulse signal obtained by inverting the transmission gate enable signal TGB.

Since the static-type differential amplification circuit DAMP does not require a timing margin for securing a signal amount, it is optimal for shortening the operation time of the column circuit. In the embodiment, since the transistor N93 with high driving ability is activated by the main amplifier enable signal MAE1 in the first cycle of burst read operation, the operation time of the static-type differential amplification circuit DAMP can be further shortened. Accordingly, speed-up of the column circuit operation and further expansion of the operation margin in the row circuit can be made possible. On the other hand, since the transistor N94 with low driving ability is activated by the main amplifier enable signal MAE2 in the second cycle and cycles subsequent thereto in the burst read operation, DC current flowing in the static-type differential amplification circuit DAMP can be suppressed. Accordingly, low power consumption in the column circuit can be realized.

Figure 30:
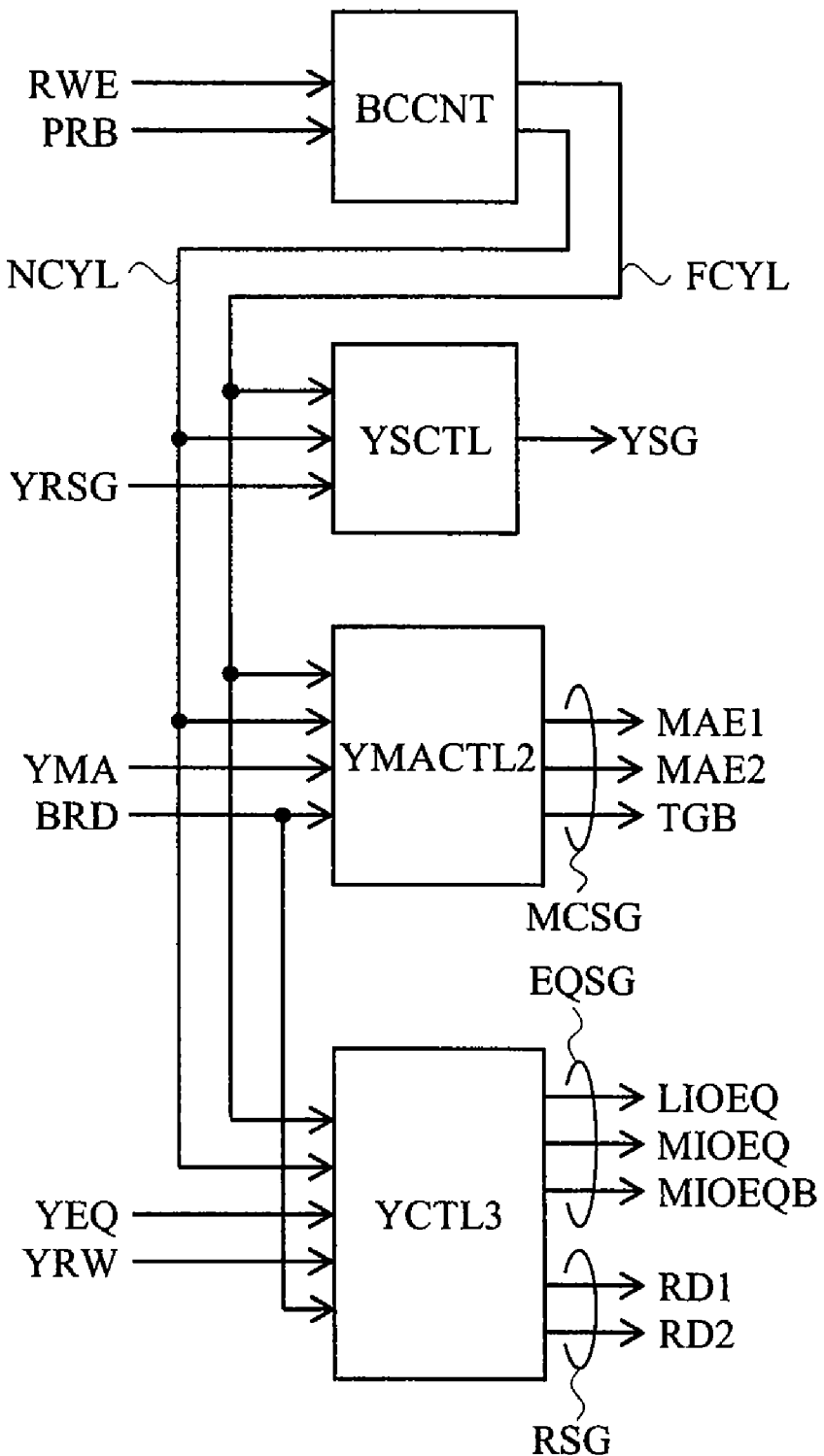
FIG. 30 is a diagram showing another example of a main section block configuration of the timing controller shown in FIG. 1.

Next, the timing control circuit for realizing the circuit configuration and operation described above will be described. FIG. 30 shows still another example of the main section block configuration of the timing controller TMCTL shown in FIG. 1. A feature of the circuit configuration lies in that the main amplifier controller YMACTL1 in the configuration shown in FIG. 24 is replaced with a main amplifier controller YMACTL2 and the main amplifier controller YMACTL2 outputs the main amplifier enable signals MAE1, MAE2, and the transmission gate enable signal TGB.

Figure 31:
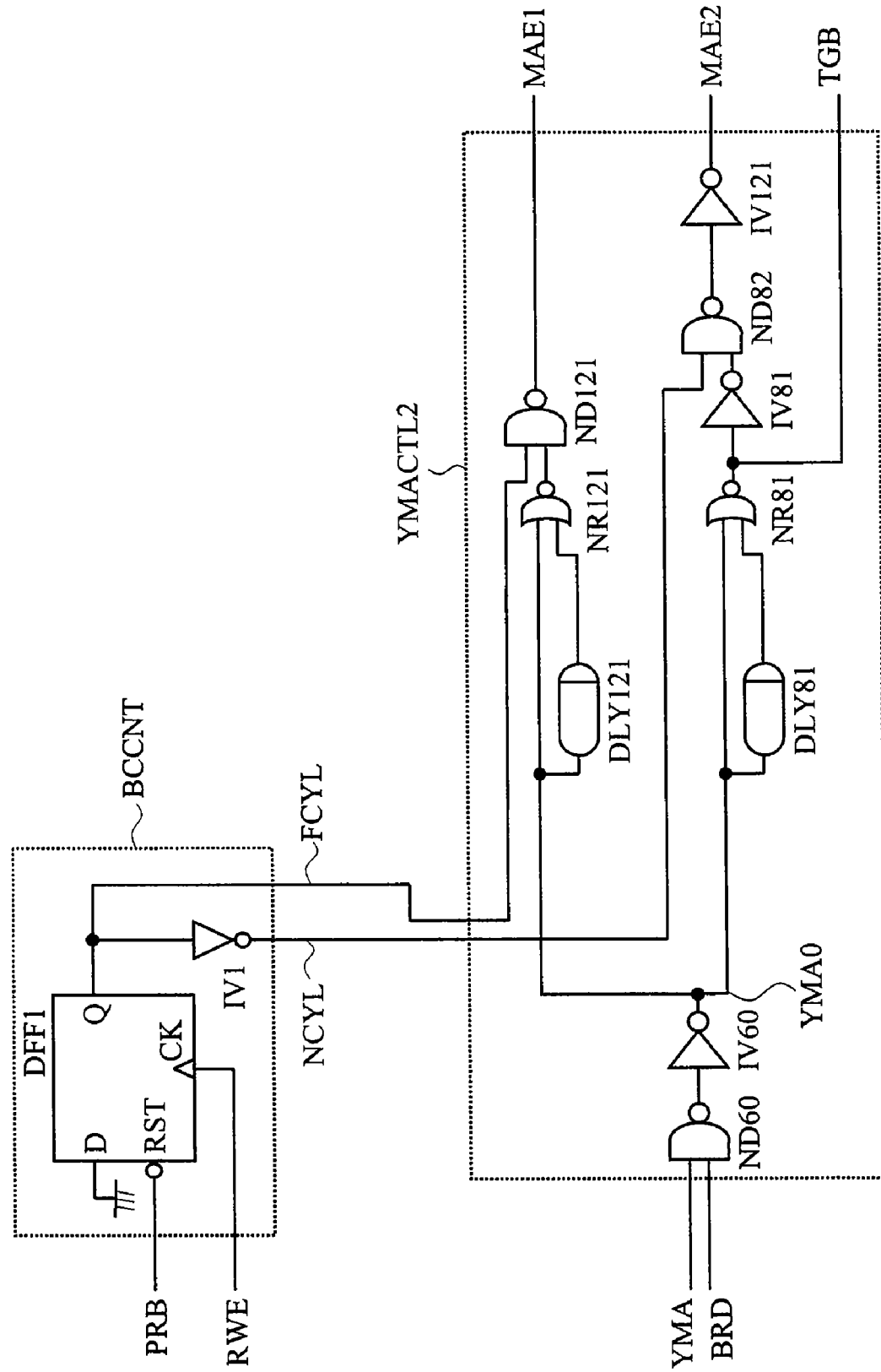
FIG. 31 is a diagram showing an example of a detailed configuration of a main section block shown in FIG. 30.

FIG. 31 shows an example of a detailed circuit configuration of the timing controller TMCTL shown in FIG. 30. Here, only a new main amplifier controller YMACTL2 is shown for simplification. The main amplifier controller YMACTL2 is configured based on a circuit for generation of a transmission gate enable signal TGB in the main amplifier controller YMACTL1 shown in FIG. 25. The transmission gate enable signal TGB is generated from an output pin of the NOR circuit NR81. The main amplifier enable signal MAE2 is a signal obtained by inverting an output signal of the NAND circuit ND82 in a new inverter circuit IV121. The main amplifier enable signal MAE1 is composed of a delay circuit DLY121, a NOR circuit NR121, and an NAND circuit ND121 corresponding to the delay circuit DLY81, the NOR circuit NR81, and the inverter circuit IV81 included in the path for generating the main amplifier enable signal MAE2. One input pin of the NAND circuit ND121 is connected with the burst cycle flag signal FCYL, so that a pulse signal is generated in the main amplifier enable signal MAE1 only in the first cycle of burst read operation just after page open.

According to the above-described configuration and operation, the column circuit operation time of the first cycle just after page open can be further shortened. That is, by using the main amplifier SMAMP0 according to the fifth embodiment, driving ability of the current control circuit MIC0 is raised with combination with the driving ability variable-type sub-amplifier described in the first and second embodiments so that the operation time of the column circuit can be shortened, and the operation margin of the row circuit can be further expanded. In addition, by reducing the driving ability of the current control circuit MIC0, DC current flowing in the differential amplification circuit DAMP is suppressed in the second cycle of burst read operation and cycles subsequent thereto, so that current consumption in the column circuit operation can be suppressed. As a result, a DDR SDRAM with high speed and low power consumption whose operation margin has been expanded can be realized. Note that, the configuration of the current control circuit MIC0 is not limited to the configuration shown in FIG. 28, but it may be modified variously. For example, the configurations described in the first and second embodiments can be adopted. For example, a layout area of the main amplifier can be suppressed by configuring the current control circuit MIC0 using one NMOS transistor that adjusts gate voltage according to the burst cycle like the current control circuit IC0 shown in FIG. 15.

Sixth Embodiment

Figure 32:
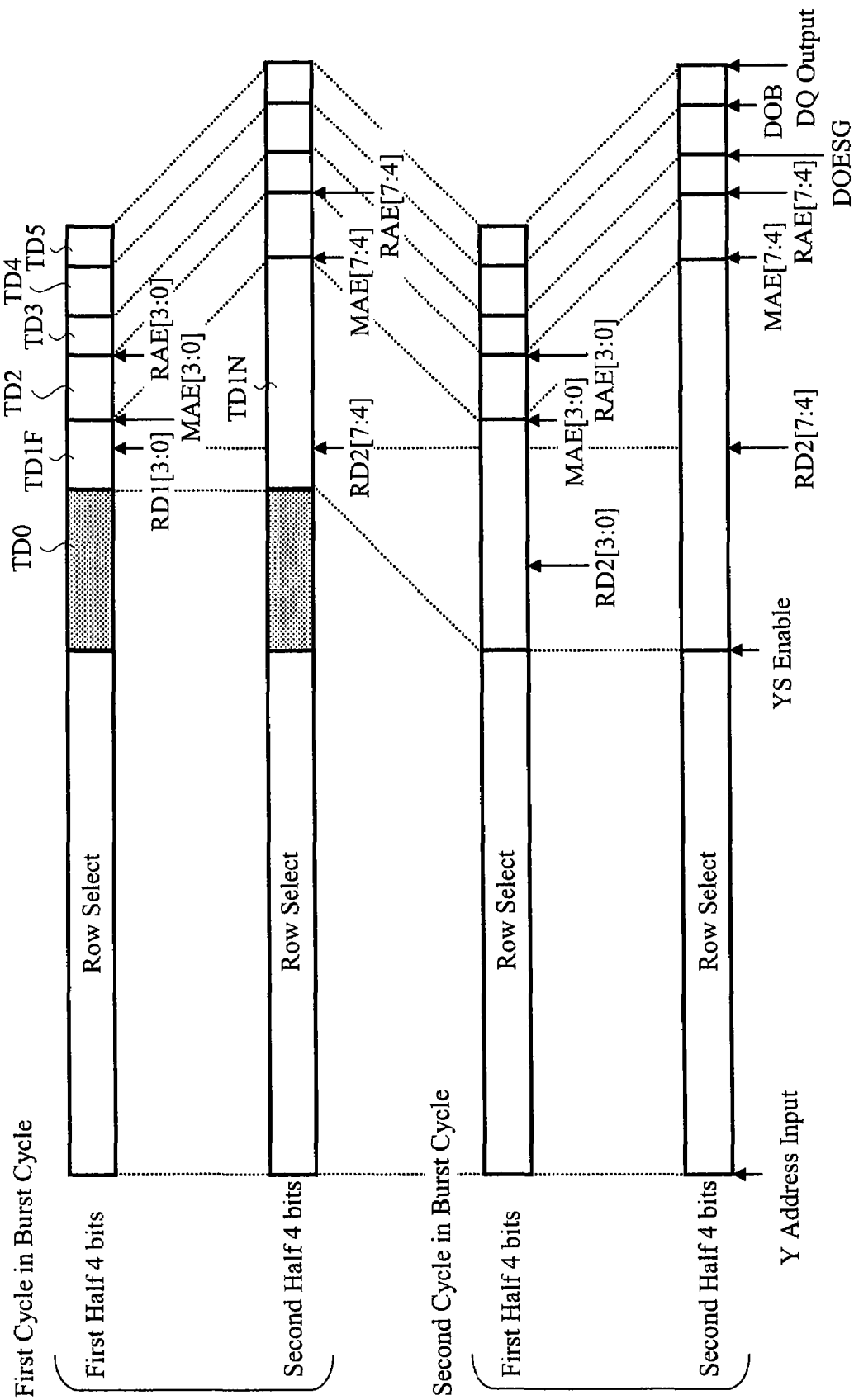
FIG. 32 is a diagram showing another example of detailed breakdown of operation time of burst read of a column circuit contained in a semiconductor device of a sixth embodiment according to the present invention.

In a sixth embodiment, an example of another method for controlling a sub-amplifier and a main amplifier used for a DDR SDRAM will be described. FIG. 32 shows an example of detailed breakdown of burst read operation time in the column circuit in a semiconductor device of the sixth embodiment of the present invention. Here, it is assumed that the sub-amplifier and the main amplifier are applied with the sub-amplifier described in the first embodiment and the main amplifier described in the fourth embodiment. In the first to fourth embodiments, all data of 2N bits to be prefetched is read from the local input/output line to the main amplifier under the same control. On the other hand, the present embodiment has the following two features.

The first feature lies in that data of N bits is read in a short time TD1F in the first cycle of burst read operation just after page open and data of the remaining N bits is read in a relatively long time TD1N equal to a time in the second cycle and cycles subsequent thereto. That is, considering the order of data read from the data pin in a time series manner, a data path (here, a path of the main input/output lines MIO3T/B to MIO0T/B) through which N bits to be output first are transferred is set to be operated with a circuit setting of high speed mode. In particular, driving ability of the sub-amplifier is set to be high in the input/output line through which the first half data of N bits in burst read is transferred in the first cycle of burst read operation and the amplification time of the main amplifier can be further shortened by using a preamplifier (high speed mode).

On the other hand, the driving ability of the sub-amplifier is suppressed in an input/output line (here, a path of the main input/output lines MIO7T/B to MIO4T/B) through which the second half data of N bits in the burst read operation are transferred, and the main amplifier is activated while the preamplifier kept stopped, so that power consumption can be suppressed (lower power mode). Circuit setting of all input/output lines is made to be low power mode in the second cycle the burst read mode and cycles subsequent thereto. Since activation of the column select signal YS can be earlier in the second cycle and cycles subsequent thereto than in the first cycle by an overtime TD0 in the row circuit operation, the timing margin can be maintained sufficiently even if the low power mode is used.

The second feature lies in that the read enable signal, the main amplifier enable signal, and the receiver amplifier enable signal are set to be a plurality of signals different for each of input/output lines, and the sub-amplifier, the main amplifier and the receiver amplifier are controlled for each of input/output lines in order to realize the above-described first feature. In order to emphasize the second feature, the read enable signals RD1[7:0], RD2[7:0], the main amplifier enable signal MAE[7:0], and the receiver amplifier enable signal RAE[7:0] are shown with bus notation in FIG. 32. The first half of N bits is driven according to the read enable signal RD1[3:0] and the second half of N bits is driven according to the read enable signal RD2[7:4] in the first cycle. Occurrence timings of RD1 and RD2 at this time are set to be approximately the same. However, since the driving ability of the sub-amplifier for the second half of N bits is set to be low by RD2, a timing of the main amplifier enable signal MAE[7:4] or the receiver amplifier enable signal RAE[7:4] is delayed as compared with the first half of N bits.

On the other hand, both of the first half data of N bits and the second half of N bits are driven by the read enable signal RD2 in the second cycle. Regarding occurrence timing at this time, it is possible to delay the read enable signal RD2[7:4] corresponding to the second half data of N bits as compared with the read enable signal RD2[3:0] corresponding to the first half of N bits. In addition, the second half of N bits of the main amplifier enable signal or the receiver amplifier enable signal can be delayed to be later than those of the first half of N bits correspondingly. By having changing various enable timings between the first half and the second half in this manner, a peak value of noise can be reduced.

Figure 33:
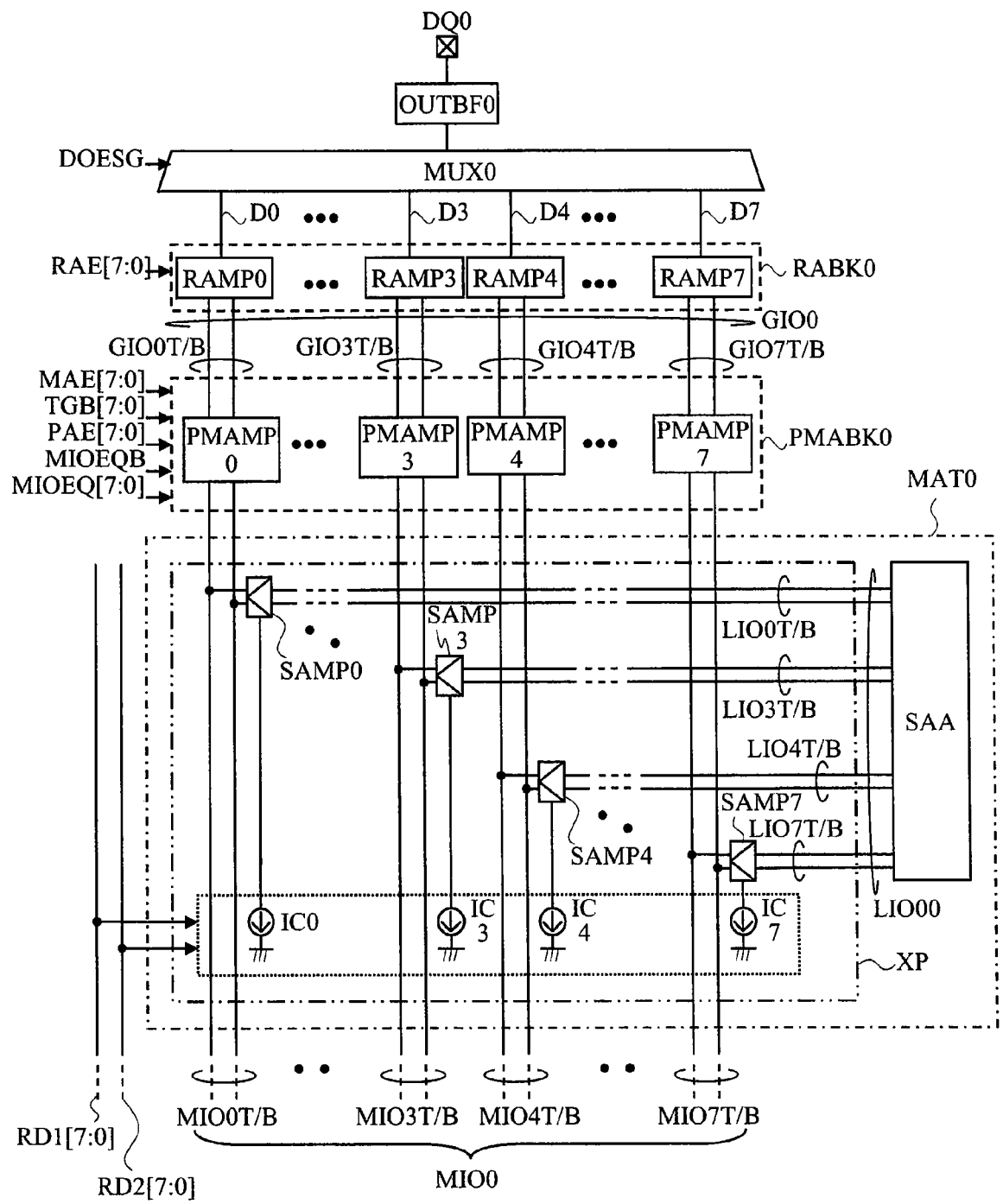
FIG. 33 is a main section block diagram showing a configuration example obtained by modifying the column circuit shown in FIG. 21 in the semiconductor device of the sixth embodiment according to the present invention.

FIG. 33 is a main section block diagram showing a modified configuration example of the column circuit shown in FIG. 21 in the semiconductor device of the sixth embodiment of the present invention. In the configuration example shown in FIG. 33, respective command signals in the configuration example shown in FIG. 21 are separated for respective input/output lines. That is, a feature of the modified configuration example lies in that the read enable signals RD1[7:0], RD2[7:0], the main input/output line equalize signal MIOEQ[7:0], the preamplifier enable signal PAE[7:0], and the transmission gate enable signal TGB[7:0] are also different for respective input/output lines according to the main amplifier enable signal MAE[7:0] or the receiver amplifier enable signal RAE[7:0].

Figure 34:
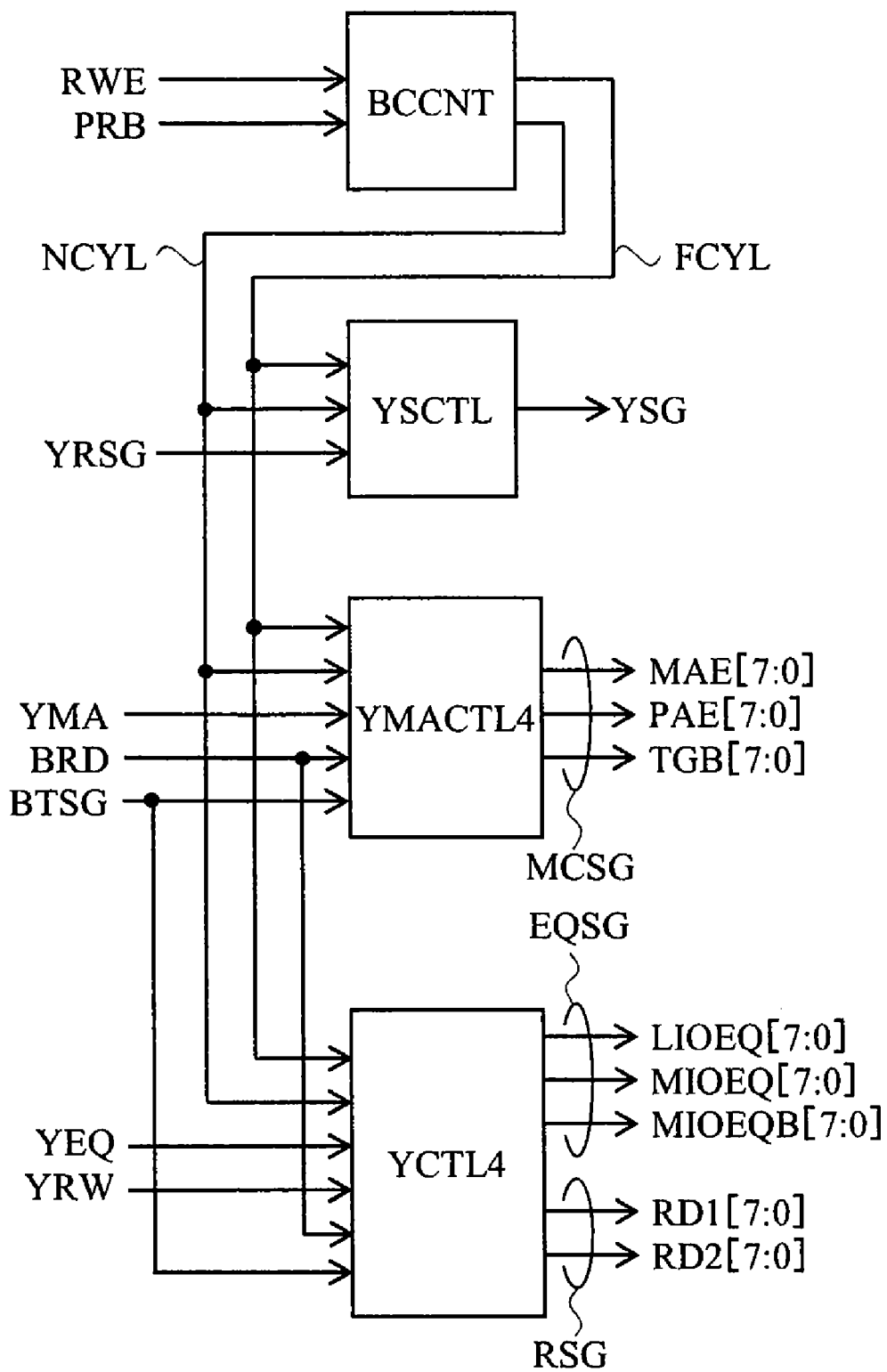
FIG. 34 is a diagram showing another example of a main section block configuration of the timing controller shown in FIG. 1.

FIG. 34 shows another example of the main section block configuration of the timing controller TMCTL shown in FIG. 1. A feature of the configuration lies in that the main amplifier controller YMACTL1 shown in FIG. 24 is replaced with a main amplifier controller YMACTL4 and the column read signal controller YCTL3 is replaced with a column read signal controller YCTL4, respectively. Another feature of the configuration lies in that the controllers have a function of newly receiving the multiple burst operation command signals BTSG shown in FIG. 1 to generate a plurality of the read enable signals RD1[7:0], RD2[7:0], the main input/output line equalize signal MIOEQ[7:0], the preamplifier enable signal PAE[7:0], the transmission gate enable signal TGB[7:0], and the main amplifier enable signal MAE[7:0]. Note that, though not shown to simplify description in FIG. 34, the receiver amplifier enable signal RAE[7:0] is also generated when the multiple burst operation command signals BTSG are received. According to the above-described configuration, it is made possible to produce command signals for the data path corresponding to the order of data output, namely, the burst sequence, so that a data path circuit operation satisfying a time distribution shown in FIG. 32 can be realized. Thus, a high speed DDR SDRAM where an operation margin of a row circuit has been expanded and power consumption of a data path has been reduced in burst the first cycle of read operation just after page open can be realized.

In the foregoing, the invention made by the inventors of the present invention has been concretely described based on the embodiments. However, it is needless to say that the present invention is not limited to the foregoing embodiments and various modifications and alterations can be made within the scope of the present invention. For example, the number of prefetch is not limited to 8 bits, and it may exceed 8 bits (for example, 16 bits or 32 bits). On the other hand, the method for reading data is not limited to the method for outputting data one bit by one bit in a time-series manner in synchronism with the complement clocks CLK, CLKB, and it may be other methods. For example, a DRAM of a multiple-value interface system therein a plurality of output voltages for a data pin may be set and therefrom a plurality of bits are outputted simultaneously may be adopted. In these cases, a DRAM with a higher data transfer rate can be realized.

The memory cell to be applied with the present invention is not limited to the DRAM cell and the present invention can be applied to such a memory cell as a SRAM or a phase-change memory, a ferroelectric RAM (a ferroelectric random access memory), an MRAM (a magnet-resistive random access memory), or a flash memory. For example, it is important that other memory cells, except for the SRAM cell generates complementary read signals, output a signal voltage of several hundreds mV to a bit line for preventing erroneous read. According to the present invention, since speed-up of a data path, low power consumption, and expansion of operation margin in a row circuit can be made possible, a memory with high reliability can be realized.

Further, the present invention can be applied to not only a monolithic memory chip but also an interface of an on-chip memory. Since the interface of an on-chip memory generally has a wide bus width, speed-up and low power consumption in a column circuit as well as expansion of an operation margin of a row circuit can be expected. Note that, it is easily estimated that the timing controller used in the present invention is not limited to ones described in the first to sixth embodiments. A column circuit intended in the present invention can be realized by performing setting of a timing and a pulse width appropriately according to a chip architecture or a product specification.

Still further, though the semiconductor device of the present invention is a technique particularly useful when applied to a DDR SDRAM with high speed and large capacity, it is not limited to the DDR SDRAM and it can be widely applied to various large capacity memory arrays as a technique for expanding operation margin to realize high reliability.

What is claimed is:

1. A semiconductor device that comprises a memory array including memory cells and sense amplifiers amplifying stored data in the memory cells, input/output lines having a hierarchical structure, a sub-amplifier, a main amplifier, and a timing controller, wherein the sub-amplifier includes a variable current source that can generate a first current or a second current so that driving ability of the sub-amplifier is controlled and amplifies a voltage signal read from the memory array to a lower input/output line of the input/output lines;

the variable current source generates the first current according to a first read enable signal and generates the second current according to a second read enable signal;

the voltage signal of the lower input/output line amplified by the sub-amplifier is read in an upper input/output line of the input/output lines;

the main amplifier amplifies a voltage signal read in the upper input/output line; and the timing controller generates the first and second read enable signals.

2. The semiconductor device according to claim 1, wherein the timing controller has a burst cycle counter that detects the number of cycles in burst read operation, and generates the first read enable signal in the first cycle of burst read cycle just after activation of the memory array; and the timing controller generates the second read enable signal in the second cycle of burst read cycle and cycles subsequent thereto where read is performed from a state that the stored data has been amplified in the sense amplifier according to the burst read cycle of the first cycle.

3. The semiconductor device according to claim 2, wherein
the variable current source has a first transistor generating the first current and a second transistor generating the second current, and
a size of the first transistor is larger than a size of the second transistor.

4. The semiconductor device according to claim 2, wherein
the variable current source has a third transistor where different bias voltages are set according to the first and second read enable signals, and
the bias voltage according to the first read enable signal is larger than the bias voltage according to the second read enable signal.

5. A semiconductor device that comprises a memory array including memory cells and sense amplifiers amplifying stored data in the memory cells, input/output lines having a hierarchical structure, a sub-amplifier, a main amplifier, and a timing controller, wherein
the sub-amplifier includes a variable current source that can generate a first current or a second current so that driving ability of the sub-amplifier is controlled and amplifies a voltage signal read from the memory array to a lower input/output line of the input/output lines;
the variable current source generates the first current according to a first read enable signal and generates the second current according to a second read enable signal;
the voltage signal of the lower input/output line amplified by the sub-amplifier is read in an upper input/output line of the input/output lines;
the main amplifier includes a first amplifier and a preamplifier, and the main amplifier amplifies a voltage signal read in the upper input/output line in the first amplifier or amplifies the voltage signal read in the upper input/output line in the first amplifier via the preamplifier when the preamplifier has been activated; and
the timing controller generates the first and second read enable signals and a preamplifier enable signal for activating the preamplifier.

6. The semiconductor device according to claim 5, wherein
the timing controller has a burst cycle counter that detects the number of cycles in burst read operation, and generates the first read enable signal in the first cycle of burst read cycle just after activation of the memory array; and
the timing controller generates the second read enable signal in the second cycle of burst read cycle and cycles subsequent thereto where read is performed from a state that the stored data has been amplified in the sense amplifier according to the first cycle of burst read cycle.

7. The semiconductor device according to claim 6, wherein
the first current is larger than the second current.

8. The semiconductor device according to claim 7, wherein
the timing controller activates the preamplifier enable signal in the first cycle of the burst read cycle, and the timing controller inactivates the preamplifier enable signal in the burst read cycle of the second cycle and cycles subsequent thereto.

9. A semiconductor device that comprises a memory array including a plurality of memory cells and a plurality of sense amplifiers amplifying stored data contained in the plurality of memory cells, a plurality of input/output lines having hierarchical structure, a plurality of sub-amplifiers, a plurality of main amplifiers, and a timing controller, wherein
the plurality of sub-amplifiers include variable current sources that can generate first currents or second currents, respectively, so that driving abilities of the sub-amplifiers are controlled individually and amplify voltage signals read from the memory array to a plurality of lower input/output lines of the plurality of input/output lines according to individual driving abilities;
each of the plurality of variable current sources generates the first currents according to a first read enable signal and generates the second currents according to a second enable signal;
voltage signals of the plurality of lower input/output lines amplified by the plurality of sub-amplifiers are read in a plurality of upper input/output lines of the plurality of input/output lines, respectively;
the plurality of main amplifiers amplify voltage signals read in the plurality of upper input/output lines respectively; and
the timing controller generates the first and second read enable signals.

10. The semiconductor device according to claim 9, wherein
the first current is larger than the second current; and
the timing controller has a burst cycle counter that detects the number of cycles in burst read operation, and the timing controller generates the first read enable signal in some of the plurality of variable current sources and generates the second read enable signal in other of the plurality of variable current sources in the first cycle of burst read cycle just after activation of the memory array, and
the timing controller generates the second read enable signal to all the plurality of variable current sources in the second cycle of burst read cycle and cycles subsequent thereto where read is performed from a state that the stored data has been amplified in the plurality of sense amplifiers according to the first cycle of burst read cycle.

11. The semiconductor device according to claim 10, wherein
the timing controller generates a first main amplifier enable signal that activates the plurality of main amplifiers at a first timing, respectively and generates a second main amplifier enable signal that activates the plurality of main amplifiers at a second timing later than the first timing, respectively; and
in the first cycle of burst read cycle,
voltage signals amplified by sub-amplifiers corresponding to some of the plurality of variable current sources are amplified in some of the plurality of main amplifiers according to the first main amplifier enable signal; and
voltage signals amplified by sub-amplifiers corresponding to other of the plurality of variable current sources are amplified in other of the plurality of main amplifiers according to the second main amplifier enable signal.

* * * * *

UNITED STATES PATENT AND TRADEMARK OFFICE
CERTIFICATE OF CORRECTION

PATENT NO. : 7,304,910 B1 Page 1 of 1
APPLICATION NO. : 11/467793
DATED : December 4, 2007
INVENTOR(S) : Satoru Hanzawa et al.

It is certified that error appears in the above-identified patent and that said Letters Patent is hereby corrected as shown below:

On the Title Page:

After Item (22), insert the following:

Item (65)  Prior Publication Data

US 2007/0147160 A1    June 28, 2007

Signed and Sealed this

Tenth Day of June, 2008

JON W. DUDAS
*Director of the United States Patent and Trademark Office*